(12) United States Patent
Asahi et al.

(10) Patent No.: US 8,465,666 B2
(45) Date of Patent: Jun. 18, 2013

(54) THERMOCONDUCTIVE COMPOSITION, HEAT DISSIPATING PLATE, HEAT DISSIPATING SUBSTRATE AND CIRCUIT MODULE USING THERMOCONDUCTIVE COMPOSITION, AND PROCESS FOR PRODUCTION OF THERMOCONDUCTIVE COMPOSITION

(75) Inventors: Toshiyuki Asahi, Osaka (JP); Yukihiro Shimasaki, Hyogo (JP); Koji Shimoyama, Mie (JP)

(73) Assignee: Panasonic Corporation, Osaka (JP)

( * ) Notice: Subject to any disclaimer, the term of this patent is extended or adjusted under 35 U.S.C. 154(b) by 188 days.

(21) Appl. No.: 13/146,666

(22) PCT Filed: Feb. 23, 2010

(86) PCT No.: PCT/JP2010/001171
§ 371 (c)(1),
(2), (4) Date: Jul. 28, 2011

(87) PCT Pub. No.: WO2010/098066
PCT Pub. Date: Sep. 2, 2010

(65) Prior Publication Data
US 2012/0025132 A1    Feb. 2, 2012

(30) Foreign Application Priority Data

Feb. 25, 2009 (JP) ................. 2009-041964
Dec. 17, 2009 (JP) ................. 2009-286123
Jan. 19, 2010 (JP) ................. 2010-008760

(51) Int. Cl.
*C09K 5/08* (2006.01)
*C08K 3/10* (2006.01)
*C08K 3/14* (2006.01)
*C08L 63/00* (2006.01)
*H01L 23/36* (2006.01)
*H01L 23/373* (2006.01)

(52) U.S. Cl.
USPC ............ 252/76; 428/413; 428/418; 428/323; 428/327; 428/209; 523/457; 523/459; 427/96.1; 427/97.1; 174/252; 438/55; 438/122

(58) Field of Classification Search
USPC .............. 252/71, 73, 74, 76; 523/400, 440, 523/444–445, 457–460; 528/87–93; 438/55, 438/122; 427/96.1, 97.1
See application file for complete search history.

(56) References Cited

U.S. PATENT DOCUMENTS

| | | | |
|---|---|---|---|
| 5,547,758 | A | 8/1996 | Watanabe et al. |
| 5,576,362 | A | 11/1996 | Watanabe et al. |

(Continued)

FOREIGN PATENT DOCUMENTS

| JP | 05-063114 A | 3/1993 |
|---|---|---|
| JP | 06-188530 | 7/1994 |
| JP | 11-323162 A | 11/1999 |
| JP | 3255315 | 11/2001 |

(Continued)

OTHER PUBLICATIONS

International Search Report for Application No. PCT/JP2010/001171, May 25, 2010, Panasonic Corporation.

*Primary Examiner* — David Buttner
*Assistant Examiner* — Ha Nguyen
(74) *Attorney, Agent, or Firm* — RatnerPrestia

(57) ABSTRACT

A thermally conductive composition is made to contain a cured thermosetting resin containing a crystalline epoxy resin component, and an inorganic filler. The content by percentage of the inorganic filler in the thermally conductive composition is 66% or more and 90% or less by volume. This thermally conductive composition has a main portion made mainly of the inorganic filler, and a surface layer portion made mainly of the crystalline epoxy component and formed on the main portion to be continuous to the main portion.

26 Claims, 32 Drawing Sheets

U.S. PATENT DOCUMENTS

| | | |
|---|---|---|
| 6,261,481 B1 | 7/2001 | Akatsuka et al. |
| 2004/0147709 A1 | 7/2004 | Akatsuka et al. |
| 2006/0276568 A1 | 12/2006 | Akatsuka et al. |
| 2007/0148421 A1* | 6/2007 | Sohn et al. .................... 428/209 |
| 2008/0128922 A1 | 6/2008 | Kotani et al. |
| 2009/0110909 A1* | 4/2009 | Innocenzo et al. ............ 428/323 |

FOREIGN PATENT DOCUMENTS

| | | |
|---|---|---|
| JP | 2004-256687 A | 9/2004 |
| JP | 2004-256687 A | 9/2004 |
| JP | 2010-018679 A | 1/2010 |
| WO | WO 02/094905 A1 | 11/2002 |

\* cited by examiner

20 μm

20 μm

20µm  9  1009  1040

20µm  9  1009  1040

10µm

10µm

THERMOCONDUCTIVE COMPOSITION, HEAT DISSIPATING PLATE, HEAT DISSIPATING SUBSTRATE AND CIRCUIT MODULE USING THERMOCONDUCTIVE COMPOSITION, AND PROCESS FOR PRODUCTION OF THERMOCONDUCTIVE COMPOSITION

This application is a U.S. National Phase Application of PCT International Application PCT/JP2010/001171.

TECHNICAL FIELD

The present invention relates to a thermally conductive composition which is used in various components for which heat dissipation (heat radiation) is required, a heat dissipating plate, a heat dissipating substrate, and a circuit module each using this composition, and a process for producing the thermally conductive composition.

BACKGROUND ART

In order to make the size of electronic instruments small, the heat generation density of power semiconductors, high-functional semiconductors, light emitting elements, and others has been increasing. For the heat dissipation of such electronic components, thermally conductive compositions are used. However, conventional thermally conductive compositions each produced by adding an inorganic filler to a resin have the following problems: when the content by percentage of the inorganic filler in the thermally conductive composition is high, the thermal conductivity is increased; however, the surface roughness of the thermally conductive composition becomes large and the formability thereof becomes low; and furthermore, the gloss of any surface of the thermally conductive composition lowers, and voids or the like increase in the surface or inside the composition.

The problems are more easily caused as the content by percentage of the inorganic filler is made larger. This is because the content by percentage of the resin component in the thermally conductive composition falls, and the inorganic filler is not easily wetted with the resin so as to be fixed.

As described above, as the content by percentage of the inorganic filler is made higher, flaws, cracks, voids and others are more easily generated in the surface as well as the formability deteriorates. Moreover, the inorganic filler itself gets low in cohesive force, or the inorganic filler exposed to the surface drop out easily. For this reason, even the fixation of electronic components and others onto the surface of the thermally conductive composition becomes difficult. If the volume fraction of the inorganic filler is, for example, over 66% by volume, it is very difficult to subject the thermally conductive composition to shaping or some other treatment. If the volume fraction of the inorganic filler is 66% or more by volume or further exceeds 70% by volume, the surface roughness Rmax is over 7500 Å. As the surface roughness Rmax is increased by an increase in the volume fraction of the inorganic filler, the glossiness abruptly drops down.

As described above, as the content by percentage of the inorganic filler becomes larger, the thermal conductivity itself gets larger. However, the surface roughness of the surfaces of the grains, which are actually shaped grains, abruptly becomes large so that the glossiness decreases abruptly. The matter that the surface roughness increases and the glossiness decreases means that the formability of the thermally conductive composition lowers, or innumerable voids are generated inside the thermally conductive composition or in the surfaces thereof.

Next, with reference to FIG. 34, a detailed description is further made. FIG. 34 is a schematic sectional view of a conventional thermally conductive composition when the content by percentage of an inorganic filler therein is a high value (of 66% or more by volume, or is a higher value of 70% or more by volume).

When the content by percentage of the inorganic filler is 66% or more by volume, innumerable voids 9 are generated in the front of free surface 8 or at the inside of thermally conductive composition 7, as illustrated in FIG. 34. Voids 9 cause an abrupt increase in the surface roughness of free surface 8 so that the glossiness declines. Free surface 8 means a natural surface which does not contact any other solid and further does not undergo polishing, cutting, or any other operation.

When the surface roughness of free surface 8 increases in this way and further voids 9 are generated at the inside or in the front thereof, the thermal conductivity of thermally conductive composition 7 is not increased very much even when the content by percentage of the inorganic filler is high. Moreover, the adhesiveness thereof onto a heat generator declines so that the thermal conductivity may lower. Furthermore, the formability of thermally conductive composition 7 deteriorates. Alternatively, thermally conductive composition 7 itself gets brittle to be easily cracked.

Against such problems, it is suggested to use, for example, a resin excellent in surface property and high in glossiness, such as a polyimide film, for thermally conductive composition 7, thereby improving the adhesiveness thereof to heighten a heat dissipating effect. As an application example thereof, a metallic core substrate is suggested. Next, with reference to FIG. 35, a conventional metallic core substrate is described. FIG. 35 is a sectional view of the conventional metallic core substrate.

Electrically insulating layer 11 is formed on metallic plate 10. Copper foil pieces 12 are laminated on electrically insulating layer 11. Solder pieces 13 are used to mount electronic component 14, semiconductor 15, terminal 16, and others thereon. As the thermal conductivity of electrically insulating layer 11 is higher, heat from electronic component 14 and semiconductor 15 can be conducted to metallic plate 10 so that a rise in the temperature thereof can be restrained. Electrically insulating layer 11 may be a matter in which an inorganic filler is added to a resin sheet in a film form (for example, Patent document 1).

As a method for increasing the thermal conductivity, a manner of using a material with high thermal conductivity as a filler in electrically insulating layer 11, or increasing the filling amount of the filler is often used. It is also effective to increase the thermal conductivity of a resin. With reference to FIGS. 36A to 36C, such a structure is described. As a means for increasing the thermal conductivity of the resin, for example, the use of a crystalline resin is suggested (for example, Patent document 2).

FIGS. 36A to 36C are explanatory views of a conventional crystalline resin. The use of the crystalline resin aims to polymerize molecules of monomer 18 having mesogen group 17 with each other to give electric non-conductance and excellent thermal conductivity. In order to use a crystalline resin to obtain a high heat dissipating performance (or a high thermal conductivity), it is necessary to increase the crystallization rate of the crystalline resin. As the crystallization rate of the crystalline resin is made higher, a substrate obtained therefrom is harder and more brittle. In other words, the substrate is not bent but broken, or is easily chipped or cracked. Thus, even when a crystalline resin is used to produce a heat dissipating substrate on which electronic components are to be mounted, the usage thereof is largely limited.

Even when an epoxy resin having mesogen groups is used, it is difficult to solve the problem described with reference to FIG. 34. As the epoxy resin is further crystallized, the problem described with reference to FIG. 34 may be more easily caused. Furthermore, such problems are easily caused from regions in which the content by percentage of an inorganic filler is lower than 66% by volume.

As a method for improving the strength, it is suggested that a method of blending a curing agent which can easily have a network structure, or some other method. However, in the case of a crystalline epoxy resin, the crystallinity thereof is inhibited when three-dimensional bonds are formed. As a result, a high thermal conductivity is not obtained in many cases.

Furthermore, a substrate in which a crystalline resin is used has a tendency that the substrate is hard and brittle, is not bent but broken, and is easily chipped or cracked. Thus, when a heat dissipating substrate is produced by use of a crystalline resin, there may remain a problem for impact resistance in a drop test or other tests.

PRIOR ART DOCUMENT

Patent Document

Patent document 1: Japanese Patent No. 3,255,315
Patent document 2: Unexamined Japanese Patent Publication No. H11-323162

DISCLOSURE OF INVENTION

The present invention is a thermally conductive composition having a heightened thermal conduction efficiency. The thermally conductive composition of the invention is formed to contain a cured thermosetting resin containing a crystalline epoxy resin component, and an inorganic filler. The content by percentage of the inorganic filler in the thermally conductive composition is 66% or more by volume and 90% or less by volume. This thermally conductive composition has a main portion in which the inorganic filler is mainly contained, and a surface layer portion which is made mainly of the crystalline epoxy resin component and is formed on the main portion to be continuous to the main portion.

The invention is also a heat dissipating plate wherein the above-mentioned thermally conductive composition is fixed to a metallic plate. Moreover, the invention is a circuit module wherein this heat dissipating plate is used to fix a heat generating component to the thermally conductive composition, and further a circuit substrate is fixed to the metallic plate and connected to the heat generating component. Furthermore, the invention is a heat dissipating substrate wherein the thermally conductive composition is fixed to a metallic plate, and a wiring is fixed to the thermally conductive composition. Additionally, the invention is a circuit module wherein this heat dissipating substrate is used to fix a heat generating component to the thermally conductive composition and further connect the heat generating component to a wiring, and additionally a circuit substrate is fixed to the wiring. In any one of these articles, the thermally conductive composition of the invention is used, thereby making it possible to considerably improve the heat dissipating performance or convenience. Moreover, the wettability between the thermally conductive composition and any one of the metallic plates can be made high so that the adhesiveness between the composition and the metallic plate can be improved.

Furthermore, the invention is a process for producing the thermally conductive composition. This producing process has the following steps (A) and (B): a step (A) of preparing a mixture of a main agent containing a crystalline epoxy resin component which is not yet cured, a curing agent, and an inorganic filler, and a step (B) of heating the mixture to not lower than the crystallization temperature of the crystalline epoxy resin component, thereby curing the main agent and the curing agent to form a cured thermosetting resin. In the process, the content by percentage of the inorganic filler is 66% or more by volume and 90% or less by volume. In this way, in the step (B), a main portion in which the inorganic filler is mainly contained can be formed, and further on the main portion can be formed a surface layer portion made mainly of the crystalline epoxy resin component and formed to be continuous to the main portion.

BRIEF DESCRIPTION OF DRAWINGS

FIG. 25A is a view showing a microscopic image for describing a state of the thermally conductive composition illustrated in FIG. 23A, the state being a state generated after a free surface of this composition is partially scratched off with a paddle or the like.

PREFERRED EMBODIMENTS FOR CARRYING OUT OF THE INVENTION

Figure 1:
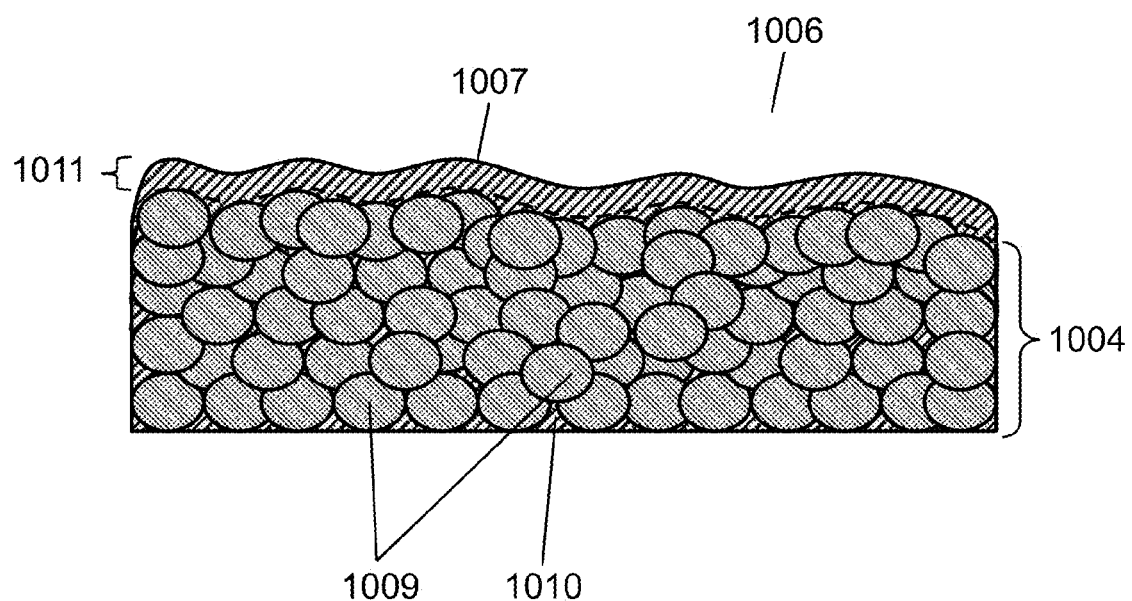
FIG. 1 is a sectional view of a thermally conductive composition according to an embodiment of the invention.

Hereinafter, referring to the drawings, embodiments of the invention will be described. In each of the embodiments, the same reference number is attached to any member or portion that has the same structure as in any precedent one of the embodiments, and detailed description thereof may be omitted. The invention is not limited to the embodiments described below.

Embodiment 1

FIG. 1 is a sectional view of a thermally conductive composition in embodiment 1 of the invention.

Thermally conductive composition 1006 contains thermosetting resin 1010 containing a crystalline epoxy resin, and inorganic filler 1009. Inorganic filler 1009 is contained mainly in main portion 1004. On main portion 1004 is formed surface layer portion 1011 made only of thermosetting resin 1010, or made mainly of thermosetting resin 1010. In FIG. 1, a broken line is shown to distinguish main portion 1004 and surface layer portion 1011 from each other for the sake of convenience. However, a clear interface does not exist between the two, so that main portion 1004 and surface layer portion 1011 are formed to be continuous to each other. In this manner, thermally conductive composition 1006 also contains surface layer portion 1011 formed into a surface layer. In other words, surface layer portion 1011, inorganic filler 1009 and thermosetting resin 1010 each constitute a partial region of thermally conductive composition 1006.

Surface layer portion 1011 is a layer-form portion of a resin made mainly of thermosetting resin 1010, the portion being formed in the vicinity of the front of free surface 1007 and having a thickness of 20 μm or less, desirably 10 μm or less, more desirably 5 μm or less. In the embodiment, surface layer portion 1011 is positively positioned in the vicinity of the front of free surface 1007 of thermally conductive composition 1006. If the thickness of surface layer portion 1011 is more than 20 μm, the layer may inhibit thermal conduction to a heat generating component fixed on this portion.

The content by percentage (volume fraction) of inorganic filler 1009 in thermally conductive composition 1006 is 66% or more by volume and 90% or less by volume. The "% by volume" means percentage by volume. If the content by percentage is less than 66% by volume, the thermally conductive composition may be low in thermal conductivity although the composition is excellent in formability and the like. The content by percentage of the inorganic filler in thermally conductive composition 1006 is desirably 85% or more by volume. If the content by percentage of inorganic filler 1009 in thermally conductive composition 1006 is less than 85% by volume, the thermally conductive composition may not obtain a predetermined thermal conductivity.

It is practical that thermally conductive composition 1006 is rendered a thermally conductive resin cured product, or the composition is defined as the product. This is because thermally conductive composition 1006 is formed by curing inorganic filler 1009 with thermosetting resin 1010 as illustrated in FIG. 1. Accordingly, the content by percentage of inorganic filler 1009 is defined in thermally conductive composition 1006, which has been cured. The content by percentage is defined in the whole of a combination of surface layer portion 1011 and main portion 1004.

However, the content by percentage of inorganic filler 1009 is desirably specified in main portion 1004, which is a portion below the dot line in FIG. 1. This is because surface layer portion 1011 may be removed by polishing or the like.

When 98% or more of surfaces of inorganic filler 1009 are covered with thermosetting resin 1010, the thermal conductivity of thermally conductive composition 1006 can be set to 1 W/mK or more. If only less than 98% of the surfaces of inorganic filler 1009 are covered with thermosetting resin 1010, the thermally conductive composition may be low in thermal conductivity, or may not obtain a predetermined strength.

As described above, it is preferred that 98% or more of the surfaces of inorganic filler 1009 are covered with thermosetting resin 1010 and further surface layer portion 1011 made mainly of thermosetting resin 1010 is present as a surface layer of main portion 1004. In this way, an electric current is prevented from flowing along the interface between inorganic filler 1009 and thermosetting resin 1010 so that the composition does not easily become low in breakdown voltage property.

It is also preferred that thermosetting resin 1010 with which the surfaces of inorganic filler 1009 are covered is partially positioned, as surface layer portion 1011, in any surface of thermally conductive composition 1006. This manner makes it possible to increase the bending strength of thermally conductive composition 1006, and restrains cracks from being easily generated even when thermally conductive composition 1006 is bent.

When surface layer portion 1011 is heated on, for example, a metallic plate (not illustrated) so that thermosetting resin 1010 for fixing inorganic filler 1009 is thermally cured, thermosetting resin 1010 partially exudes through gaps between pieces (or particles) of inorganic filler 1009 to the surface and then hardens so that surface layer portion 1011 is formed. According to this structure, thermosetting resin 1010 has excellent thermal conductivity and reliability. Surface layer portion 1011 becomes a sort of inorganic filler depletion layer. The inorganic filler depletion means that inorganic filler 1009 is hardly contained in surface layer portion 1011 formed in the surface.

It is desired that thermosetting resin 1010 filled into the gaps between the pieces of inorganic filler 1009 is partially floated up to the surface by convection thereof or the like so that surface layer portion 1011 is formed. This manner makes it possible to make the resin composition of thermosetting resin 1010 filled into the gaps between the pieces of inorganic filler 1009 equal to that of the resin constituting surface layer portion 1011. For this reason, in the portion represented by the dot line in FIG. 1, the generation of cracks or the like can be restrained.

It is particularly desired that when thermally conductive composition 1006 is heated and cured, thermosetting resin 1010 exudes to the surface in such a manner that the resin is caused to flow by convection in the gaps between the pieces of inorganic filler 1009, which are filled in the form of a high-density stone fence, and then the resin is cured. In this way, the viscosity of thermosetting resin 1010 lowers at the time of the thermosetting thereof so that the resin flows into the narrow gaps between the pieces of inorganic filler 1009 in the convectional form, whereby bubbles or the like that remain in the gaps between the pieces of inorganic filler 1009 are exuded to the surface to be discharged.

It is allowable that after a mixture of inorganic filler 1009 and thermosetting resin 1010 is cured to form an underlying layer corresponding to main portion 1004, thermosetting resin 1010 prepared as another thermosetting resin is thinly applied and then cured to form a resin layer corresponding to surface layer portion 1011. However, even when a structure alike to thermally conductive composition 1006 is formed in this way, an excellent heat dissipating effect is not exhibited. Moreover, at the interface between the underlying layer and the resin layer, a peel or the like may be caused.

It is also allowable that without curing the underlying layer completely, the layer is made into a semi-cured state, thermosetting resin 1010 is thinly applied thereon, and then the resin is cured together with the underlying layer to form a resin layer corresponding to surface layer portion 1011. In this case, the underlying layer is formed into the semi-cured state, for example, a prepreg in which glass fiber is impregnated with an epoxy resin. Even when a structure alike to thermally conductive composition 1006 is formed in this way, an excellent heat dissipating effect is not exhibited. Moreover, at the interface between the underlying layer and the resin layer, a peel or the like may be caused. This is because at the time of heating and curing thermosetting resin 1010 applied on the surface layer together with the semi-cured state underlying layer, inorganic filler 1009 contained in the underlying layer floats up to the surface. Such an interface causes a fall in the thermal conductivity.

When the structure alike to thermally conductive composition 1006 is formed as described above, the number of steps therefor increases so that costs and managing items increase and further the thermal conductivity may lower.

As described above, it is desired that the epoxy resin contained in thermosetting resin 1010 and the epoxy resin contained in surface layer portion 1011 have substantially the same resin composition or a substantially single resin composition (i.e., a substantially single epoxy resin composition). When the epoxy resin contained in thermosetting resin 1010 has substantially the same resin composition, the following is restrained: a stress is concentrated into the portion represented by the dot line in FIG. 1 so that cracks or others are generated therein.

Whether or not surface layer portion 1011 is a portion obtained by the matter that the thermosetting resin exudes through the gaps between the pieces of inorganic filler 1009 at the thermosetting time is easily judged when a cross section thereof is analyzed by means of an analyzer such as a scanning microscope (SEM) or an FTIR using a microscope. When surface layer portion 1011 is formed by the matter that the resin exudes through the gaps between the pieces of inorganic filler 1009 as described above, thermosetting resin 1010 filling into the gaps between the pieces of inorganic filler 1009 and thermosetting resin 1010 constituting surface layer portion 1011 are made of substantially the same material. Between these resins, a connecting surface or interface is not present, or is not found out even when the cross section is analyzed. The state that no connecting surface or interface can be detected by an ordinary analyzing method as described above will be represented as an exuding state hereinafter.

The content by percentage of inorganic filler 1009 in surface layer portion 1011 is desirably 40% or less by volume, more desirably 30% or less by volume, more desirably 20% or less by volume. In this way, the content by percentage of inorganic filler 1009 in surface layer portion 1011 is made low so that thermosetting resin 1010 is a main material of the portion. Furthermore, a gradient of the concentration distribution of inorganic filler 1009 is positively formed in thermally conductive composition 1006 along the thickness direction thereof. For example, on the surface layer side (of the composition), the content by percentage of inorganic filler 1009 is made small, and on the inner layer side, that of inorganic filler 1009 is made as high as 66% or more by volume. In this way, both of the following can be enhanced: a performance for fixing a heat generating component with a thermally conductive adhesive agent or the like onto surface layer portion 1011; and the thermal conductivity of thermally conductive composition 1006.

Moreover, thermally conductive composition 1006, or a heat dissipating plate or heat dissipating substrate formed by use of thermally conductive composition 1006 is each high in reliability, and can cope with a pressure cooker test. Additionally, even when an effect based on the pressure cooker is produced on the side of a metallic plate which forms the heat dissipating plate or heat dissipating substrate, an effect based on the pressure cooler is not easily produced on the side of thermally conductive composition 1006. This is because the surface of thermally conductive composition 1006 is protected by surface layer portion 1011. The pressure cooker test is a method for testing the humidity resistance of an electronic component or the like that is sealed with a resin, and is standardized according to IEC 68-2-66 and the like. IEC denotes the International Electrotechnical Commission.

Figure 2:
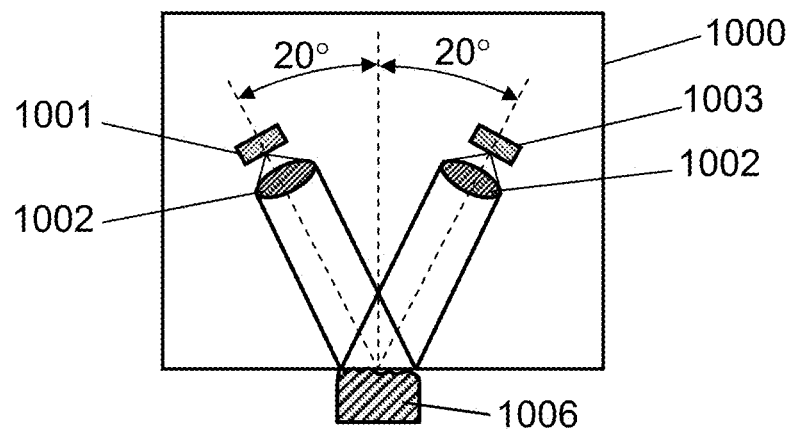
FIG. 2 is a view for describing a method for evaluating the gloss of the thermally conductive composition illustrated in FIG. 1.

It is practical to render free surface 1007 of surface layer portion 1011 a glossy surface or smooth surface. Hereinafter, with reference to FIG. 2, the gloss of thermally conductive composition 1006 will be described. FIG. 2 is a view for describing a method for evaluating the gloss of thermally conductive composition 1006.

Inside glossiness meter 1000, light source 1001 is set up. Glossiness meter 1000 may be called a gloss meter. A light ray emitted from light source 1001 is radiated through lens 1002 to free surface 1007 of thermally conductive composition 1006, which is an object to be measured. This light ray is reflected on the surface of the object to be measured, and then incident through lens 1002 into light-receiving section 1003.

The glossiness may be, for example, specular gloss according to JIS K 5600-4-7. The specular gloss is the ratio between the luminous flux reflected on an object in the mirror plane direction, and the luminous flux reflected on a glass piece having a refractive index of 1.567 in the mirror plane direction under conditions that respective angles of light source 1001 and light-receiving section 1003 are specified, and the ratio is represented under a condition that the light flux reflected on the glass piece is regarded as 100. As illustrated in FIG. 2, for example, each of the angle made between the direction perpendicular to a surface to be measured and the direction of incident light rays from light source 1001, and the angle made between the direction perpendicular to the surface to be measured and the direction of the light rays toward light-receiving section 1003 may be 20°. Hereinafter, the specular glossiness according to JIS K 5600-4-7 that is measured under a condition that the angles are each set to 20° will be called the 20-degree glossiness.

The measurement of the glossiness may easily be affected by situations of free surface 1007, such as the form of the surface, and the presence or absence of a pattern. Thus, the number of measuring points (what is called the number "n") is increased, and then the measured value at a point where the highest glossiness is obtained, out of the points, is adopted. This is because the position where the glossiness is the highest corresponds to (a position of) free surface 1007 which is most weakly affected by others.

When the 20-degree glossiness (of an object) is not easily measured, the 60-degree glossiness thereof may be adopted.

Surface layer portion 1011 preferably has a 20-degree glossiness of 70 or more, more preferably 80 or more. If the glossiness is less than 70, free surface 1007 may be a rough surface. In this case, the adhesiveness between the surface and a heat generating component fixed onto thermally conductive composition 1006 declines so that the efficiency of heat dissipation may fall. Also when an evaluation is made in accordance with the 60-degree glossiness, the glossiness is desirably 70 or more, more desirably 80 or more.

Figure 3:
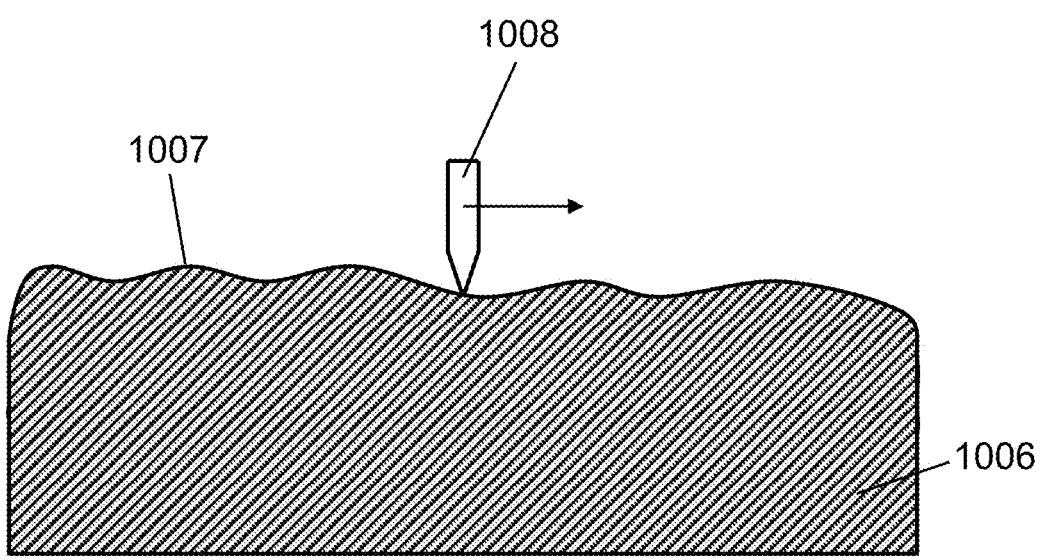
FIG. 3 is a schematic view for describing a method for evaluating the surface roughness of the thermally conductive composition in FIG. 1.

With reference to FIG. 3, the following will describe the surface roughness of thermally conductive composition 1006. FIG. 3 is a schematic view for describing a method for evaluating the surface roughness of thermally conductive composition 1006.

The surface roughness is measured while surface roughness meter 1008 is scanned on free surface 1007 of thermally conductive composition 1006 as represented by an arrow. Surface roughness meter 1008 is desirably of a stylus type, but may be of a non-stylus type. For example, a laser type surface roughness meter may be used. When such an optical type surface roughness meter is used, it is desired to investigate whether obtained results are correct or not.

The measurement of the surface roughness may easily be affected by situations of free surface 1007, such as the form of the surface, and the presence or absence of a pattern. Thus, the number of measuring points (what is called the number "n") is increased, and then the measured value of the surface roughness at a point where the smallest surface roughness is obtained, out of the points, is adopted. This is because the point where the surface roughness is the smallest corresponds to (a point of) free surface 1007 which is most weakly affected by others.

The surface roughness Ra of free surface 1007 of thermally conductive composition 1006 is preferably 3000 Å or less, more desirably 2000 Å or less. Alternatively, the Rmax thereof is preferably 15000 Å or less, more desirably 13000 Å or less. The surface roughness Ra is called the arithmetic average roughness and is defined according to JIS-B0601-1994 after a revision of the JIS. The Rmax is called the "largest height" according to JIS-N-0601-1982 before the revision and corresponds to the Ry (the largest height) according to JIS-B-0601-1994 after the revision.

If the surface roughness Ra of free surface 1007 is 3000 Å or more, or the Rmax or Ry is 15000 Å or more, the adhesiveness between the surface and a heat generating component fixed onto thermally conductive composition 1006 declines so that the efficiency of heat dissipation may fall.

As described above, surface layer portion 1011 is located in the surface of thermally conductive composition 1006. By increasing the glossiness of the surface of thermally conductive composition 1006 or the smoothness of the surface of thermally conductive composition 1006, a drop or peel of inorganic filler 1009 contained in thermally conductive composition 1006 can be prevented. Moreover, the adhesiveness between thermally conductive composition 1006 and a metallic plate or wiring pattern fixed to thermally conductive composition 1006 can be increased.

As described above, free surface 1007 of thermally conductive composition 1006 is smooth, and voids hardly remain inside the composition. In other words, inorganic filler 1009, which constitutes thermally conductive composition 1006, is sufficiently covered with thermosetting resin 1010. As a result, in the direction of the thickness, bubbles hardly remain in portions where the particles of inorganic filler 1009 contact with each other, at the interface between inorganic filler 1009 and thermosetting resin 1010, between the particles of inorganic filler 1009, or inside thermosetting resin 1010. As a result, a leakage current is generated in only a small quantity.

Figure 4A:
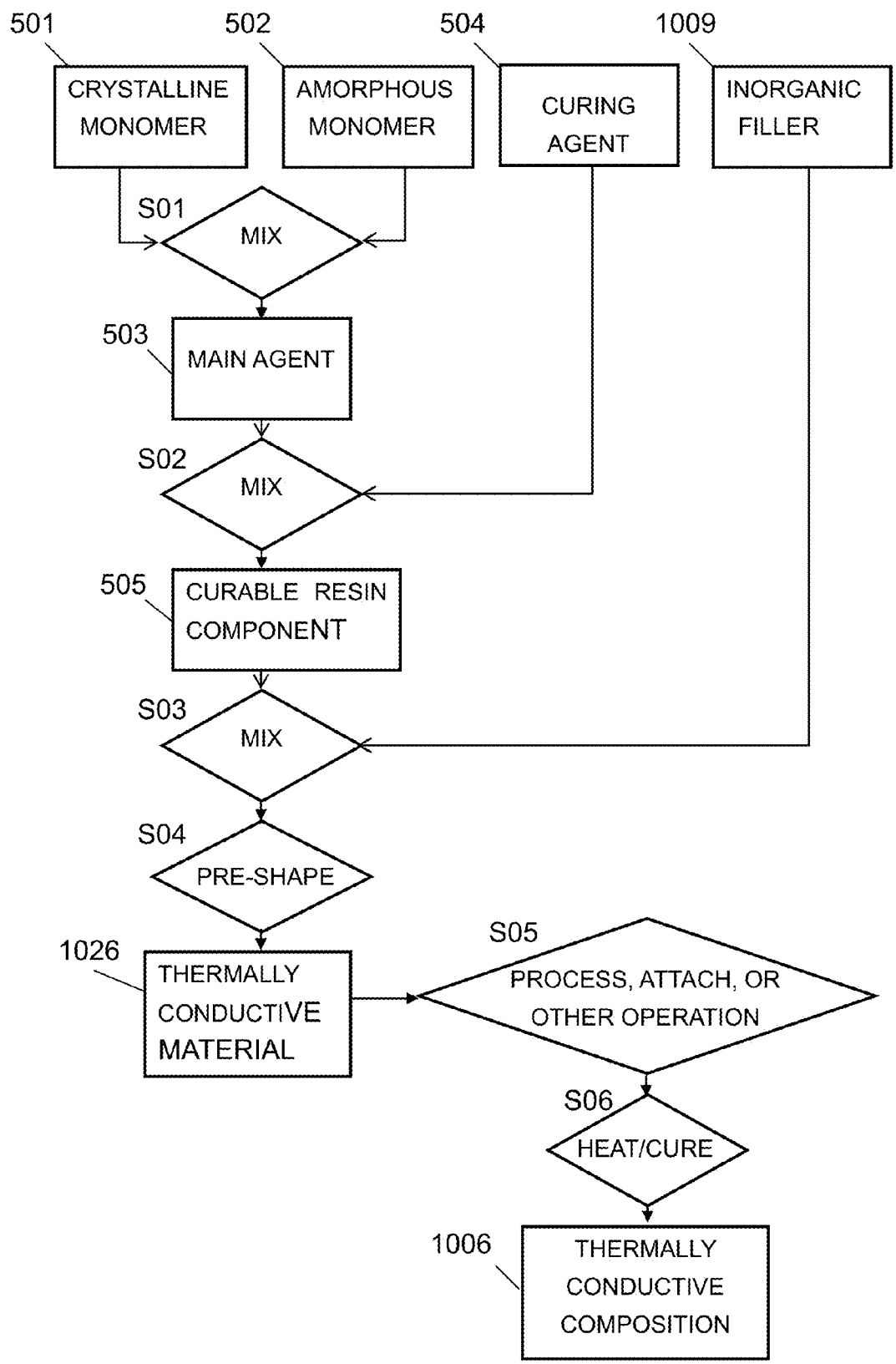
FIG. 4A is a flowchart showing steps for forming the thermally conductive composition illustrated in FIG. 1.
Figure 4B:
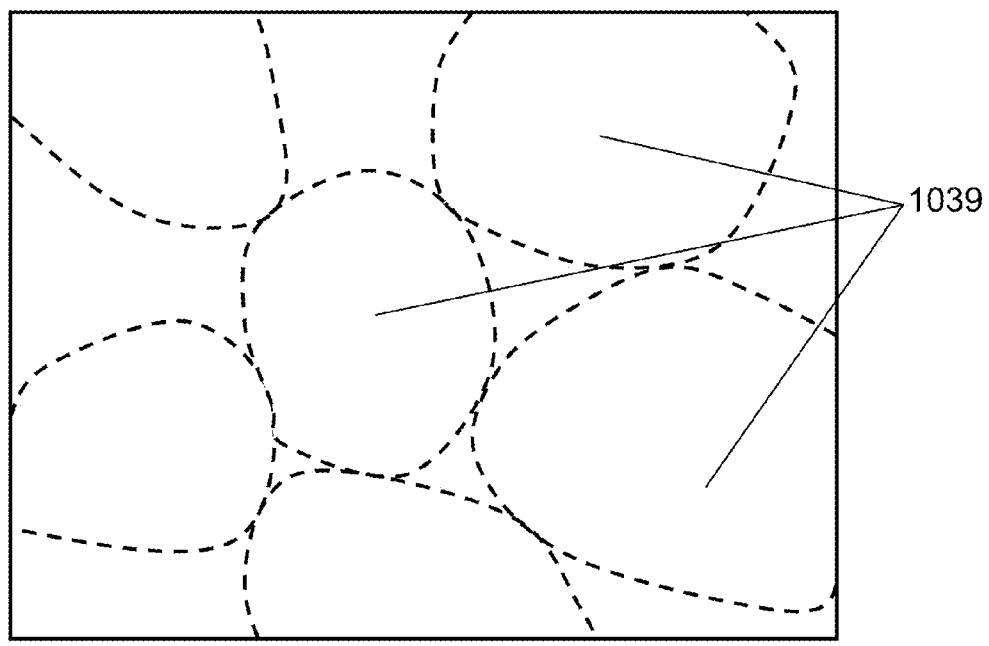
FIG. 4B is a schematic view for describing a free surface of the thermally conductive composition illustrated in FIG. 1.
Figure 4C:
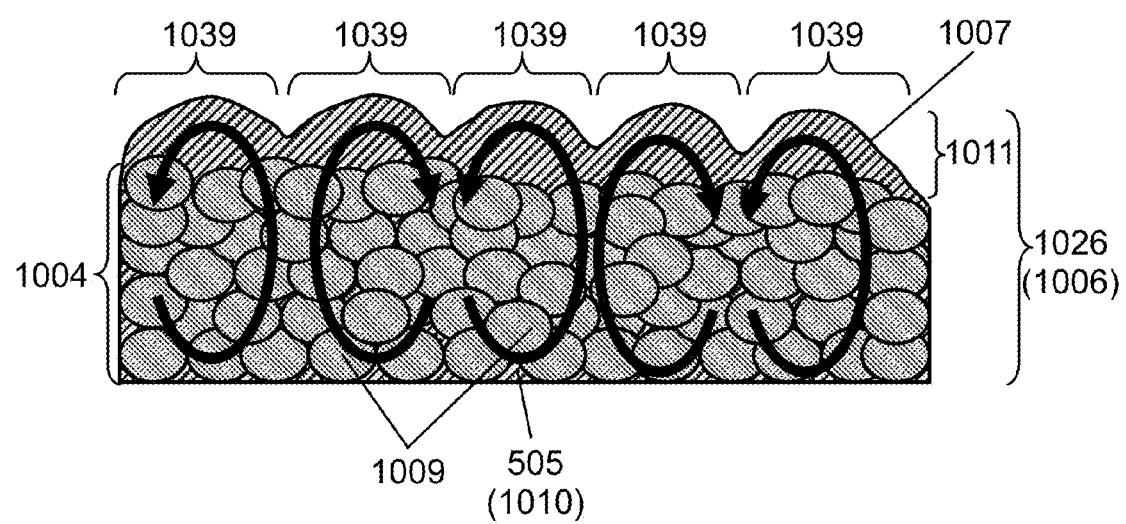
FIG. 4C is a schematic sectional view for describing the thermally conductive composition illustrated in FIG. 1.

With reference to FIGS. 4A, 4B and 4C, the following will describe steps for forming thermally conductive composition 1006, and a schematic sectional structure in the vicinity of the surface thereof. FIG. 4A is a flowchart showing the steps for forming thermally conductive composition 1006. FIGS. 4B and 4C are a schematically enlarged top view for describing free surface 1007 of thermally conductive composition 1006, and a schematic sectional view for describing a section thereof, respectively.

As illustrated in FIG. 4A, crystalline epoxy monomer 501 is first mixed with amorphous epoxy monomer 502 to prepare main agent 503 (S01). Next, curing agent 504 is blended with main agent 503 to prepare curable resin component 505 (S02). Furthermore, inorganic filler 1009 is blended with curable resin component 505, and this mixture is optionally shaped (S04). In this way, thermally conductive material 1026 is produced which is a material in the state that thermally conductive composition 1006 is not cured yet. Thus-produced thermally conductive material 1026 is further subjected to processing, adhesion or some other operation in accordance with the usage (of the thermally conductive composition) (S05). The resultant is heated to cure curable resin component 505 to form thermosetting resin 1010 (S06). In this way, thermally conductive composition 1006 is produced.

Amorphous epoxy monomer 502 is not essential. A monomer, a resin and others that are each different from the above may be added. This matter will be described later. Two or more of S01, S02 and S03 may be performed at the same time. Main agent 503 wherein crystalline epoxy monomer 501 and amorphous epoxy monomer 502 are beforehand mixed with each other may be purchased to be used.

As a typical example of the material for thermosetting resin 1010, the epoxy monomers have been used for the description. However, an oligomer such as a dimer or a trimer may be used. These are collectively named and defined as the epoxy resin component which is not cured yet. In other words, in the present specification, any monomer includes, in the category thereof, an oligomer, which is a polymer wherein molecules of a monomer are bonded to each other in a relatively small amount. In short, any monomer includes, in the category thereof, a dimer, a trimer and a tetramer. This is for distinguishing thermosetting resin (epoxy resin) 1010 produced by reaction between main agent 503 and curing agent 504 from main agent 503 and so on for the sake of convenience.

As illustrated in FIG. 4B, fine convex portions 1039 are observed in free surface 1007 of thermally conductive composition 1006. Convex portions 1039 resemble, for example, Benard cells. In other words, convex portions 1039 are generated in the form of wrinkles or Benard cells in substantially the whole of free surface 1007. Dot lines represented by FIG. 4B are auxiliary lines showing convex portions 1039 schematically and are, for example, boundaries caused by the flow of the Benard cells.

According to an observation (for example, a dark field observation) (of the surface) with a microscope at a high power, aggregates of independent bubbles having a very small size of, for example, 1 μm or less, are viewed, the aggregates being connected to each other in a dot form. The size of general voids is several micrometers or more or is ten micrometers plus several micrometers, or more, and many of the voids are open pores. Thus, the voids are easily discerned from the independent bubbles, the size of which is 1 μm or less, or the like.

FIG. 4C is a sectional view for describing a situation that Benard convention is generated when thermally conductive material 1026 is thermally cured to form thermally conductive composition 1006.

Arrows in FIG. 4C schematically show a situation that curable resin component 505 contained in thermally conductive material 1026 abruptly decreases its viscosity when the material is heated, so that the component is caused to flow by convection in the gaps between the pieces of inorganic filler 1009. Curable resin component 505 undergoes, for example, Benard convection. FIG. 4C is a schematic view and is not a precise view.

The following will describe Benard convection. The Benard convection is a phenomenon discovered by Henri Bernard in France in 1900. In this phenomenon, a lower surface of a fluid layer with a high viscosity is heated, and the heated fluid is raised by buoyant force so that a pattern in the form of cells (fluid cells) is generated inside the fluid and is further generated in an upper surface thereof.

The following will describe a mechanism that voids are not easily generated in surface layer portion 1011 of thermally conductive composition 1006, free surface 1007 or the inside by Benard convention, and voids remaining in the surface layer or at the inside are extinguished by Benard convection or the like.

The inventors have made various experiments about various thermally conductive materials 1026 of several hundred kinds. Specifically, the inventors have heated thermally conductive materials 1026 and observed their free surfaces that have been curing. The inventors have then found out that in the case of causing the generation of Benard convention positively at the time of forming thermally conductive composition 1006 composed of thermosetting resin 1010 and inorganic filler 1009 having a content by percentage of 66% or more by volume, voids therein are largely decreased.

Each of thermally conductive materials 1026 which is not cured yet contains a crystalline epoxy resin component, a typical example of which is a crystalline epoxy monomer. The crystalline epoxy resin in which the crystalline epoxy resin component has been cured is a solid at a temperature lower than the crystallization temperature, and turns into a liquid at the crystallization temperature or higher. In other words, the crystalline epoxy resin in a crystal state is present in the form of a stable solid; however, when the temperature of the resin reaches the melting point thereof, the crystal is speedily melted and changed to a liquid with a very low viscosity.

For this reason, in the middle of the heating for curing thermally conductive material 1026 thermally, the temperature of the material exceeds the crystallization temperature (or the melting point), whereby curable resin component 505 and thermosetting resin 1010 decreases the viscosity before thermally cured. This matter makes it possible to generate positively Benard convention or a phenomenon similar thereto inside the component or the material.

In short, when the temperature of the crystalline epoxy resin component which is not cured yet exceeds the crystallization temperature (or the melting point) thereof, the component turns into a liquid with a very low viscosity. This phenomenon is equivalent to, for example, a matter that when the temperature of ice, which is the crystal of water, exceeds 0° C., which is the crystallization temperature thereof, the ice changes to liquid water with a very low viscosity.

As described above, in the present embodiment, the temperature of the crystalline epoxy resin component which is not cured yet exceeds the crystallization temperature so that the viscosity lowers. The resultant low-viscosity resin component advances a decrease in the viscosity of the amorphous epoxy resin of which viscosity is not easily lowered even when the resin is heated. This is an effect of decreasing the viscosity of the amorphous epoxy by the crystalline epoxy resin component which is not cured yet. This viscosity-decreasing effect is such an effect that the viscosity-decreased crystalline epoxy resin component which is not cured yet changes to a low-viscosity liquid, such as water, and this liquid crystalline epoxy resin component makes a portion of the amorphous epoxy resin, or larger portions thereof compatible (or soluble).

The crystalline epoxy resin component of which the viscosity has been very low further lowers the viscosity of the amorphous epoxy resin component, so that the fluidity of these resin components is raised in the narrow gaps between the particles of inorganic filler 1009.

The individual particles of inorganic filler 1009 are then shifted to more stable positions by the Benard convection. As a result, the voids are lost so that the (particles of) inorganic filler 1009 can be filled into a higher density.

Additionally, the viscosity-decreased thermosetting resin 1010 permeates into the narrow gaps between the particles of inorganic filler 1009. In addition, the surface of inorganic filler 1009 is sufficiently wetted with thermosetting resin 1010. In such a way, bubbles or voids remaining in the surface or the circumference of inorganic filler 1009 can be discharged to the outside in a short period by the Benard convection of curable resin component 505, and some other effect. Accordingly, the voids are reduced by the Benard convection, and further the filling rate of inorganic filler 1009 is increased. Moreover, free surface 1007 of thermally conductive composition 1006 becomes smooth. Thereafter, the epoxy resin component is cured by the added curing agent.

The crystalline epoxy resin component which is not cured yet exists in the form of a stable solid at room temperature (for example, 25° C.). Thus, weighing or some other operation therefor is easily performed.

In general, there is a correlative relationship between the molecular weight of the epoxy resin component which is not cured yet and the viscosity thereof. Therefore, in order to decrease the viscosity of the epoxy resin component, the molecular weight is generally made small. However, when the molecular weight of the epoxy resin component is made small, the softening point also lowers. Thus, the handleability at normal temperature (for example, 20 to 30° C.) declines. Moreover, the Tg (glass transition temperature) of a cured product of the viscosity-decreased epoxy resin unfavorably lowers. It is therefore preferred to use a crystalline epoxy resin component which is a solid at room temperature even before the resin is cured.

In order to form surface layer portion 1011 having a thickness of 20 μm or less in the surface (region) of thermally conductive composition 1006, it is practical to generate Benard convection positively in thermally conductive material 1026. A positive formation of surface layer portion 1011, in which the content by percentage of inorganic filler 1009 is small, in the surface produces an effect of inducing the generation of a void-extinguishing mechanism, such as Benard convection. In other words, when surface layer portion 1011 is laid, the generation of voids can be restrained in the surface layer or inner layer of thermally conductive composition 1006.

As described above, thermally conductive composition 1006 is composed of at least thermosetting resin 1010 and inorganic filler 1006. The content by percentage of inorganic filler 1006 is 66% or more by volume. Surface layer portion 1011 made mainly of thermosetting resin 1010 and having a thickness of 20 μm or less is positioned in free surface 1007. According to this structure, the generation of voids can be restrained inside thermally conductive composition 1006 and in the surface thereof. Moreover, the filling of inorganic filler 1009 into thermally conductive composition 1006 can be made at a high degree so that the thermal conductivity can be increased. Furthermore, the formability of thermally conductive composition 1006 and convenience for the handling thereof can be greatly improved.

It is desired that thermal convection is induced (in the thermally conductive material) so that Benard cells are generated. However, it may be difficult to discern whether or not fine convex portions 1039 in the surface are Benard cells. However, matters induced by convection generated when the thermally conductive material is heated are Benard cells of a kind at least.

The following will describe, in detail, thermally conductive material 1026 used to produce thermally conductive composition 1006 according to the present embodiment. Thermally conductive material 1026 is not required to be limited to any material described below. It is advisable to select, as thermally conductive material 1026, an appropriate combination from materials for which good use of the void-extinguishing mechanism described with reference to FIG. 4C can be made.

As has been illustrated in FIG. 4A, thermally conductive material 1026 contains inorganic filler 1009, and curable resin component 505 composed of main agent 503, which is to be crystalline thermosetting resin 1010, and curing agent 504. Besides curing agent 504, a curing promoter may be contained therein.

Inorganic filler 1009 is desirably at least one selected from alumina, aluminum nitride, boron nitride, silicon carbide, silicon nitride, magnesium oxide, and zinc oxide. The use of such a highly thermally conductive material as inorganic filler 1009 increases the thermal conductivity of thermally conductive composition 1006. These materials are preferred also from the viewpoint of electric non-conductance and others. Two or more of these materials may be combined with each other.

The average particle diameter of inorganic filler 1009 is desirably in the range of 0.1 μm or more and 100 μm or less. If the average particle diameter is less than 0.1 μm, the specific surface area is large so that thermally conductive material 1026 is not easily kneaded. As a result, an effect may be produced onto the formability of thermally conductive composition 1006. If the average particle diameter is more than 100 μm, thermally conductive composition is not easily made into a thin layer. This may affect the heat dissipating performance of a (concerned) heat dissipating substrate and the downsizing of a (concerned) product. In order to increase the filling rate of inorganic filler 1009, it is allowable to select plural species of inorganic filler 109 that are different from each other in particle size distribution, and mix these species to be used.

The following will describe monomer 501 of the crystalline epoxy resin, and curing agent 504, which each constitute thermally conductive material 1026, separately from each other, using general formula (1) to formula (8).

general formula (1)

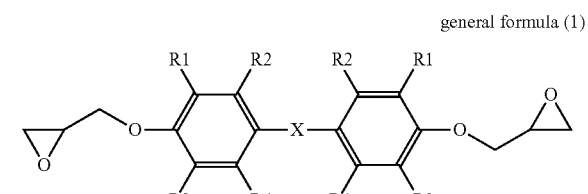

wherein X: S, O, CH₂ or a single bond; and each of R1, R2, R3 and R4: H, CH₃ or t-Bu (tertiary butyl group), and any two or more of R1 to R4 may be the same.

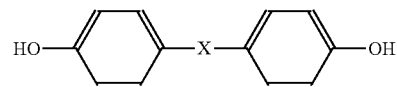

X = S, O formulae (2)

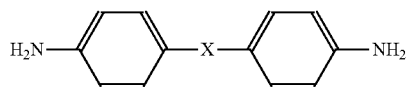

X = S, O formula (3)

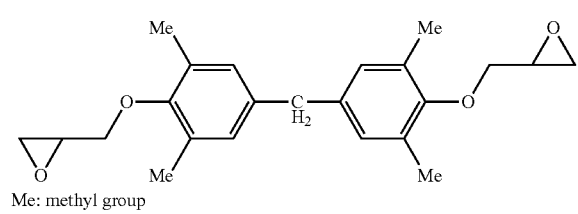

Me: methyl group formula (4)

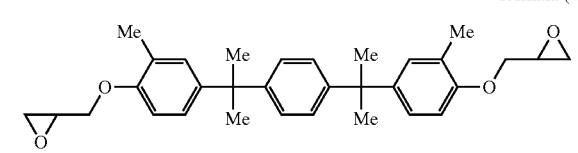

formula (5)

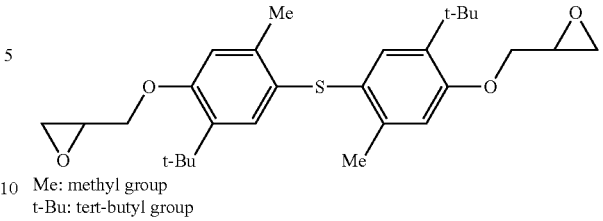

Me: methyl group
t-Bu: tert-butyl group formula (6)

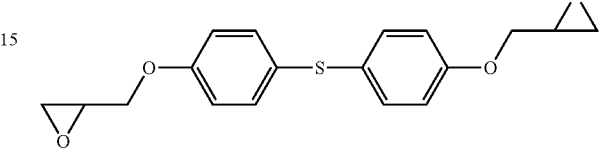

formula (7)

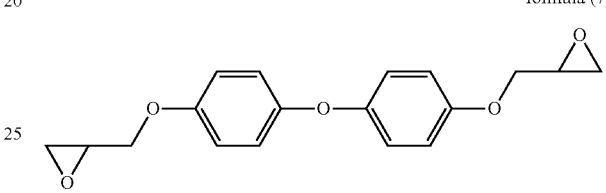

formula (8)

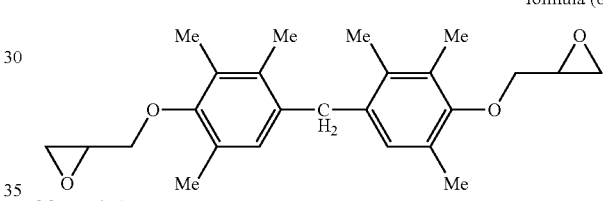

Me: methyl group

The general formula (1) and the formulae (3) to (8) each represent the structural formula of an example of crystalline epoxy monomer 501. In the general formula (1), X is S (sulfur) or O (oxygen), CH₂ (a methylene group), or none (a single bond, that is, a direct bond). R1, R2, R3 and R4 are each CH₃, H, t-Bu (a tertiary butyl group), or the like. R1 to R4 may be the same. In short, compounds of the formula (3) and formulae (5) to (8) are specific examples of the general formula (1). The epoxy-group-having monomers may each be referred to as the main agent. Even when a monomer has the structure of the general formula (1), the monomer may be a non-crystalline epoxy monomer, dependently on steric hindrance based on the size of R1, R2, R3 and/or R4. When a monomer is, for example, a monomer wherein X is a single bond and R1, R2, R3 and R4 are each CH₃, the monomer is amorphous. Such an epoxy monomer is not any crystalline epoxy resin component in the present application.

The crystalline epoxy monomer expresses crystallinity when molecules thereof are self-aligned to each other. For the self-alignment, it is practical to make good use of a mesogen structure made of phenyl-phenyl groups, as shown in formula (1) or formula (4).

In order to examine the crystallization state of the crystalline epoxy resin component in cured thermosetting resin 1010, it is practical to cut only a resin portion of a surface of a sample (of the resin) into a very thin piece without breaking the resin portion, and then evaluate the piece with a polarizing microscope or the like. Differential scanning calorimetry (DCS) is also practical. When DSC is used, the amount of the crystalline epoxy resin component contained in thermosetting resin 1010 is measured in the unit of % by weight (or wt %). However, it is practical to convert the data to data in the unit of % by volume (vol %). This is because the molecular weights of used crystalline epoxy monomers are different from each other in accordance with the species thereof. In order to extract the crystalline epoxy resin component (crystalline epoxy monomer) in an uncured state, it is practical to use centrifugation or some other separating method.

The formulae (2) are each a structural formula of the curing agent, which is used to cure the crystalline epoxy resin. X is S (sulfur), O (oxygen) or a single bond. A product obtained by mixing the monomer of the general formula (1) or the formula (3) with the curing agent(s) (of any one) of the formulae (2) and then polymerizing the polymerizable component(s) therein may be called the crystalline epoxy resin.

The proportions of main agent 503 and curing agent 504 are calculated from the epoxy equivalent. The "epoxy equivalent" (of any "epoxy resin") is the weight (the value in the unit of g) of the epoxy resin per gram of epoxy groups contained in the epoxy resin. In the case of, for example, an epoxy resin having a known molecular structure, the epoxy equivalent thereof can be calculated out by dividing the molecular weight of the epoxy resin by the number of epoxy groups contained in a single molecule of the epoxy resin. As the need arises, the "epoxy equivalent" may be decided by a measurement using a hydrochloric acid-dioxane method, or some other method. It is practical to refer to JIS K7236 "Method for Testing the Epoxy Equivalent of Epoxy Resin".

As curing agent 504, a curing agent other than curing agents of the formulae (2) may be used. As crystalline epoxy monomer 501, specifically, use may be made of, for example, monomers represented by the formulae (3) to (8). The melting points of the monomers represented by the formulae (3) to (8) range from, for example, about 50 to 121° C. The melt viscosities thereof are also low. For example, the viscosities at 150° C. range from 6 to 20 mPas. Thus, the monomers may each be mixed with inorganic filler 1009 so as to disperse the filler easily therein.

The following will describe a preferred proportion of crystalline epoxy monomer 501 in main agent 503. The proportion by volume of crystalline epoxy monomer 501 in main agent 503 ranges desirably from 5% or more by volume and 100% or less by volume, more desirably from 10% or more by volume and 88% or less by volume. By setting the proportion of crystalline epoxy monomer 501 to 5% or more by volume, free surface 1007 of thermally conductive composition 1006 can be made smooth. By contrast, if the proportion is less than 5% by volume, the composition may not obtain viscosity-decreasing effect when thermally cured. If the proportion of crystalline epoxy monomer 501 is more than 88% by volume, the main agent decreases the viscosity too much when the thermally conductive composition is thermally cured. Thus, the main agent may ooze or affect the keeping-performance of the shape of the thermally conductive composition. It is more desired that crystalline epoxy monomer 501 is contained in a proportion of 40% or more by volume of the whole of main agent 503. When the proportion is in this range, the composition easily expresses crystallinity.

As described above, the addition of a different additive (to the thermally conductive material) may be performed as the need arises. For example, the following may be blended: a plasticizer, a releasing agent such as an acid amide, an ester, or a paraffin, a stress relaxing agent such as nitrile rubber or butadiene rubber, an organic flame retardant such as a phosphoric acid ester or melamine, an inorganic flame retardant such as antimony pentaoxide, molybdenum oxide, zinc borate, tin oxide, barium metaborate, aluminum hydroxide, magnesium hydroxide or calcium aluminate, a coupling agent such as a silane coupling agent, a titanate coupling agent or an aluminum coupling agent, a colorant such as a dye or a pigment, an inorganic fiber such as glass fiber, boron fiber, silicon carbide fiber, alumina fiber or silica alumina fiber, an organic fiber such as aramid fiber, polyester fiber or cellulose fiber, an oxidation stabilizer, a light stabilizer, a humidity resistance improver, a thixotropy supplier, a diluting agent, an antifoaming agent, a resin that may be of various other types, an adhesive agent, an antistatic agent, a lubricant, or an ultraviolet absorbent.

When a thermoplastic resin is added thereto, the impact resistance of the crystalline epoxy resin can be improved. The addition of the thermoplastic resin is restricted on the basis of the structure of the crystalline epoxy resin. In order for the epoxy resin to realize compatibility between thermal conductivity and impact resistance, the amount of the thermoplastic resin is desirably 0.3 part or more by volume and 5.0 parts or less by volume for 100 parts by volume of the total of main agent 503 and curing agent 504. The thermoplastic resin may be an acrylic resin or the like. In particular, the incorporation of a core shell type acrylic resin makes an improvement in the impact resistance. The core shell is a pearl-like fine particle in which a core layer made of a thermoplastic resin, such as acrylic resin, is covered with a different resin (such as a glassy polymer or epoxy resin). The particle may be made into a multilayered structure in accordance with the usage. When particles having a primary particle diameter of 0.05 to 1.00 µm (desirably 0.1 to 0.5 µm) are used, the dispersibility thereof is increased. Even when the core shell particles constitute secondary aggregates, the particles can easily be dispersed by use of a biaxial kneader or the like. This is because the particles have core shell structures.

The cores are rendered, for example, a thermoplastic resin having a low Tg (desirably, 50° C. or lower, more desirably 0° C. or lower) and made of a homopolymer or copolymer made of an acrylic monomer. This is for causing the resin to act as a concentration point of stress inside thermally conductive material 1026 or inside thermally conductive composition 1006 to improve the impact resistance or attain stress-relaxation.

When a core shell type polymer is used, a rubbery-form resin, which is a sort of thermoplastic resin, may be used in its core regions. Whether the used resin is the rubbery-form resin, which is crosslinked, or the thermoplastic resin which is not crosslinked, the used resin acts in substantially the same manner when the resin is in the state of fine particles having a primary particle diameter of 1.00 µm or less, so as to improve the impact resistance or relax stress. For this reason, the thermoplastic resin may be a rubbery resin (crosslinkage resin).

The Tg of the shells is high and desirably 100° C. or higher, more preferably 150° C. or higher. This is for restricting melt-bonding between the particles, and heightening the compatibility and dispersibility (of the core shell resin) with/in the epoxy resins (including, in the category, the crystalline epoxy resin), the curing agent and so on.

The thermoplastic resin, such as acrylic resin, to be added into thermally conductive material 1026 is desirably added into the state that the resin can be extracted with acetone or the like. This is for dispersing (or interspersing) the resin for improving the impact resistance, for example, into a sea/island structure in thermally conductive material 1026, thereby heightening the impact resistance. When the sea/island structure is formed, the thermoplastic resin can be extracted with acetone or the like and it is verified that the thermoplastic resin is dispersed into the sea/island structure. In the extraction, the detection precision of the thermoplastic resin and so on can be increased when the sample for the extraction is pulverized.

When the thermoplastic resin such as acrylic resin is present in thermally conductive material 1026 in the state that the resin cannot be extracted, it is difficult to attain the extraction even by use of acetone or the like. The state is, for example, a state that the resin has reacted with the epoxy resin, has been dissolved in the epoxy resin, or has been molecularly dispersed in the epoxy resin. When the thermoplastic resin is dissolved into thermally conductive material 1026 in such a state, the impact resistance improving effect is not obtained. This is because no interface (no stress concentration) between the epoxy resin and the thermoplastic resin is generated.

The extraction amount depends on conditions (such as a pulverization-form condition) of any sample for extraction; thus, the amount is set to a trace amount of the proportion of the thermoplastic resin in entire resins in the sample, for example, 0.1% or more by volume, desirably 1% or more by volume. This is because there is a case where the absolute value of the thermoplastic resin is not easily determined by the extraction.

The following will describe a method for preparing thermally conductive material 1026. First, measurements are made about weights of crystalline epoxy monomer 501, amorphous epoxy monomer 502, curing agent 504, a thermoplastic resin, and inorganic filler 1009 in accordance with the blend ratio therebetween, and then the components are mixed.

As a kneading machine, use is made of a commercially available heating and kneading machine or biaxial kneading machine. The machine is, for example, a planetary mixer, a kneader, or a Labo Plastomill manufactured by Toyo Seiki Seisaku-Sho, Ltd. To the inside of the kneading machine may be equipped with stirring vanes such as Σ type, Z type, and hybrid type stirring vanes. Forms other than vanes may be used. The kneading machine is desirably a machine capable of being heated to a predetermined temperature with a heater or the like. When the kneading machine is heated, a material in a solid state at room temperature can be melted (or liquefied), so that the material can increase its affinity with other members.

When the temperature of each of the monomers is set into the melting temperature thereof or higher (for example, 50 to 200° C.), the melt viscosity of curable resin component 505 containing the thermoplastic resin can be kept low so that a uniform distribution of inorganic filler 1009 into the (curable) resin (component) can be attained.

It is desired that the temperature is set to the lowest temperature at which these members can be kept into a liquefied state, or higher, for example, 100° C. or higher. When the mixture is kneaded at the lowest liquefying temperature or higher, the mixture is easily made uniform.

By lowering the temperature of the kneading machine or that of the material set therein at the time of the addition of curing agent 504, any thermally curing reaction or change with the passage of time can be restrained after the addition. In such a way, thermally conductive material 1026 is produced.

The following will describe pre-shaping of thermally conductive material 1026. This corresponds to S04 in FIG. 4A. It is desired that thermally conductive material 1026 produced as described above is taken out from the kneading machine, and simultaneously the material is made into a form which is to be easily made into a shape, such as a sheet form, rod form, or pellet form. When thermally conductive material 1026 is pre-shaped into a sheet form, rod form, pellet form, or some other form, the resultant is easily handled. The pre-shaped material is in particular preferably in a sheet form. When thermally conductive material 1026 is made into the sheet form in this way, the handling of thermally conductive composition 1006 itself is easy. This is similar to a prepreg formed by impregnating glass fiber with an epoxy resin, the prepreg being an intermediate in the middle of the time when a laminated substrate is formed. When thermally conductive material 1026 is made into a sheet form, it is easy to cause the material to adhere to a surface of a metallic plate. Furthermore, even when the metallic plate is curved, or bent into an L-shape, thermally conductive material 1026 can easily be caused to adhere to the surface of the plate in the state that the material keeps a substantially constant thickness.

Figure 5:
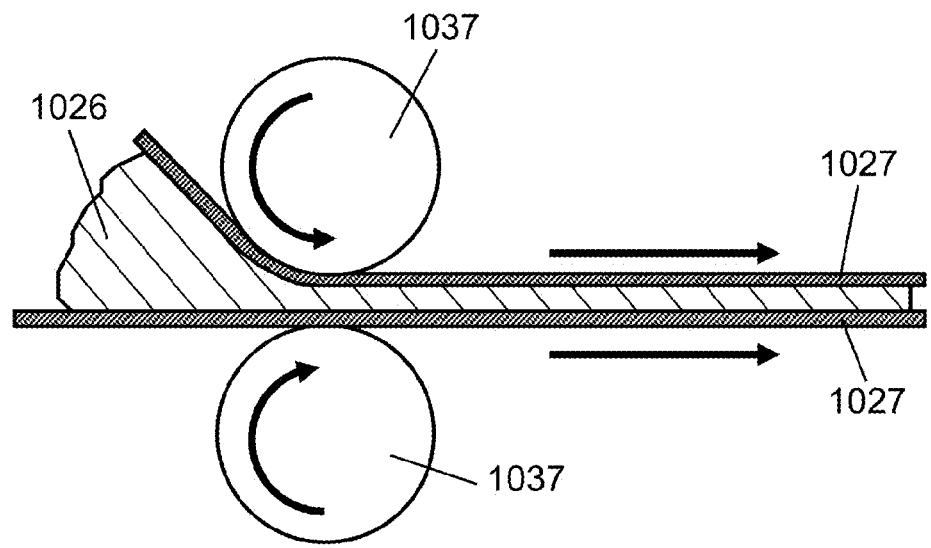
FIG. 5 is a schematic view for describing the structure of a shaping machine for shaping a thermally conductive material according to an embodiment of the invention into a sheet form.

FIG. 5 is a schematic view for describing the structure of a shaping machine for shaping thermally conductive material 1026 into a sheet form. When thermally conductive material 1026 is shaped into a sheet form between two pressing rolls 1037, film 1027 for preventing dirt or stain is beforehand arranged onto each surface of the material. In this way, thermally conductive material 1026 can be shaped into the form of a sheet having a predetermined thickness.

The form of thermally conductive material 1026 may be a rod form or pellet form besides the sheet form. When the material is made into a rod form, the surface area of thermally conductive material 1026 is reduced and a change thereof with time is restrained. Moreover, when the material and metallic plate 1012 or the like are pressed, air residuals, which may be called voids, are not easily generated at the interface therebetween. When the material is made into a pellet form, the resultant can be improved in handleability and weight-measurability.

Film 1027 may be a commercially available resin film made of PET or the like and having a surface subjected to silicone treatment, water repellent treatment, or releasing treatment.

The thickness of thermally conductive material 1026 pre-shaped is desirably 0.02 mm or more, and 5.00 mm or less. If the thickness is less than 0.02 mm, pinholes may be generated in thermally conductive material 1026. If the thickness is more than 5.00 mm, the material may produce an effect onto the heat dissipating performance when the material is used in a heat dissipating substrate. When a shaping section (for example, pressing rolls 1037) of the shaping machine in FIG. 5 is heated, the formability of thermally conductive material 1026 is heightened so that a reduction is attained in unevenness of the thickness of the resultant sheet. When film 1027 is left, as a sort of protecting sheet, on each of the surfaces of thermally conductive material 1026 pre-shaped into the sheet form, the adhesion of wastes and other stains thereto can be prevented.

Thermally conductive material 1026 may be applied onto a metallic plate with a coater, or may be shaped with an extruder.

A solvent may be added (to the thermally conductive material) to adjust the viscosity thereof. The material may be kneaded in the state that the material is beforehand dissolved in a solvent. The production process is not limited to the above.

The proportion of inorganic filler 1009 in the total of inorganic filler 1009 and curable resin component 505 is desirably 66% or more by volume and 90% or less by volume. In other words, the proportion of curable resin component 505 is desirably 10% or more by volume and 34% or less by volume. Furthermore, the proportion of inorganic filler 1009 is desirably 70% or more by volume and 88% or less by volume, and that of the resin composition is desirably 12% or more by volume and 30% or less by volume. Curable resin component 505 denotes the total of main agent 503 containing crystalline epoxy monomer 501, and curing agent 504.

If the proportion of inorganic filler 1009 is less than 66% by volume, the thermal conductivity of thermally conductive composition 1006 obtained by curing thermally conductive material 1026 may lower. If the proportion of inorganic filler 1009 is more than 90% by volume, the formability of thermosetting resin 1010 may be affected.

As described above, thermally conductive material 1026 of this example is composed of curable resin component 505, the thermoplastic resin, and inorganic filler 1009. Curable resin component 505 contains main agent 503 and curing agent 504. Main agent 503 contains crystalline epoxy monomer 501 in an amount of 5% or more by volume and 100% or less by volume. The thermoplastic resin is added in an amount of 0.3 part or more by volume and 5.0 parts or less by volume for 100 parts by volume of curable resin component 505. In the whole of thermally conductive material 1026, inorganic filler 1009 is contained in an amount of 66% or more by volume and 90% or less by volume, or more restrictedly in an amount of 70% or more by volume and 88% or less by volume. The use of thermally conductive material 1026 having such a composition makes it possible to heighten the heat dissipating performance and the impact resistance of thermally conductive composition 1006.

When main agent 503 and curing agent 504 are reacted with each other so that cured thermosetting resin 1010 has crystallinity, the thermal conductivity thereof can be increased.

When curing agent 504 has two OH groups or $NH_2$ groups as shown in the formulae (2), curing agent 504 has reactivity with the epoxy monomer(s) contained in main agent 503. Curing agent 504 may have, in the molecule thereof, two OH groups and two $NH_2$ groups. Furthermore, the crystallization (of the crystalline resin) can also be promoted. Thus, the thermal conductivity of thermally conductive composition 1006 can be increased, and the heat dissipating performance of the heat dissipating substrate can be increased.

The following will describe, in particular, a composition making high thermal conductivity and high flame retardancy compatible with each other. Hitherto, as a method for giving flame retardancy, a method of adding an organic or inorganic flame retardant has been known. However, when a resin largely different in structure (from the crystalline resin in the thermally conductive material) is blended therewith as the organic flame retardant, the crystallization is restricted; thus, the blend amount is restricted. Accordingly, while the thermally conductive material keeps crystallinity, the material cannot attain flame retardancy. In the case of the inorganic flame retardant, the thermal conductivity of the flame retardant is low; thus, when the amount thereof is large, the thermal conductivity (of the material) declines.

Herein, a description is made about a method for solving a problem that the crystalline resin is hard and brittle and is further burned with ease, making a heat dissipating substrate using the crystalline resin compatible between high thermal conductivity and toughness, and giving flame retardancy to thermally conductive material 1026.

Specifically, a flame retardant epoxy resin is added to the resin component, and a flame retardant aid filler is added to inorganic filler 1009. More specifically, a flame retardant epoxy monomer is added to curable resin component 505 in an amount of 3 parts or more by volume and 15 parts or less by volume for 100 parts by volume of curable resin component 505, this component being composed of main agent 503 containing 5% or more by volume and 100% or less by volume of the crystalline epoxy monomer, and curing agent 504. Inorganic filler 1009 and a flame retardant aid filler are then blended with the mixture of curable resin component 505 and the flame retardant epoxy monomer to prepare thermally conductive material 1026. The proportion by volume of inorganic filler 1009 in thermally conductive material 1026 is set to 66% or more by volume and 90% or less by volume, desirably 70% or more by volume and 88% or less by volume. The flame retardant aid filler is added to curable resin component 505 in an amount of 0.6 part or more by volume and 2.5 parts or less by volume for 100 parts by volume of curable resin component 505.

When the flame retardant epoxy and the flame retardant aid filler are added in a proportion which does not permit the crystallization to be broken as described above, flame retardancy is given (to thermally conductive composition 1006) so that the flame retardancy of the composition can be improved while the composition keeps a high thermal conductivity.

To prepare thermally conductive material 1026 of such a type, measurements are made for the weights of the crystalline epoxy monomer, the curing agent, the flame retardant epoxy monomer, inorganic filler 1009, and the flame retardant aid filler in accordance with (target) blend proportions, and then these components are kneaded. Steps after this step are the same as described above.

The ratio between the total of main agent 505 and the flame retardant epoxy monomer, and curing agent 504 is calculated from the epoxy equivalent. Curing agent 504 also acts as an agent for curing the flame retardant epoxy monomer. As curing agent 504, a curing agent other than curing agents of the formulae (2) may be used.

The following will describe the addition proportion of the flame retardant epoxy monomer to curable resin component 505. For the crystalline epoxy resin, its structural form largely affects the crystallinity. When large substituents, such as butyl groups, are contained therein in a large amount, the crystallinity is inhibited. In order to give flame retardancy (to thermally conductive material 1026), it is necessary to use the flame retardant epoxy monomer in a suitable amount that is not small. The addition amount of the flame retardant epoxy monomer is desirably 3 parts or more by volume and 15 parts or less by volume for 100 parts by volume of curable resin component 505. If the amount is less than 3 parts by volume, a sufficient flame retardancy cannot be supplied. If the amount is more than 15 parts by volume, the epoxy polymer does not express crystallinity so that the thermally conductive material becomes low in thermal conductivity. The supply of flame retardancy can be realized by combining the flame retardant epoxy resin with the flame retardant aid filler even when the amount of this resin is small.

For the addition proportion of the flame retardant aid filler to curable resin component 505, the amount of the filler is 0.6 part or more by volume and 3.5 parts or less by volume for 100 parts by volume of component 505. If the amount is more than 3.5 parts by volume, the thermally conductive material is largely reduced in thermal conductivity since the thermal conductivity of the flame retardant aid filler is low. If the amount is less than 0.6 part by volume, flame retardancy cannot be given (to the thermally conductive material). The flame retardant aid filler may be a hydroxyl compound, a boron compound, an antimony compound, a molybdenum compound, a metal oxide salt, or the like. Antimony trioxide is particularly desired since the compound has a larger flame retardant effect. The particle diameter of antimony trioxide is more preferred as the diameter is smaller, and is desirably from 0.1 to 20 µm, more preferably from 0.3 to 10.0 µm. If the particle diameter is less than 0.1 µm, the compound is expensive and may not be easily dispersed in thermally conductive material 1026. If the particle diameter is more than 20 µm, the surface of thermally conductive composition 1006 becomes rough so that an effect may be produced onto the adhesiveness between the composition and wiring pattern 1033 made of a lead frame or the like.

The particle diameter of the antimony trioxide may also produce an effect on the hygroscopicity (of the composition). Thus, when the thermally conductive composition has a problem about hygroscopicity, the antimony trioxide absorbs humidity more easily as the particle diameter thereof is smaller. Thus, it is desired to set the particle diameter of the antimony trioxide to 0.1 µm or more when the hygroscopicity is a problem. This is because antimony trioxide having a small particle diameter of less than 0.1 µm is high in hygroscopicity.

When the particle diameter of the antimony trioxide is matched with that of inorganic filler 1009 so as to be made close to that of inorganic filler 1009, the antimony trioxide can easily be dispersed in the epoxy resin and so on. In this case, plural inorganic fillers 1009 different from each other in particle diameter may be used, and it is desired in the case to make the particle diameter of the antimony trioxide consistent with that of either the small powder or the large powder. This manner makes it possible to increase the dispersibility of these powders. The large particle diameter ranges, for example, from 1.0 to 10.0 µm, and the small particle diameter ranges, for example, from 0.2 to 0.6 µm.

The proportion of inorganic filler 1009 in thermally conductive material 1026 is desirably from 70 to 88% by volume. In other words, the proportion of the resin component, which is the total of curable resin component 505 and the flame retardant epoxy monomer, is desirably from 30 to 12% by volume. If the proportion of inorganic filler 1009 is less than 70% by volume, thermally conductive composition 1006, which is produced by curing thermally conductive material 1026, becomes low in thermal conductivity. Moreover, the flame retardancy is also affected. If the proportion of inorganic filler 1009 is more than 88% by volume, the formability of thermally conductive composition 1006 may be affected.

When thermally conductive material 1026 is made into a composition as described above, the material can realize high thermal conductivity and flame retardancy. The use of brominated epoxy as the flame retardant epoxy monomer makes it possible to realize high thermal conductivity and flame retardancy of thermally conductive material 1026, thermally conductive composition 1006, or a heat dissipating substrate or some other member in which the matter (1026 or 1006) is used. For the brominated epoxy resin, the compatibility with other resins is very good and bleeding-out can be decreased by selecting the molecular weight of the resin. The bleeding-out is a phenomenon that various additives in thermally conductive material 1026 change with time to aggregate so that the resultant aggregates make their appearances as powder on the surface, or that a low molecular weight resin or a solvent exudes to the circumference of a cured product, or some other phenomenon. The heat dissipating performance or the flame retardancy can be heightened, in particular, by decreasing the bleeding-out.

Moreover, curing agent 504 has two OH groups and/or two $NH_2$ groups, thereby improving the reactivity and curability of thermally conductive material 1026, or the matching thereof with the flame-retarding material, so that the thermally conductive material can attain compatibility between high thermal conductivity and flame retardancy.

The following will describe the compatibility between high thermal conductivity and high flame retardancy, and impact resistance (of the thermally conductive material).

Any crystalline resin in the prior art is restricted for the application thereof to heat dissipating substrates because of properties specific to the crystalline resin (such as properties that the resin is hard and brittle, and is easily chipped, cracked, or burned). As a method for improving the strength thereof, known is, for example, a method of blending a curing agent that is easily made into a network structure therewith. Crystalline epoxy resin forms three-dimensional bonds, whereby the crystallinity thereof is inhibited so that the thermally conductive material does not obtain a high thermal conductivity in many cases.

Furthermore, the crystalline resin is weak in adhesive force onto any metallic plate. Alternatively, stress is easily concentrated to the inside the crystalline resin, or the interface between the crystallized resin and a metallic plate so that the stress may cause a peel at the interface between the crystallized resin and the metallic plate. Thus, when this resin and the other are made into a heat dissipating substrate, there may remain a problem of impact resistance according to a drop test and others.

The supply of flame retardancy (to the crystalline resin) is as described above. Therefore, in order to solve the problems of the crystalline resin that the resin is hard and brittle, and is easily burned while the resin attains compatibility between high thermal conductivity and toughness and further gains flame retardancy, the thermoplastic resin, the flame retardant epoxy resin, and the flame retardant aid filler each mentioned above are used together (with the crystalline resin).

Specifically, a flame retardant epoxy monomer is added to curable resin component 505 in an amount of 3 parts or more by volume and 12 parts or less by volume for 100 parts by volume of curable resin component 505, the component being the total of main agent 503 containing 5% or more by volume and 100% or less by volume of crystalline epoxy monomer 501, and curing agent 504. The thermoplastic resin is then added thereto in an amount of 0.3 part or more by volume and 2.5 parts or less by volume. Furthermore, into this mixture are blended inorganic filler 1009 and the flame retardant aid filler to prepare thermally conductive material 1026. The proportion by volume of inorganic filler 1009 in thermally conductive material 1026 is set to 66% or more by volume and 90% or less by volume, desirably 70% or more by volume and 88% or less by volume. The flame retardant aid filler is added to curable resin component 505 in an amount of 0.6 part or more by volume and 2.5 parts or less by volume for 100 parts by volume of component 505.

By such an addition of the flame retardant epoxy monomer and the flame retardant aid filler in a proportion which does not permit the crystallization (of the crystalline resin) to be broken, flame retardancy is given (to the thermally conductive material). The thermoplastic resin is also blended therewith in a proportion which does not permit the crystallization to be broken. This manner makes it possible to give strengths (such as cracking resistance) required for a component-mounting substrate, high thermal conductivity and flame retardancy (to the thermally conductive composition). As a result, the composition can attain compatibility between high heat dissipating performance and toughness/flame retardancy.

Additionally, stress is not easily concentrated to thermally conductive material 1026 (or the thermally conductive composition produced by curing thermally conductive material 1026), so that the adhesiveness thereof onto a metallic plate is also improved.

In order to prepare thermally conductive material 1026 of such a type, measurements are made for the weights of main agent 503, curing agent 504, the flame retardant epoxy monomer, the thermoplastic resin, inorganic filler 1009, and the flame retardant aid filler in accordance with (target) blend proportions, and then these components are kneaded. Steps after this step are the same as described above.

The following will describe the proportion of the flame retardant epoxy resin to curable resin component 505. As described above, the addition amount of the flame retardant epoxy monomer is desirably 3 parts or more by volume and 12 parts or less by volume for 100 parts by volume of curable resin component 505. If the amount is less than 3 parts by volume, a sufficient flame retardancy cannot be given. If the amount is more than 12 parts by volume, the thermally conductive material does not express crystallinity and lowers thermal conductivity. Flame retardancy can be given by a combination of the flame retardant epoxy resin with the flame retardant aid filler even when the amount of the resin is small.

The addition amount of the flame retardant aid filler is desirably 0.6 part or more by volume and 2.5 parts or less by volume for 100 parts by volume of curable resin component 505. If the amount is more than 2.5 parts by volume, the thermally conductive material severely becomes low in thermal conductivity since the thermal conductivity of the flame retardant aid filler is low. If the amount is less than 0.6 part by volume, flame retardancy cannot be given (to thermally conductive material). Preferred materials of the flame retardant epoxy monomer and the flame retardant aid filler are the same as described above.

In order that the material can realize compatibility between thermal conductivity and impact resistance, it is desired to add the thermoplastic resin to curable resin component 505 in an amount of 0.3 part or more by volume and 2.5 or less by volume for 100 parts by volume of curable resin component 505. Preferred materials of the thermoplastic resin are also the same as described above.

By making thermally conductive material 1026 into the above-mentioned composition, the material can realize high thermal conductivity, flame retardancy, and impact resistance. In the invention, it is important to realize the form (structure) illustrated in FIG. 1. It is allowable to select a method other than the approach from the viewpoint of the raw materials; however, even in this case, it is most important to realize the form illustrated in FIG. 1.

Embodiment 2

Figure 6:
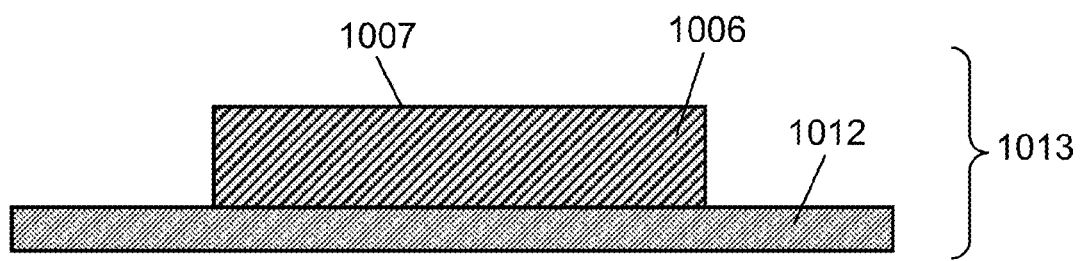
FIG. 6 is a sectional view for describing a heat dissipating plate according to an embodiment of the invention.

With reference to FIG. 6, a heat dissipating plate according to an embodiment of the invention will be described hereinafter.

FIG. 6 is a sectional view of the heat dissipating plate according to the embodiment. Heat dissipating plate 1013 has metallic plate 1012 and sheet-form thermally conductive composition 1006 laid thereon. When the thickness of thermally conductive composition 1006 is set to 0.6 mm or more, reinforced electric insulation can be satisfied. The reinforced electric insulation means a single insulation for making a protection equivalent to or larger than a double insulation against electrocution. The double insulation is composed of a basic insulation and an additional insulation. When the reinforced electric insulation is satisfied as described above, the heat dissipating plate can satisfy the product-safety known in the UL standards, the IEC standards, and others, so that a primary-side electric circuit (for example, a power source circuit) can be formed on heat dissipating plate 1013. The UL and the IEC denote the Underwriter's Laboratories Incorporated, and the International Electrotechnical Commission, respectively, and correspond to the JIS in Japan.

When heat dissipating plate 1013 is used for a secondary-side circuit, the thickness of thermally conductive composition 1006 may be set to 0.6 mm or less. Examples of the secondary-side circuit include power sources for cars, such as a DC-DC converter. The DC-DC converter is an electric power converting device for producing a DC output from a DC input.

Thermally conductive composition 1006 has the structure described in embodiment 1. Specifically, the content by percentage of inorganic filler 1009 is 66% or more by volume.

It is preferred to satisfy one or more of the following: the 20-degree glossiness of free surface 1007 is 70 or more; the surface roughness Ra thereof is 3000 Å or less or the largest height Ry thereof is 1500 Å or less; the Rmax thereof is 15000 Å or less; or free surface 1007 has a surface layer portion having a thickness of 20 μm. In this way, the glossiness is made high, the surface roughness is made small, or a thin surface layer portion is formed in the surface while the content by percentage of inorganic filler 1009 is set to 66% or more by volume, whereby thermally conductive composition 1006 can attain compatibility between thermal conductivity, and formability and others.

Metallic plate 1012 is fixed on a surface of sheet-form thermally conductive composition 1006. However, these members do not need to be limited into this form. Specifically, it is practical to embed metallic plate 1012 in thermally conductive composition 1006 having a sheet, rod or plate form. It is also practical to embed metallic plate 1012 in a surface of thermally conductive composition 1006, or embed metallic plate 1012 into thermally conductive composition 1006.

It is practical to render the metallic material used in metallic plate 1012 gold, silver, copper, nickel, aluminum, or a composite material thereof (the composite matter includes, in the category thereof, alloys, plating materials, evaporated materials, and clad materials of these metallic materials). This is because when gold, silver, copper, nickel and aluminum are used alone or they are made into the form of a composite thereof, the single metal or the composite has a characteristic useful for metallic plate 1012 of being excellent in thermal conductivity and others.

Figure 7A:
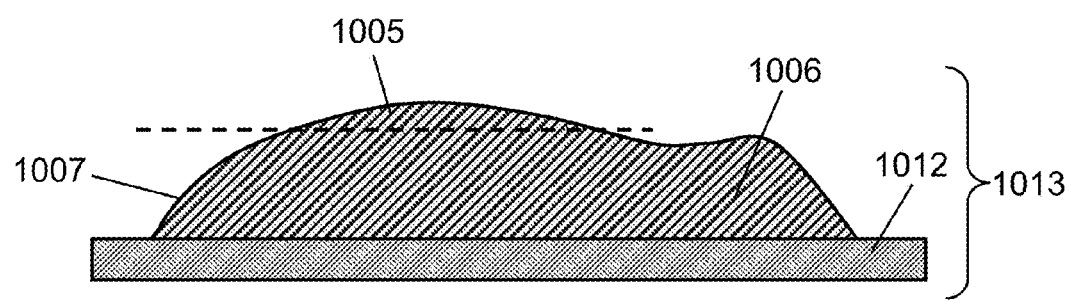
FIG. 7A is a sectional view for describing a situation of a thermally conductive composition on a heat dissipating plate according to an embodiment of the invention before the surface of the composition is partially polished.
Figure 7B:
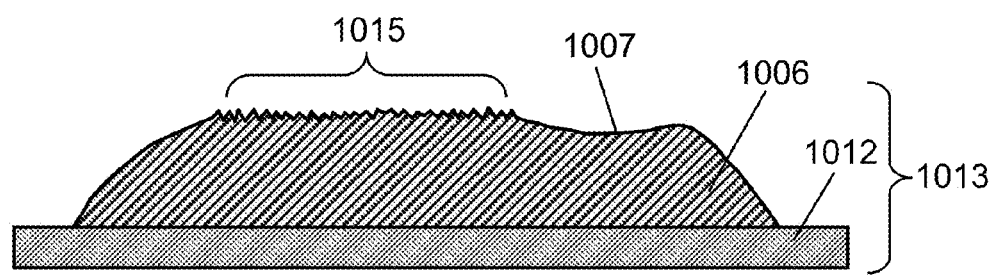
FIG. 7B is a sectional view for describing a situation of the thermally conductive composition on the heat dissipating plate according to the embodiment of the invention after the surface of the composition is partially polished.

FIGS. 7A and 7B are each a sectional view for describing a situation of polishing the surface of thermally conductive composition 1006 partially. As illustrated in FIG. 7A, when thermally conductive composition 1006 has, in free surface 1007 thereof, convex portions 1005, the convex portions may be polished or cut along a dot line to be removed, thereby forming processed surface 1015.

FIG. 7B is a sectional view for describing a situation of forming processed surface 1015 in a portion of thermally conductive composition 1006. By forming processed surface 1015 in the portion of thermally conductive composition 1006, the flatness of thermally conductive composition 1006 is increased to heighten the adhesiveness between the surface and a heat generating component to be fixed thereon. By causing free surface 1007 to remain in a partial region of processed thermally conductive composition 1006, the reliability of thermally conductive composition 1006 can be increased. In short, by causing surface layer portion 1011 to remain positively, water can be restrained from invading the interface between inorganic filler 1009 and thermosetting resin 1010, and other regions in, for example, the above-mentioned pressure cooker test.

Figure 8A:
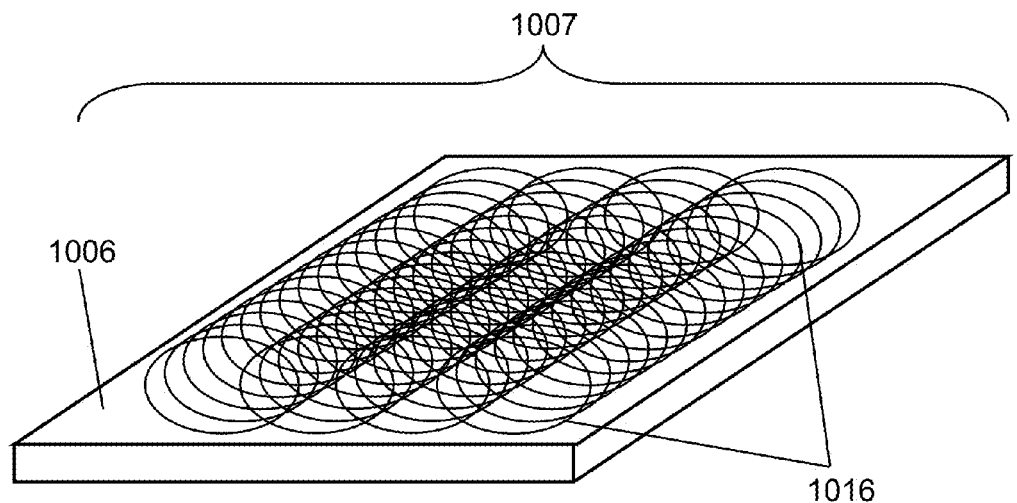
FIG. 8A is a perspective view for describing a pattern formed in a free surface of a thermally conductive composition according to an embodiment of the invention.
Figure 8B:
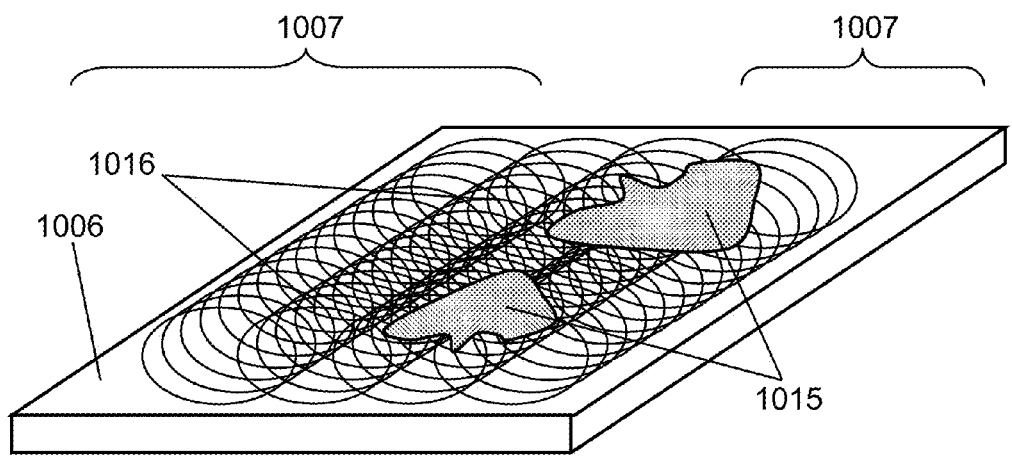
FIG. 8B is a perspective view for describing a pattern formed in a free surface of a thermally conductive composition according to an embodiment of the invention, or the surface state of the free surface.

FIGS. 8A and 8B are each a perspective view for describing a pattern formed in free surface 1007 or a surface state of free surface 1007 of thermally conductive composition 1006.

Pattern 1016 generated in free surface 1007 of thermally conductive composition 1006 is, for example, a polish trace according to a mold for the shaping (of the thermally conductive material).

It is preferred that free surface 1007 of thermally conductive composition 1006 has a beautiful gloss corresponding to a 20-degree glossiness of 70 or more, what is called, piano black. In short, free surface 1007 is an ebony smooth surface.

The color of the surface does not need to be limited to any black. The color of this example is merely black by the addition of a black pigment, such as carbon black, to thermally conductive composition 1006 by the inventors. When, for example, a red, blue or green pigment is added thereto, a glossy and smooth surface having a tone of the color is obtained. By adding a white pigment, such as alumina or titanium oxide, thereto, a white surface can be obtained which has a beautiful gloss, or a gloss as a white grand piano has. When the surface is made white in this way, the thermally conductive composition may be used as a substrate on which semiconductor light emitting elements are to be mounted, typical examples of the elements being light emitting diodes (LEDs). In this case, surface layer portion 1011 made white functions as a light reflecting plate of an LED; thus, the LED-mounted substrate may be used as a home LED light, or a head light for a car.

It is practical to make surface layer portion 1011 itself transparent; however, when surface layer portion 1011 is made white, it is advisable to add a white pigment having a smaller particle diameter than inorganic filler 1009. When surface layer portion 1011 is made black, it is advisable to add a black pigment such as carbon black. It is practical to incorporate the pigment contained in surface layer portion 1011 into thermosetting resin 1010 as well, the resin being for fixing inorganic filler 1009. As represented by the arrows in FIG. 4C, by circulating the resin, the resin, which contains the pigment, turns around into main portion 1004 as well.

As illustrated in, for example, FIG. 8A or 8B, pattern 1016 can be positively left in free surface 1007. For pattern 1016, use may be made of, for example, a processing trace in the surface of the shaping mold (for example, a polish trace according to a milling machine). In this case, patterns 1016 equal to each other can be formed in many heat dissipating plates 1013, respectively, without generating any variation. Pattern 1016 or patterns 1016 may (each) be made into a figured pattern such as floral pattern, or a pattern having a good design.

The gloss of the surface of thermally conductive composition 1006 may not be preferred dependently on the usage thereof. In such a case, the surface of thermally conductive composition 1006 may be partially polished as illustrated in FIG. 8A. Processed surface 1015 is formed by polishing free surface 1007 of thermally conductive composition 1006 which has gloss with a polishing paper sheet, a metal brush or the like. The polishing paper sheet may be a sheet having a rough mesh, for example, a mesh having a mesh number of #100 to 500. Processed surface 1015 formed in this way is gray in many cases. This appears to be because the surface roughness is increased by the polishing so that irregular reflection is easily caused.

Figure 9:
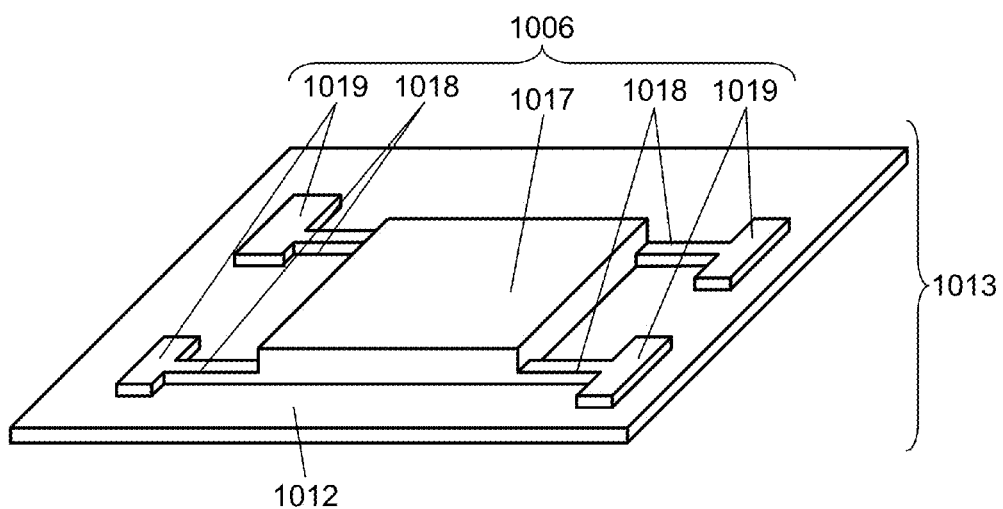
FIG. 9 is a perspective view of a heat dissipating plate according to an embodiment of the invention.

The following will describe a specific example of a heat dissipating plate with reference to FIG. 9.

FIG. 9 is a perspective view of a heat dissipating plate according to the present embodiment. Heat dissipating plate 1013 has metallic plate 1012 and thermally conductive composition 1006 arranged thereon in the same manner as in FIG. 6.

Thermally conductive composition 1006 has mounting region 1017, passage regions 1018, and protrudent regions 1019. Mounting region 1017, passage regions 1018, and protrudent regions 1019 are connected to each other through their partial regions.

The thickness of passage regions 1018 is smaller than that of mounting region 1017, and is desirably not more than ½ of the thickness of mounting region 1017. The width of passage regions 1018 is smaller than that of mounting region 1017, and is desirably 2 mm or less, more desirably 1 mm or less. In this way, the thickness or the width of passage regions 1018 is smaller than that of mounting region 1017.

Figure 10A:
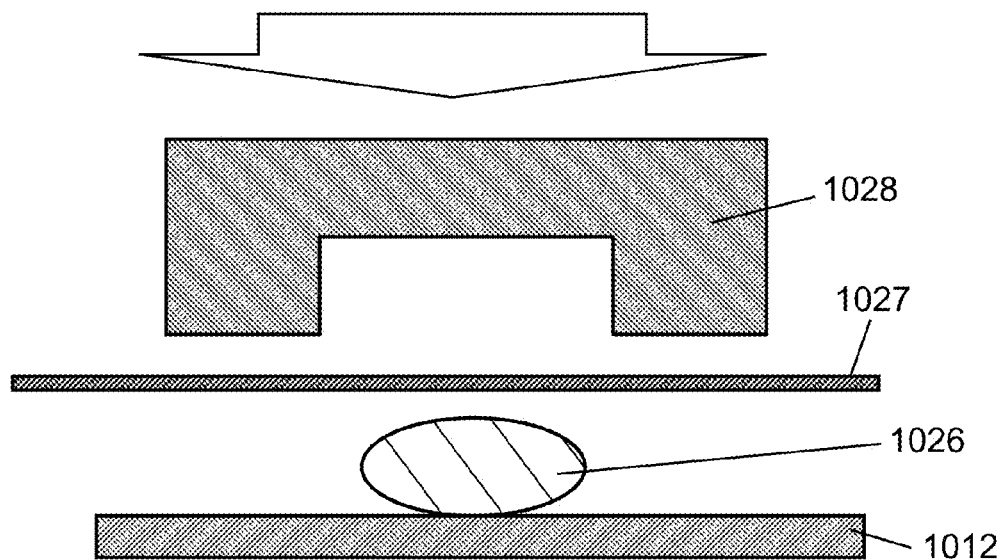
FIG. 10A is a sectional view for describing a situation that the heat dissipating plate illustrated in FIG. 9 is produced.

The following will describe an example of a process for producing heat dissipating plate 1013 illustrated in FIG. 9 with reference to FIGS. 10A to 11B. FIGS. 10A and 10B are each a sectional view for describing a situation of producing heat dissipating plate 1013.

Figure 10B:
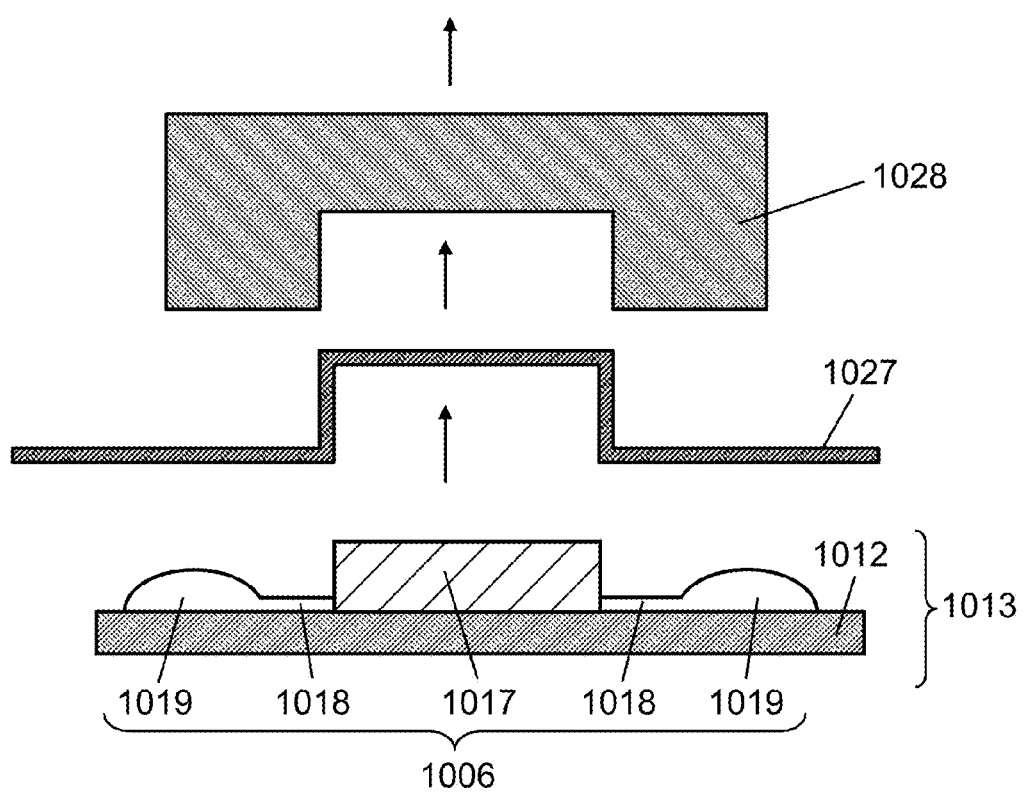
FIG. 10B is a situation that the heat dissipating plate illustrated in FIG. 9 is produced, and shows a state subsequent to that illustrated in FIG. 10A.

For mold 1028, shown is schematically its portion corresponding to, in particular, mounting region 1017 of thermally conductive composition 1006. Shown are not portions corresponding to passage regions 1018, protrudent regions 1019 or the like. Film 1027 prevents thermally conductive material 1026 from adhering, as stains, surfaces of mold 1028 and others. Film 1027 may be a commercially available PET film, or the like. FIGS. 10A and 10B neither show a press section for raising or lowering mold 1028, a heating section for heating mold 1028, nor other sections.

As illustrated in FIG. 10A, thermally conductive material 1026, which is in the state that thermally conductive composition 1006 is not cured yet, is arranged on metallic plate 1012 in a predetermined amount. Mold 1028 is then arranged over thermally conductive material 1026 to interpose film 1027 therebetween. Mold 1028 is shifted toward metallic plate 1012 as represented by an arrow, so as to shape thermally conductive material 1026 placed on metallic plate 1012. It is practical to heat mold 1028 at the shaping time.

FIG. 10B is a sectional view illustrating a situation after the shaping of thermally conductive material 1026 is ended. As represented by arrows, mold 1028 and film 1027 are removed. Thereafter, thermally conductive material 1026 is cured to produce thermally conductive composition 1006. Thermally conductive composition 1006 in a sheet form has, for example, molding region 1017, passage regions 1018, and protrudent regions 1019, and is fixed strongly on a surface of metallic plate 1012. In this way, heat dissipating plate 1013 can be formed.

As illustrated in FIG. 10B, protrudent regions 1019 and passage regions 1018 are made of an extra of thermally conductive material 1026 from mounting region 1017 when thermally conductive material 1026 is shaped (into a predetermined form).

After thermally conductive material 1026 is formed into the predetermined form by aid of mold 1028, film 1027 is peeled and then the material is put into a heating and curing furnace for a predetermined period to be cured. In this way, thermally conductive material 1026 is thermally cured to be made into thermally conductive composition 1006.

At the curing time, it is preferred that film 1027 is beforehand peeled. This manner makes it possible to turn a surface of thermally conductive composition 1006 to free surface 1007. As a result, surface layer portion 1011 can be effectively made to satisfy at least one of the following: the 20-degree glossiness of this portion is 70 or more; the surface roughness Ra is set to 3000 Å or less; the largest height Ry is set to 15000 Å or less; and the thickness is set to 20 μm or less.

Figure 11A:
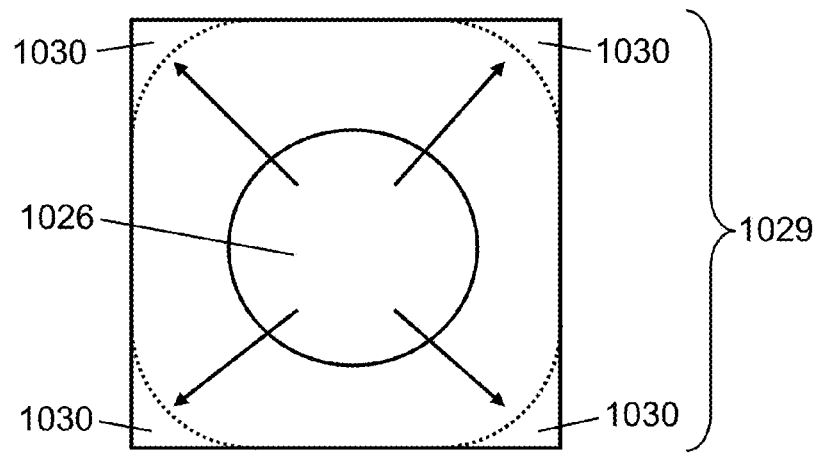
FIG. 11A is a plan view for describing a situation that a thermally conductive material set in a mold flows.
Figure 11B:
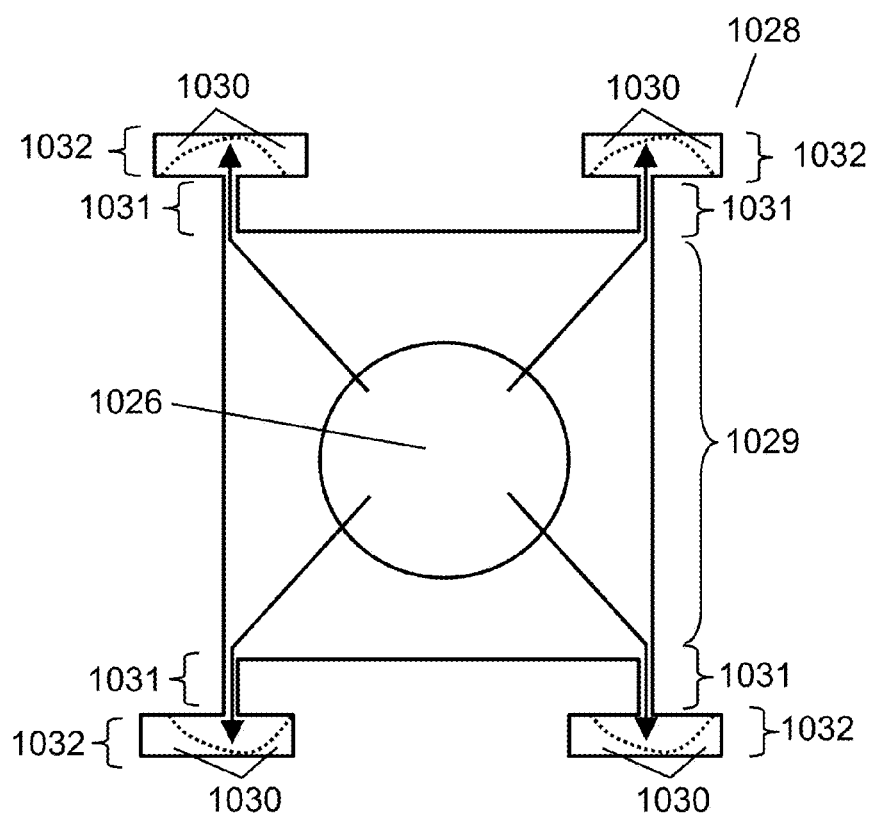
FIG. 11B is a plan view for describing another situation that the thermally conductive material set in the mold flows, and is a view for describing advantageous effect of the structure illustrated in FIG. 9.

The following will describe a situation that thermally conductive material 1026 arranged in mold 1028 is precisely shaped into the predetermined form with reference to FIGS. 11A and 11B. FIG. 11A is a plan view for describing a situation that the thermally conductive material set in the mold flows, and FIG. 11B is a plan view for describing another situation that the thermally conductive material set in the mold flows.

The mold in FIG. 11A is made only of molding-region-forming portion 1029. In the case of using this mold, thermally conductive material 1026 spreads in molding-region-forming portion 1029 as represented by arrows while the material may not turn around, for example, into four corners represented by dot lines. Thus, unfilled portions 1030 may unfavorably remain in partial portions (of the inside of the mold). When unfilled portions 1030 are generated near the periphery (of the inside) in such a way, heat dissipating plate 1013 finished may not satisfy a target property or function. For example, sheet-form thermally conductive composition 1006 does not partially satisfy a thickness of 0.6 mm, which is required for creeping distance or reinforced electric insulation. When the amount of thermally conductive material 1026 that is filled for attaining the molding one time is insufficient for a necessary amount, unfilled portions 1030 may be generated at portions near the periphery.

FIG. 11B is a plan view for describing a situation that the generation of unfilled portions 1030 is prevented in thermally conductive composition 1006. Mold 1028 has protrudent-region-forming portions 1032 around molding-region-forming portion 1029 or at the fourth corners thereof to interpose passage-region-forming portions 1031 therebetween.

Thermally conductive material 1026 arranged in molding-region-forming portion 1029 spreads as represented by arrows. Thermally conductive material 1026 is first filled into molding-region-forming portion 1029. Thereafter, an extra of thermally conductive material 1026 flows through passage-region-forming portions 1031 to protrudent-region-forming portions 1032 in turn. As a result, unfilled portions 1030 are generated in protrudent-region-forming portions 1032, but are not generated in molding-region-forming portion 1029. As a result, an improvement can be made in the dimension precision (the size precision of the XY plane, and the thickness precision in the Z direction) of, in particular, mounting region 1017 of thermally conductive composition 1006 in heat dissipating plate 1013. Unfilled portions 1030 can be generated not in molding-region-forming portion 1029, but in passage-region-forming portions 1031 or protrudent-region-forming portions 1032, so that the quality of heat dissipating plate 1013 can be enhanced.

The thickness and width of passage-region-forming portions 1031 are desirably smaller than those of molding-region-forming portion 1029, respectively. The thickness is set to, for example, 0.5 mm or less, more restrictedly 0.3 mm or less. The width is set to, for example, 1.0 mm or less, more restrictedly 0.6 mm or less. Such a manner makes it possible to increase the inflow resistance of thermally conductive material 1026 into passage-region-forming portions 1031. As a result, thermally conductive material 1026 can be spread to all corners of molding-region-forming portion 1029.

As described above, in the case of setting the thickness of passage regions 1018, which are partial regions of thermally conductive composition 1006 of heat dissipating plate 1013, and the width thereof to 0.5 mm or less, and 1.0 mm or less, respectively, the filling precision of thermally conductive material 1026 in molding-region-forming portion 1029 can be enhanced so that the quality of heat dissipating plate 1013 can be improved. Even when the charging amount (weight or volume) of thermally conductive material 1026 set to mold 1028 inevitably varies, the filling precision of thermally conductive material 1026 in molding-region-forming portion 1029 can be enhanced so that the quality of heat dissipating plate can be improved.

In FIG. 9, thermally conductive composition 1006, which constitutes heat dissipating plate 1013, is composed of molding region 1017, passage regions 1018, protrudent regions 1019, and others. It is not necessarily essential to form protrudent regions 1019 on the surface of metallic plate 1012. When the size of metallic plate 1012 is small, protrudent regions 1019 may be protruded not onto metallic plate 1012, but onto stain-preventing film 1027. In this case, protrudent regions 1019 do not remain on metallic plate 1012.

Embodiment 3

The following will describe a circuit module of an embodiment of the invention with reference to FIGS. 12 to 15.

Figure 12:
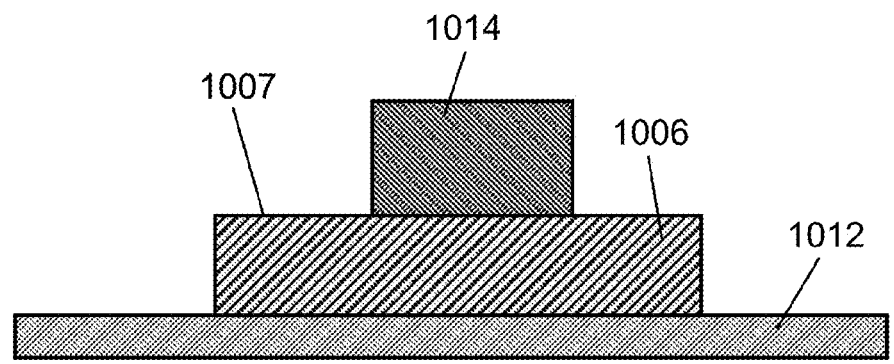
FIG. 12 is a sectional view illustrating a state that a heat generating component is fixed to the heat dissipating plate illustrated in FIG. 6.

FIG. 12 is a sectional view for describing a situation that heat generating component 1014 is fixed on heat dissipating plate 1013 described with reference to FIG. 6. Heat generating component 1014 corresponds to, for example, an electronic component such as a transformer, a coil or a choke coil, or a light emitting element such as an LED or a semiconductor laser, as well as a power semiconductor (a power transistor, a power FET, a power transistor, a high-power LED, or a high-power laser). In order to fix heat generating component 1014 onto free surface 1007 of thermally conductive composition 1006, a thermally conductive adhesive or the like may be used. As has been described with reference to FIGS. 5A and 5B, free surface 1007 may be processed to form processed surface 1015.

The surface roughness of processed surface 1015 illustrated in FIG. 5B is desirably larger than that of free surface 1007, or the glossiness of processed surface 1015 is smaller than that of free surface 1007. This manner makes it possible to increase the contact area between the surface and the thermally conductive adhesive for fixing heat generating component 1014.

Figure 13:
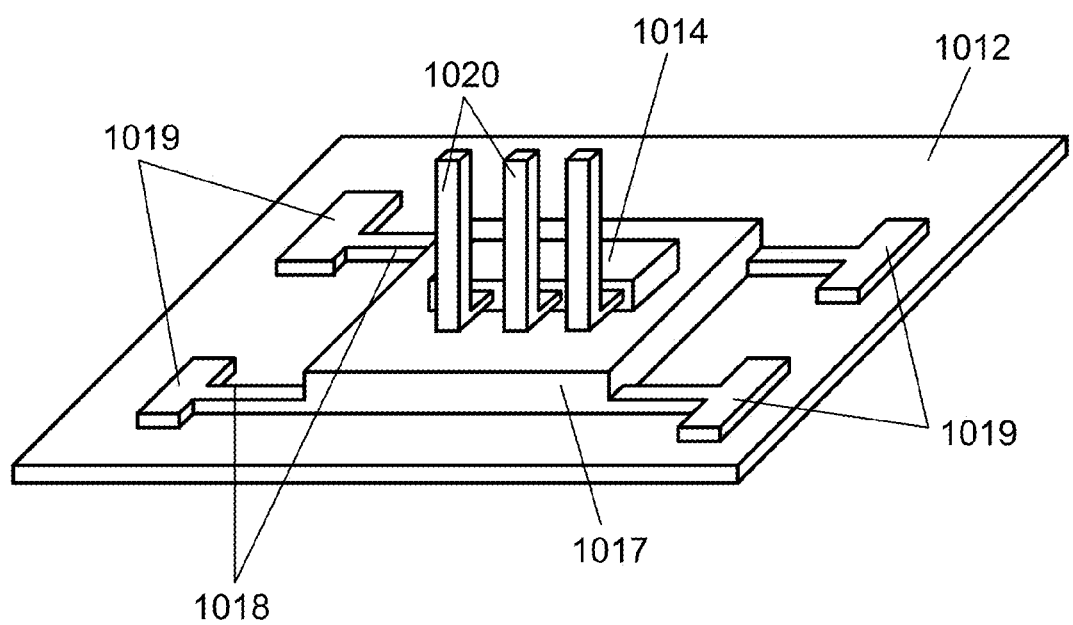
FIG. 13 is a perspective view for describing a state that the heat generating component to which lead lines are attached is mounted on the heat dissipating plate illustrated in FIG. 9.

FIG. 13 is a perspective view for describing a situation that heat generating component 1014 is mounted on heat dissipating plate 1013 illustrated in FIG. 9. Heat generating component 1014 has lead lines 1020. Lead lines 1020 are, for example, terminals (input and output terminals) of heat generating component 1014. Lead lines 1020 connect heat generating component 1014 and, for example, a circuit substrate (not illustrated).

Lead lines 1020 do not need to be projected directly from heat generating component 1014. When heat generating component 1014 is made of, for example, a set of heat generating parts, it is sufficient that lead lines 1020 are used as a wiring for connecting this set to a circuit substrate or some other circuit. In this case, lead lines 20 used are sufficient to be a lead frame, a copper plate or the like that is separately prepared.

As illustrated in FIG. 13, by use of lead lines 1020 extending from heat generating component 1014 as a partial wiring, the cost of a power source module or the like can be reduced.

Root regions of lead lines 1020 are partially in substantially parallel to heat dissipating plate 1013 and metallic plate 12, and tip regions of lead lines 1020 are bent to be substantially perpendicular to heat dissipating plate 1013 and metallic plate 1012. This is for connecting lead lines 1020 to the circuit substrate (not illustrated). It is desired that the bent regions of lead lines 1020 are inside mounting region 1017. By interposing mounting region 1017 between the bent regions of lead lines 1020 and metallic plate 1012, a short circuit can be prevented between lead lines 1020 and metallic plate 1012, and a creeping distance can be certainly kept therebetween.

Figure 14:
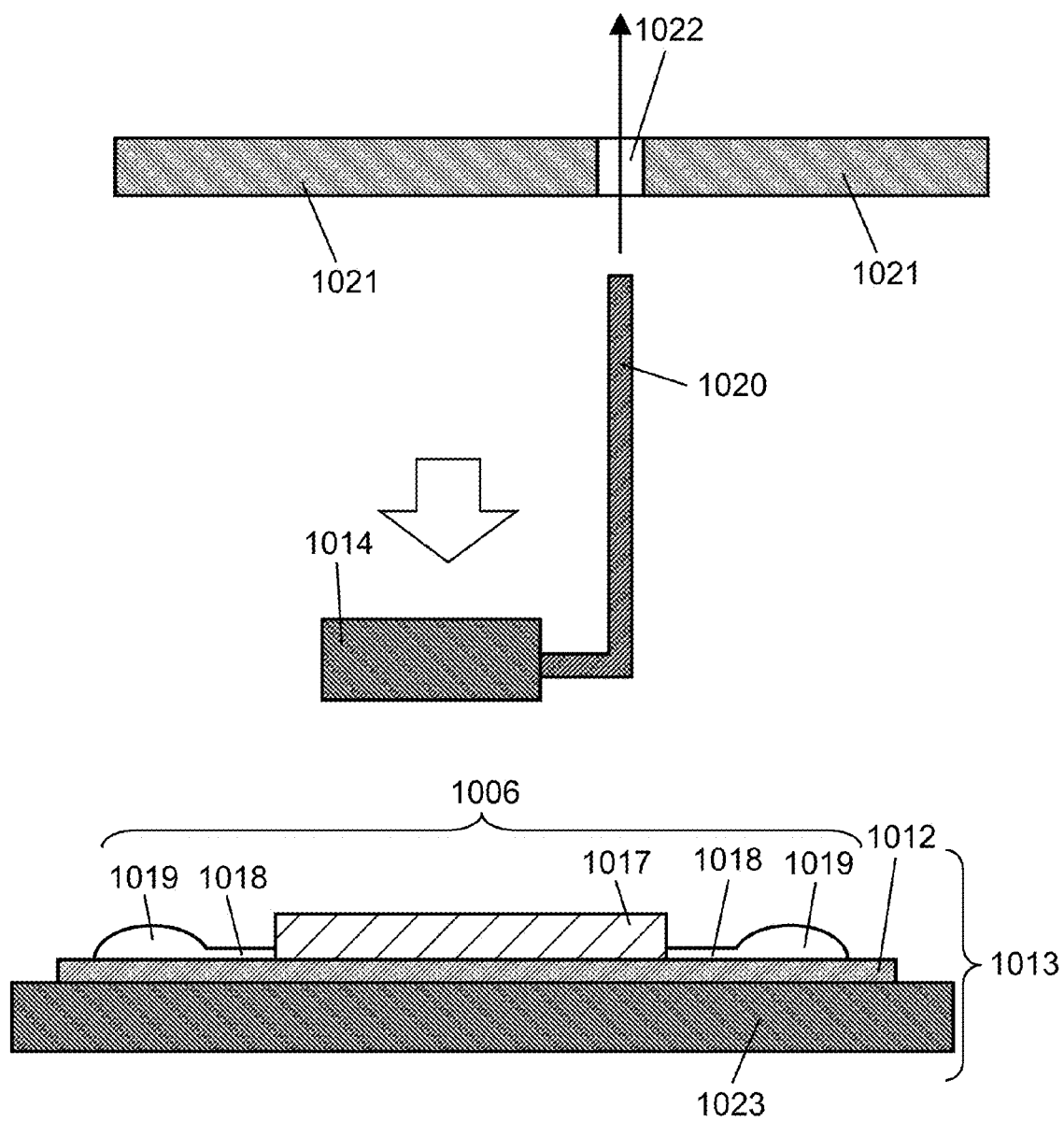
FIG. 14 is a sectional fabrication view of a circuit module formed by use of the heat dissipating plate illustrated in FIG. 9.
Figure 15:
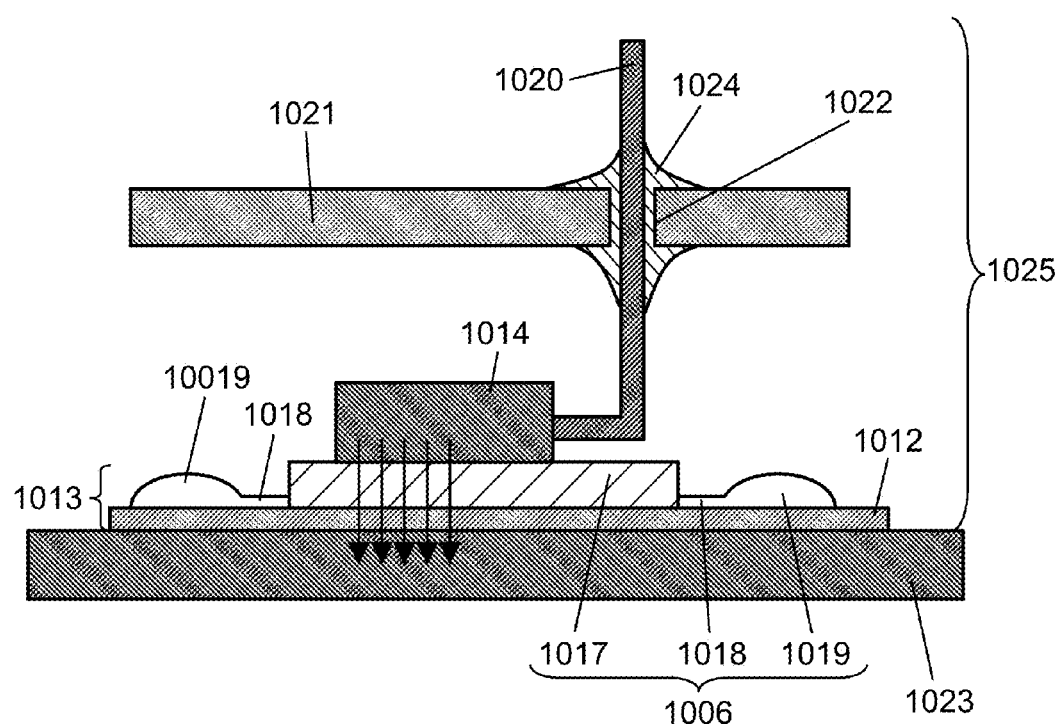
FIG. 15 is a sectional view of a circuit module composed of the heat dissipating plate illustrated in FIG. 9, the heat generating component, and a circuit substrate fixed in substantially parallel to the heat dissipating plate.

The following will describe steps of fabricating this circuit module with reference to FIGS. 14 and 15. FIG. 14 is a sectional fabrication view of the circuit module, which is formed by use of heat dissipating plate 1013 illustrated in FIG. 9. FIG. 15 is a sectional view of the circuit module, which is composed of heat dissipating plate 1013 illustrated in FIG. 9, heat generating component 1014, and circuit substrate 1021 fixed in substantially parallel to heat dissipating plate 1013.

Circuit substrate 1021 is made of, for example, glass impregnated with an epoxy resin. Hole 1022 penetrates through circuit substrate 1021. Hole 1022 may be a component called a through hole. In this case, the inside of the through hole may be subjected to through hole plating, thereby making the electric connectivity thereof with a conductive pattern formed on a front surface layer or an inside layer of circuit substrate 1021. In circuit substrate 1021, the conductive pattern, the through hole plating and others are not illustrated.

As illustrated in FIG. 14, heat generating component 1014 having lead lines 1020 is fixed onto heat dissipating plate 1013, and then lead lines 1020 are inserted into hole 1022 made in circuit substrate 1021.

As illustrated in FIG. 15, solder 1024 is used to connect lead lines 1020 with circuit substrate 1021. In this way, circuit module 1025 is fabricated. Separately, metallic plate 1012 is fixed onto chassis 1023. Solder 1024 may be lead-free solder, conductive paste or the like.

Circuit module 1025 is composed of at least heat dissipating plate 1013, heat generating component 1014 fixed thereon, and circuit substrate 1021 fixed in substantially parallel to heat dissipating plate 1013. As represented by arrows, heat generated in heat generating component 1014 is conducted to heat dissipating plate 1013, and further diffuse to chassis 1023. This manner makes it possible to cool heat generating component 1014.

Chassis 1023 is, for example, a chassis of an instrument, such as a chassis or frame of a plasma TV or liquid crystal TV. It is desired to mount a semiconductor, a chip component or the like (not illustrated) for controlling heat generating component 1014 onto circuit substrate 1021.

In this way, heat generating component 1014, for which heat dissipation is required, is fixed on mounting region 1017 of heat dissipating plate 1013. This arrangement makes it possible to dissipate heat generated in heat generating component 1014 to chassis 1023 to cause the heat not to be easily conducted to circuit substrate 1021.

It is preferred that heat generating component 1014 and circuit substrate 1021 for controlling heat generating component 1014 are connected to each other through lead lines 1020, which are partially bent substantially perpendicularly. This structure makes it possible to connect heat generating component 1014 and circuit substrate 1021 to each other at the shortest distance therebetween. As a result, noise resistance of circuit module 1025 can be increased to stabilize the operation of the circuit. By making heat dissipating plate 1013 and circuit substrate 1021 in parallel to each other, circuit module 1025 can be low in height (or thin) to supply a thin device or instrument.

Circuit module 1025 is a circuit for which heat generation becomes a problem. Examples thereof include a power supply circuit (including, in the category thereof, a sustain circuit) of a PDP television, a DC-DC converter for a hybrid car, and a DC-AC converter for a solar cell. The DC-AC converter converts direct current to alternating current.

Embodiment 4

Figure 16:
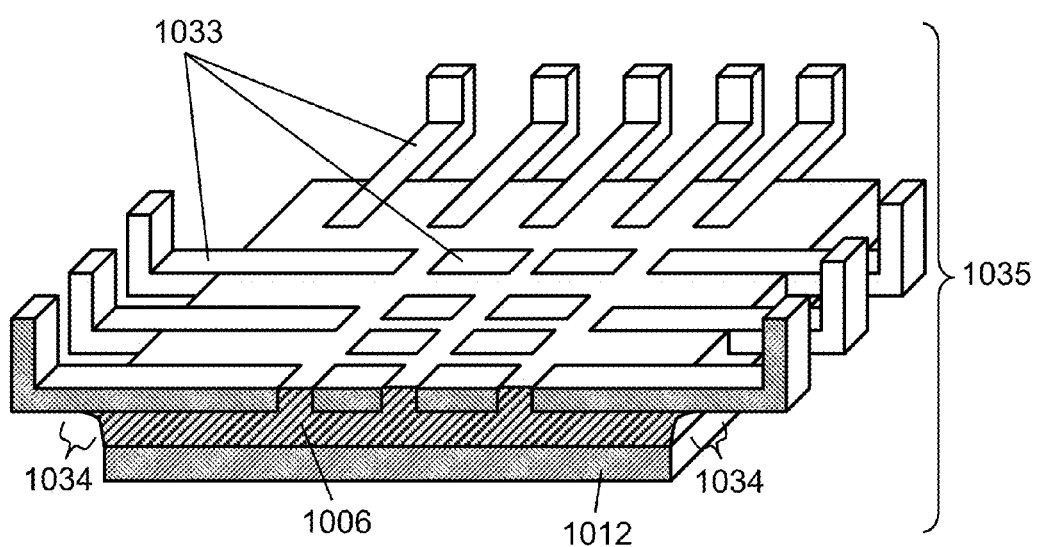
FIG. 16 is a cutaway perspective view of a heat dissipating substrate according to an embodiment of the invention.

The following will describe a heat dissipating substrate and a circuit module in an embodiment of the invention with reference to FIGS. 16 to 19. FIG. 16 is a cutaway perspective view of the heat dissipating substrate according to the present embodiment.

Heat dissipating substrate 1035 has metallic plate 1012, thermally conductive composition 1006 in a sheet form, and wiring pattern 1033. Thermally conductive composition 1006 is fixed on metallic plate 1012, and wiring pattern 1033 is fixed on metallic plate 1012 to interpose thermally conductive composition 1006 therebetween. Wiring pattern 1033 is formed by processing, for example, a lead frame or a copper foil piece into a predetermined form (or into a predetermined wiring pattern form). Fillet 1034 is made of a portion of thermally conductive composition 1006.

By bending wiring pattern 1033 partially into a substantially perpendicular direction, the pattern can be inserted into separately prepared circuit substrate 1021 (not illustrated). By forming fillet 1034 in the lower surface of wiring pattern 1033, the electric non-conductance between metallic plate 1012 and wiring pattern 1033 can be improved and the creeping distance therebetween can be increased. When thermally conductive composition 1006 is partially extended to the lower surface of wiring pattern 1033, it is preferred not to extend the composition up to the bent region of wiring pattern 1033. This manner makes it possible to prevent fillet 1034 from chipping or dropping down when wiring pattern 1033 is bent.

For wiring pattern 1033, either a copper foil piece or a lead frame may be used in accordance with the usage of the heat dissipating substrate. When the thickness of wiring pattern 1033 needs to range from 0.002 to 0.10 mm, and range from 0.10 to 1.00 mm, respectively, it is advisable to use a copper foil piece and a lead frame, respectively. The matter for the lead frame is desirably a matter made mainly of copper, and may be, for example, a matter called tough pitch copper or oxygen-free copper. When the matter is made mainly of copper, the matter can attain compatibility between high heat dissipating performance and low resistance. When wiring pattern 1033 is partially or wholly embedded in thermally conductive composition 1006, a step height or difference in level (thickness difference) resulting from wiring pattern 1033 in the heat dissipating plate can be decreased.

For heat dissipating substrate 1035, metallic plate 1012 is fixed on one of two surfaces of thermally conductive composition 1006 and wiring pattern 1033 is fixed on the other in such a manner that their front surfaces are uncovered. Thus, it appears that impact is easily conducted and the impact is easily concentrated into these interfaces. This is because merely one or more partial regions (for example, the lower surface, or right and left side surfaces) of the lead frame constituting wiring pattern 1033 are covered with thermally conductive composition 1006.

Thermally conductive composition 1006 may be applied to a semiconductor package. In the semiconductor package, wiring pattern 1033, and the whole (the upper and lower, and the right and left side faces) of metallic plate 1012 are covered with thermally conductive composition 1006. Thus, for wiring pattern 1033 made of metallic plate 1012, the lead frame or the like, the whole thereof together with semiconductor chips are covered with thermally conductive material 1026. Accordingly, at the time of subjecting the package to an impact resistance test, the package would be structurally advantageous (against impact).

Figure 17A:
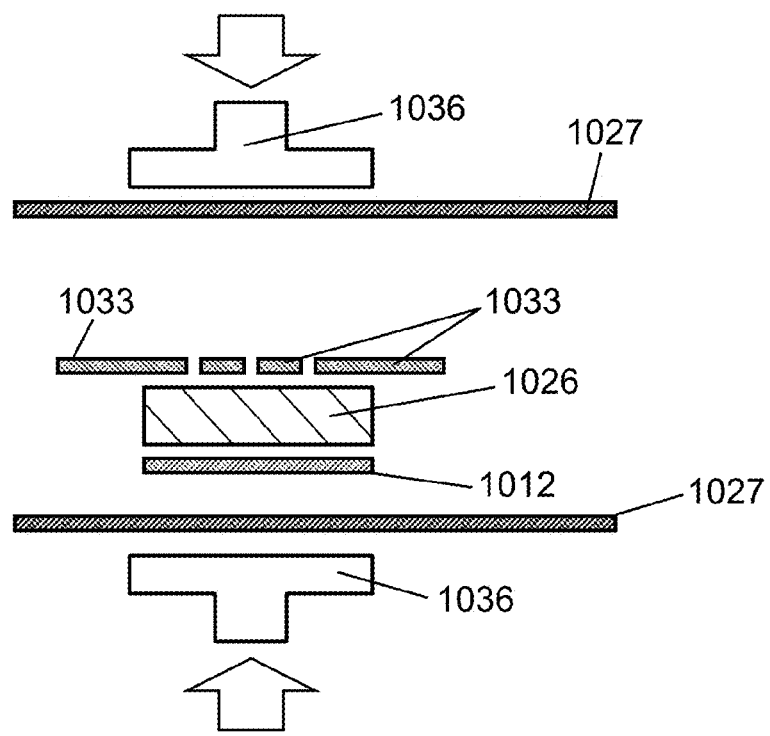
FIG. 17A is a sectional view for describing an example of the producing process of the heat dissipating substrate illustrated in FIG. 16.
Figure 17B:
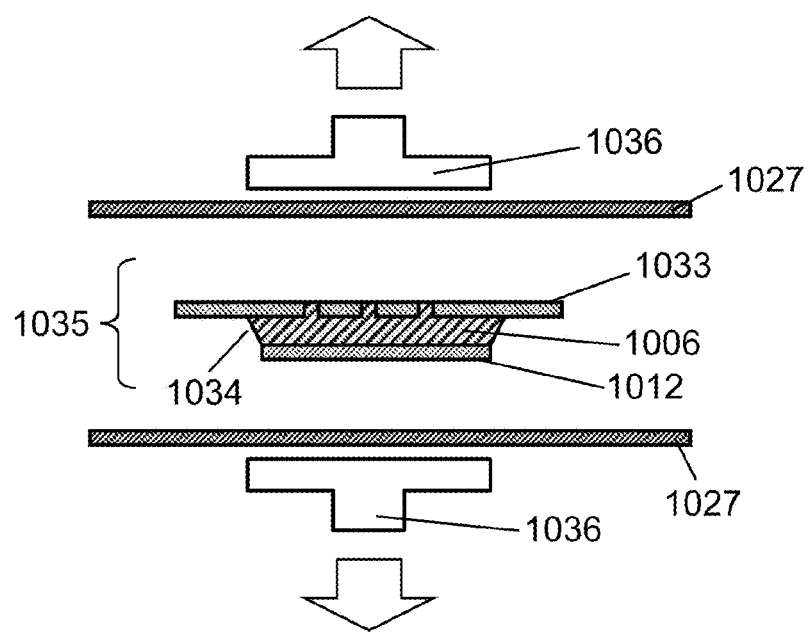
FIG. 17B is a sectional view for describing the example of the producing process of the heat dissipating substrate illustrated in FIG. 16, and illustrates a state subsequent to that illustrated in FIG. 17A.

The following will describe an example of a process for producing heat dissipating substrate 1035 with reference to FIGS. 17A and 17B. FIGS. 17A and 17B are each a sectional view for describing the example of the producing process of heat dissipating substrate 1035. A mold and others are not illustrated.

Wiring pattern 1033 is formed by processing a lead frame or copper foil piece made of, for example, tough pitch copper, or some other member into a predetermined form (or into a predetermined wiring pattern form). As illustrated in FIG. 17A, film 1027, metallic plate 1012, thermally conductive material 1026, wiring pattern 1033, and film 1027 are, in this order, put into a laminate form. Press 1036 is used to press this laminate under pressure. After the shaping of the laminate into the predetermined shape by press 1036, films 1027 are peeled and then thermally conductive material 1026 is put into a heating and curing furnace for a predetermined period. In this way, thermally conductive material 1026 is thermally cured to be turned into thermally conductive composition 1006. At the thermal curing time, it is preferred to peel films 1027. This is based on the above-mentioned reason.

Figure 18A:
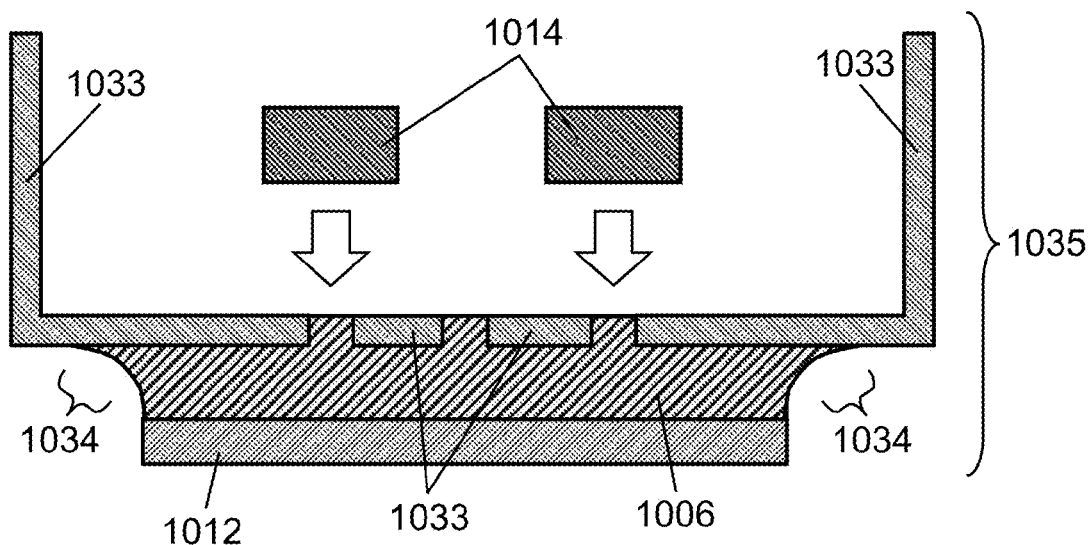
FIG. 18A is a sectional view for describing a heat dissipating mechanism of a wiring-pattern-embedded heat dissipating substrate according to an embodiment of the invention.
Figure 18B:
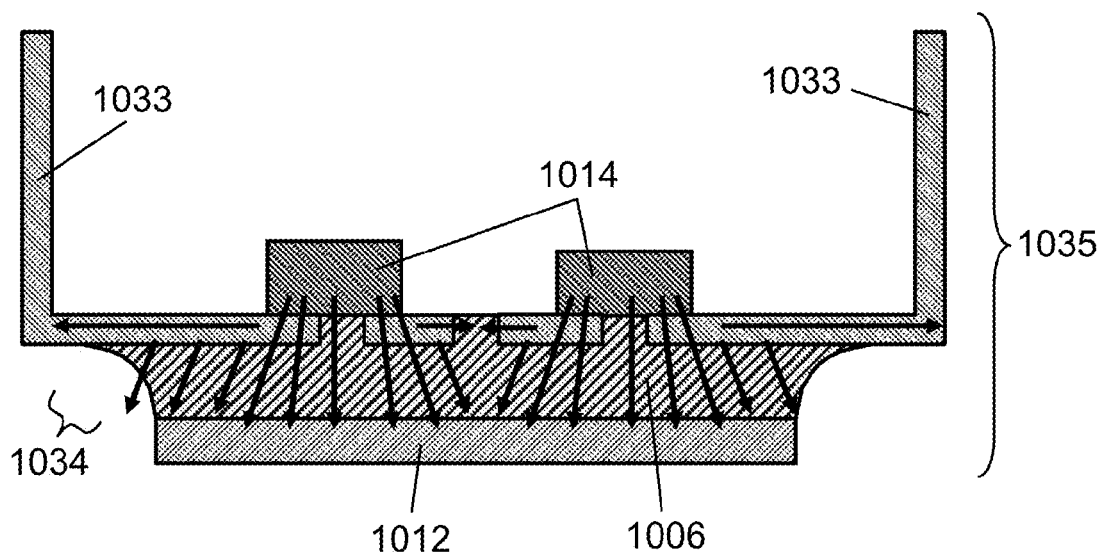
FIG. 18B is a sectional view for describing the heat dissipating mechanism of the wiring-pattern-embedded heat dissipating substrate according to the embodiment of the invention.

The following will describe the heat dissipating mechanism of heat dissipating substrate 1035 illustrated in FIG. 16 with reference to FIGS. 18A and 18B. FIGS. 18A and 18B are each a sectional view for describing the heat dissipating mechanism of heat dissipating substrate 1035 in which wiring pattern 1033 is embedded. Heat generating components 1014 are semiconductors (such as power transistors or power FETs), from which heat is generated, light emitting diodes (LEDs), or others.

External terminals of heat generating components 1014, and others are not illustrated. A solder resist formed on wiring pattern 1033 is not illustrated, either. It is desired that the solder resist is formed on wiring pattern 1033. When the solder resist is formed on wiring pattern 1033, a solder for mounting can be prevented from spreading excessively on the front surface of wiring pattern 1033.

Not illustrated are mounting regions for heat generating component 1014 and wiring pattern 1033, such as solder (regions), bonding wires, and surface-mounting bumps.

Wiring pattern 1033 is partially or wholly embedded in sheet form thermally conductive composition 1006, and further fixed on the front surface of metallic plate 1012. A single surface of wiring pattern 1033 is naked from thermally conductive composition 1006. As illustrated in FIG. 18A, heat generating component 1014 is first mount on the naked surface of wiring pattern 1033, which is partially or wholly embedded in thermally conductive composition 1006.

When heat generating component 1014 is mounted in this way, heat generated in heat generating component 1014 spreads (heat-spreads) through wiring pattern 1033 into a wide area as represented by arrows in FIG. 18B. The heat conducted to wiring pattern 1033 is conducted to thermally conductive composition 1006, in which wiring pattern 1033 is partially or wholly embedded. The heat conducted to thermally conductive composition 1006 is conducted to metallic plate 1012. In this way, heat generating component 1014 can be cooled. By fixing metallic plate 1012 onto chassis 1023 or housing (not illustrated) of the instrument, the heat conducted to metallic plate 1012 can be conducted to the outside.

By embedding wiring pattern 1033 in thermally conductive composition 1006, the contact area between wiring pattern 1033 and thermally conductive composition 1006 can be increased to enhance the heat dissipating performance (of heat dissipating substrate 1035). By the embedding, the thickness of wiring pattern 1033, which projects from the surface of thermally conductive composition 1006, can also be small.

Even when a lead frame having a wall thickness of, for example, 0.3 mm is used, the embedding of wiring pattern 1033 into thermally conductive composition 1006 in this way permits the project amount (or step height) of wiring pattern 1033 from thermally conductive composition 1006 to be restrained into 50 µm or less, desirably 20 µm or less, more restrictedly 10 µm or less. When the projection amount is restrained in this way, a solder resist is easily formed on wiring pattern 1033 so that the film thickness of the solder resist can be made even and thin. Thus, the heat dissipating performance of heat dissipating substrate 1035 can be enhanced.

When heat generating component 1014 is cooled in this way, the efficiency of heat generating component 1014 is improved so that the lifespan and the reliability thereof can be increased. In the case of, for example, an LED, the quantity of light therefrom increases. Alternatively, the efficiency of a power supply circuit therefor is improved, or the LED can be made small.

The embedding of wiring pattern 1033 partially or wholly into thermally conductive composition 1006 heightens the connection strength between wiring pattern 1033 and thermally conductive composition 1006. The tensile strength of wiring pattern 1033 can be heightened. For a method for measuring the tensile strength, it is advisable to refer to a method for evaluating the tensile strength of copper foil in a printed wiring board, and others.

Figure 19:
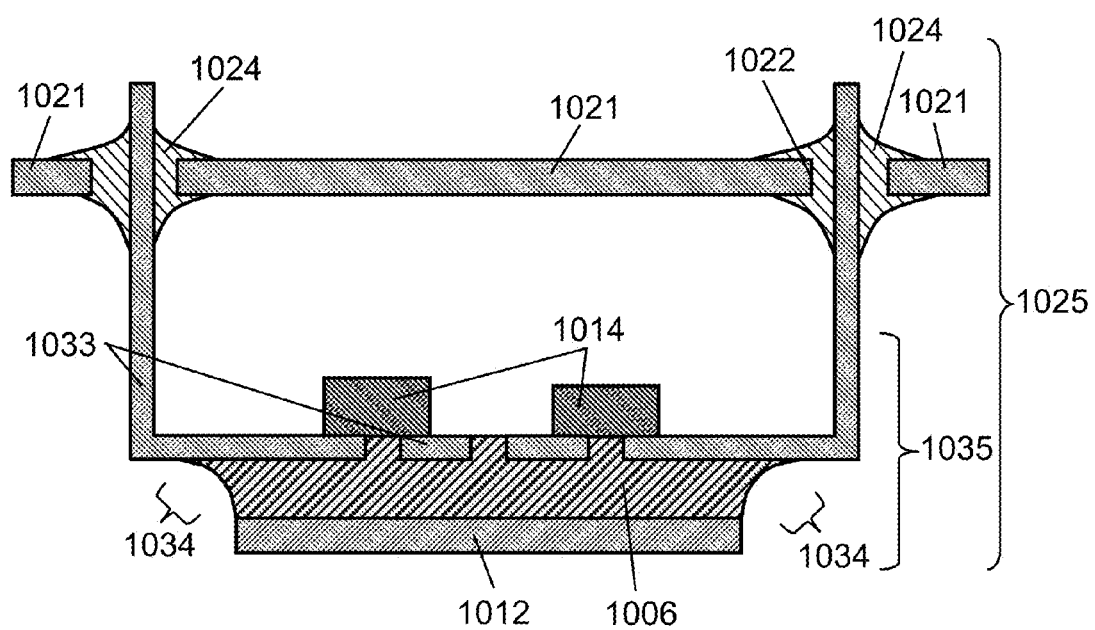
FIG. 19 is a sectional view of a circuit module according to an embodiment of the invention.

The following will briefly describe circuit module 1025 formed by combining heat dissipating substrate 1035 with circuit substrate 1021 with reference to FIG. 19. FIG. 19 is a sectional view of circuit module 1025. Circuit module 1025 is composed of heat dissipating substrate 1035 formed by use of thermally conductive composition 1006, and circuit substrate 1021 fixed in substantially parallel to heat dissipating substrate 1035.

Wiring pattern 1033 constituting heat dissipating substrate 1035 is partially bent into a substantially perpendicular direction, inserted into hole 1022 made in circuit substrate 1021, and then fixed with solder 1024. Lead lines arranged in heat generating component 1014 may be mounted directly onto circuit substrate 1021 as illustrated in FIG. 15.

In heat dissipating plates 1013 and heat dissipating substrates 1035 formed as described in embodiments 2 to 4, a warp or swell which follows the thermal curing of thermally conductive material 1026 is hardly generated. The warp or swell is caused by, for example, a difference in thermal expansion coefficient between metallic plate 1012 and thermally conductive material 1026. However, for example, in a 100-mm square, a warp of 50 µm or less is generated. This would be because internal stress can be decreased or inorganic filler 1009 can be filled at a high density by the above-mentioned void-extinguishing mechanism.

On the surface of thermally conductive composition 1006, which has been cured, the composition being laid on heat dissipating plate 1013, surface layer portion 1011 is formed which is made of thermosetting resin 1010 exuding from gaps of pieces of inorganic filler 1009. It is practical that surface layer portion 1011 is present not only on free surface 1007 but also at the interface between thermally conductive composition 1006 and wiring pattern 1033, which is a wiring fixed thereon. When a copper foil piece having a roughened surface is rendered wiring pattern 1033, it is also practical that surface layer portion 1011 is present at the interface between this roughened surface and thermally conductive composition 1006.

When a copper foil piece having a roughened surface, or the like is fixed as a wiring on thermally conductive material 1026 and then thermally conductive material 1026 is cured to be integrated with the copper foil piece, it is desired that surface layer portion 1011 is formed at the interface between the copper foil piece and thermally conductive composition 1006, which has been cured. When the copper foil piece is partially removed by etching or the like, surface layer portion 1011, with which the copper foil piece is fixed, remains as it is on the surface of thermally conductive composition 1006. To the surface of surface layer portion 1011 that is naked as an outermost surface in this way, the surface form of the copper foil piece or that of the roughened surface made in the copper foil piece is transferred, as it is, like the formation of a replica. In this case also, surface layer portion 1011 enhances the reliability of thermally conductive composition 1006.

EXAMPLES

Hereinafter, descriptions will be made about specific examples of thermally conductive composition 1006, advantageous effects thereof, and others.

First, a description is made about an example of thermally conductive composition 1006 and heat dissipating substrate 1035 excellent in both of high thermal conductivity and high impact resistance.

Thermally conductive material 1026 used in this example is composed of main agent 503, curing agent 504, and inorganic filler 1009. 40 or 50% by volume of main agent 503 is a crystalline epoxy monomer, and the rest thereof is an amorphous epoxy monomer. A thermoplastic resin is added in an amount of 0.3 to 6.0 parts by volume relative to the total of main agent 503 and curing agent 504. In thermally conductive material 1026, inorganic filler 1009 is contained in an amount of 70% or 88% by volume thereof.

As crystalline epoxy monomer 501, a commercially available biphenyl type epoxy resin was used. Specifically, the resin monomer was a monomer of the general formula (1) wherein X is a single bond, and R1, R2, R3 and R4 are each H. As the amorphous epoxy monomer, use was made of a monomer of the general formula (1) wherein X is a single bond, R1 and R3 are each $CH_3$, and R2 and R4 are each H. The epoxy equivalent was set to a value of 170 to 180. This manner makes it possible to lower the melting viscosity (of the composition) so that the formability is enhanced.

As curing agent 504, a commercially available diamine type agent was used. Specifically, use was made of a mixture of 4,4'-diaminobiphenyl and 4,4'-dihydroxybiphenyl ether of the formulae (2). The use of plural species for the curing agent increases the operability. As the thermoplastic resin, use was made of a commercially available acrylic copolymer having a core shell structure (in particular, partially-crosslinked acrylic fine particles). As inorganic filler 1009, use was made of a commercially available alumina powder having an average particle diameter of 12 μm.

These materials were mixed with a commercially available imidazole type curing promoter (of, for example, an adapting type), and the mixture was stirred. The mixture was heated to a temperature at which main agent 503 and curing agent 504 were melt, and then a biaxial kneader was used to mix the individual components to prepare thermally conductive material 1026. Furthermore, thermally conductive material 1026 was shaped into shapes adaptable to various tests. The resultants were cured at 180° C. for 5 hours to produce each sample of thermally conductive composition 1006.

The following will describe an example of results obtained by evaluating the impact resistance (of thermally conductive composition 1006) with reference to Table 1.

Samples for a drop test (out of the samples) were each formed to have a shape of 100 mm×100 mm×1.6 mm, and then the sample was freely fallen from a height of 1.5 m onto a concrete. The result was determined on the basis of whether or not the samples were each cracked or flawed. The samples, about which this drop test was made, were samples of thermally conductive composition 1006 wherein the proportion of crystalline epoxy monomer 501 in main agent 503, the amount of inorganic filler 1009, and the proportion of the thermoplastic resin were varied.

Table 1 shows the composition of each of the samples of thermally conductive composition 1006, and the impact resistance test result thereof. For the crystalline epoxy resin, each percentage by volume of the resin in thermosetting resin 1010 is shown. The result was evaluated on the basis of whether or not the sample was peeled or cracked.

TABLE 1

| Crystalline epoxy (% by volume in main agent) | 40 | 40 | 50 | 50 | 40 | 40 | 50 | 50 |
|---|---|---|---|---|---|---|---|---|
| Inorganic filler (% by volume) | 70 | 70 | 70 | 70 | 88 | 88 | 88 | 88 |
| Thermoplastic resin (part by volume) | 0.1 | 0.3 | 0.1 | 0.3 | 0.1 | 0.3 | 0.1 | 0.3 |
| Evaluation | OK | OK | OK | OK | NG | OK | NG | OK |

It is understood from Table 1 that as the proportion of the crystalline epoxy resin or inorganic filler 1009 is larger, thermally conductive composition 1006 tends to be more easily cracked. It is also understood that the impact resistance is improved by the addition of the thermoplastic resin. However, the thermal conductivity lowers.

It is understood from Table 1 that the impact resistance is improved by the addition of 0.3 part or more by volume of the thermoplastic resin for 100 parts by volume of curable resin component 505.

For heat dissipating plate 1013 obtained by attaching thermally conductive material 1026 onto a single surface of each metallic plate 1012 and then curing the material, the same experiment for examining the impact resistance thereof was made. However, neither peel nor crack was observed. Metallic plates 1012 used in this experiment were an aluminum plate and a copper plate, each of which had a size of 100 mm×100 mm×1.6 mm. This result appears to be based on a matter that the added thermoplastic resin component functioned as an impact absorbent.

The following will describe an example of evaluation results of the thermal conductivity (of the thermally conductive composition) with reference to Table 2.

Thermal conductivity-measuring samples (out of the samples) were each formed into the form of a disc having a diameter of ½ inch and a thickness of 1 mm, and a xenon laser flash manufactured by Bruker AXS, Inc. was used to measure the thermal conductivity.

Blending conditions of the samples were rendered conditions for making the thermal conductivity large, that is, conditions that the amount of the crystalline epoxy resin was large and that of the inorganic filler was large. The proportion of the thermoplastic resin was varied. Table 2 shows the composition of each of the samples, and the measurement result thereof.

TABLE 2

| | | | | | | | | | |
|---|---|---|---|---|---|---|---|---|---|
| Crystalline epoxy (% by volume in main agent) | 50 | 50 | 50 | 50 | 50 | 50 | 50 | 50 | 50 |
| Inorganic filler (% by volume) | 88 | 88 | 88 | 88 | 88 | 88 | 88 | 88 | 88 |
| Thermoplastic resin (part by volume) | 0.3 | 0.5 | 1.0 | 1.5 | 2.0 | 3.0 | 4.0 | 5.0 | 6.0 |
| Thermal conductivity (W/mK) | 12.3 | 12.1 | 11.0 | 11.3 | 9.9 | 8.8 | 8.1 | 8.0 | 4.9 |

When the thermoplastic resin is added, the thermal conductivity lowers. When 5.0 parts or more by volume thereof is added, thermosetting resin 1010 becomes unable to keep crystallinity so that the thermal conductivity lowers extremely.

For comparison, a commercially available thermally conductive material was evaluated. The commercially available thermally conductive material is, for example, a material used for the package-formation of a commercially available semiconductor package. The material is used in, for example, a product in which one or more semiconductors mounted on a lead frame are packaged with a thermally conductive resin. Such a thermally conductive material is prepared by the addition of a filler into, for example, an epoxy resin in order to enhance the thermal conductivity.

When the commercially available thermally conductive material was used to make the same experiment, a relatively high thermal conductivity was obtained. However, in impact tests (the drop test and others) made in the state that the material was bonded onto metallic plate 1012, a target impact resistance was not easily obtained, and in some of the samples, the material was peeled from metallic plate 1012.

In the case of any commercially available thermally conductive material, a predetermined impact resistance can be satisfied when the material is applied to a small and light semiconductor package in the form of a square each side of which is from several millimeters to 20 mm in length. However, a predetermined impact resistance is not easily satisfied when the material is applied to a large and relatively heavy semiconductor package in the form of a square each side of which is from 100 to 300 mm in length.

The following will describe thermally conductive composition 1006 and heat dissipating substrate 1035 excellent in both of high thermal conductivity and high flame retardancy.

Thermally conductive material 1026 used in this example is composed of main agent 503, curing agent 504, a flame retardant epoxy monomer, inorganic filler 1009, and a flame retardant aid filler. Main agent 503 contains 50% by volume of a crystalline epoxy monomer, and an amorphous epoxy monomer as the rest. The flame retardant epoxy monomer is added in an amount of 3 parts or more by volume and 21 parts or less by volume relative to curable resin component 505. In thermally conductive material 1026, inorganic filler 1009 is contained in a proportion of 88% by volume thereof. The flame retardant aid filler is contained in an amount of 0.6 part or more by volume and 4.0 parts or less by volume relative to curable resin component 505. A description is made about results obtained by making an experiment for thermally conductive material 1026 of the composition.

The respective materials of crystalline epoxy monomer 501, amorphous epoxy monomer 502, curing agent 504, and inorganic filler 1009 were the same as described above. As the flame retardant epoxy monomer and the inorganic filler flame retardant aid filler, a commercially available brominated epoxy, and antimony trioxide were used, respectively.

These materials and the above-mentioned imidazole were mixed with each other, and the mixture was stirred. The mixture was heated up to a temperature at which the epoxy monomers and curing agent 504 were melt, and then a biaxial kneader was used to mix the individual components. After the mixing, the mixture was shaped into shapes adaptable to various tests. The resultants were cured at 180° C. for 5 hours to produce each sample of thermally conductive composition 1006.

With reference to Table 3, the following will describe an example wherein the flame retardancy thereof was evaluated.

For a flame retardancy test, samples 1 and samples 2 (out of the samples) were produced. Samples 1 each had a size of 125±5 mm×13±0.5 mm×1.6 mm, and samples 2 each had a size of 125±5 mm×13±0.5 mm×0.4 mm. For these samples, a flame retardancy test based on the standard of UL94 was made. Specifically, flame was caused to contact each of the samples for 10 seconds, and then the flame was separated therefrom. The time (t1) until the flame subsided was measured. After the flame subsided, flame was caused to contact the sample for 10 seconds, and the flame was separated therefrom. The time (t2) until the flame subsided was measured.

The above-mentioned test was made by use of samples 1 and 2 of thermally conductive composition 1006 wherein the proportion of the flame retardant epoxy and that of the flame retardant aid filler were varied under a condition that the amount of the crystalline epoxy resin, which is easily burned, was large and that of inorganic filler 1009 was small. Specifically, as shown in Table 3, the addition amount of the flame retardant epoxy monomer was set to 1 part or more by volume and 3 parts or less by volume, and that of the flame retardant aid filler was set to 0.2 part or more by volume and 0.6 part or less by volume.

TABLE 3

| | | | | | | | | | |
|---|---|---|---|---|---|---|---|---|---|
| Crystalline epoxy (% by volume in main agent) | 50 | 50 | 50 | 50 | 50 | 50 | 50 | 50 | 50 |
| Inorganic filler (% by volume) | 70 | 70 | 70 | 70 | 70 | 70 | 70 | 70 | 70 |

TABLE 3-continued

| Flame retardant epoxy (part(s) by volume) | 1 | 1 | 1 | 2 | 2 | 2 | 3 | 3 | 3 |
|---|---|---|---|---|---|---|---|---|---|
| Flame retardant aid filler (parts by volume) | 0.2 | 0.4 | 0.6 | 0.2 | 0.4 | 0.6 | 0.2 | 0.4 | 0.6 |
| Result 1 (t1 + t2) | >10 | >10 | >10 | >10 | >10 | 9 | 8 | 8 | 2 |
| Result 2 (t1 + t2) | >10 | >10 | >10 | >10 | >10 | >10 | >10 | >10 | 4 |

As shown in Table 3, it is understood that the flame retardancy is improved by adding the flame retardant epoxy and the flame retardant aid filler. It is understood that the composition can gain flame retardancy by the addition of 3 parts by volume of the flame retardant epoxy and 0.6 part by volume of the flame retardant aid filler. Accordingly, in order that the composition can gain flame retardancy, it is necessary to add thereto 3 parts or more by volume of the flame retardant epoxy and 0.6 part or more by volume of the flame retardant aid filler.

The following will describe an example of measurement results of the thermal conductivity with reference to Table 4. Conditions for measuring the thermal conductivity were the same as described with reference to Table 2. The above-mentioned test was made by use of some of thermally conductive composition 1006 samples wherein the proportion of the flame retardant epoxy and that of the flame retardant aid filler were varied under a condition that the amounts of the crystalline epoxy resin and inorganic filler 1009, which enhance the thermal conductivity (of the composition), were large. The results are shown in Table 4.

TABLE 4

| Crystalline epoxy (% by volume in main agent) | 50 | 50 | 50 | 50 | 50 | 50 | 50 |
|---|---|---|---|---|---|---|---|
| Inorganic filler (% by volume) | 88 | 88 | 88 | 88 | 88 | 88 | 88 |
| Flame retardant epoxy (part(s) by volume) | 3 | 6 | 9 | 12 | 15 | 18 | 21 |
| Flame retardant aid filler (parts by volume) | 0.6 | 0.6 | 0.6 | 0.6 | 0.6 | 0.6 | 0.6 |
| Thermal conductivity (W/mK) | 10.3 | 10.2 | 9.5 | 9.1 | 8.3 | 5.5 | 5.2 |

In order that the composition can gain flame retardancy, it is necessary to add thereto 3 parts or more by volume of the flame retardant epoxy monomer. However, the addition of the flame retardant epoxy monomer lowers the thermal conductivity. When 18 parts or more by volume thereof are added, thermosetting resin 1010 cannot keep crystallinity, so that the thermal conductivity lowers extremely.

The following will describe results obtained by examining an effect of the proportion by volume of the flame retardant aid filler onto the thermal conductivity (of the composition) with reference to Table 5.

TABLE 5

| Crystalline epoxy (% by volume in main agent) | 50 | 50 | 50 | 50 | 50 | 50 | 50 | 50 |
|---|---|---|---|---|---|---|---|---|
| Inorganic filler (% by volume) | 88 | 88 | 88 | 88 | 88 | 88 | 88 | 88 |
| Flame retardant epoxy (part(s) by volume) | 15 | 15 | 15 | 15 | 15 | 15 | 15 | 15 |
| Flame retardant aid filler (parts by volume) | 0.6 | 1.0 | 1.5 | 2.0 | 2.5 | 3.0 | 3.5 | 4.0 |
| Thermal conductivity (W/mK) | 9.1 | 8.9 | 8.7 | 8.3 | 8.3 | 8.2 | 8.0 | 5.1 |

In order that the composition can gain flame retardancy, it is necessary to add thereto 0.6 part or more by volume of the flame retardant aid filler; however, the addition of the flame retardant aid filler lowers the thermal conductivity. However, the thermal conductivity does not lower extremely since the filler amount is increased. However, when the addition amount is set to 4.0 parts or more by volume, thermosetting resin 1010 becomes unable to keep crystallinity so that the thermal conductivity lower extremely. According to these matters, it is advisable that the addition amount of the flame retardant aid filler is set to 3.5 parts or less by volume.

The following will describe an example of thermally conductive composition 1006 and heat dissipating substrate 1035 which attain compatibility between high thermal conductivity and high flame retardancy, and impact resistance.

Thermally conductive material 1026 used in this example is composed of main agent 503, curing agent 504, a flame retardant epoxy monomer, a thermoplastic resin, inorganic filler 1009, and a flame retardant aid filler. Main agent 503 contains 50% by volume of a crystalline epoxy monomer and an amorphous epoxy monomer as the rest, and is a commercially available product. The flame retardant epoxy monomer is added in an amount of 1 to 3 parts by volume for 100 parts by volume of curable resin component 505. The thermoplastic resin is added in an amount of 0.1 to 3 parts by volume for 100 parts by volume of curable resin component 505. In thermally conductive material 1026, inorganic filler 1009 is contained in a proportion of 70% or 88% by volume thereof. The flame retardant aid filler is contained in an amount of 0.2 to 3.0 parts by volume for 100 parts by volume of curable resin component 505. A description is made about results obtained by making an experiment for thermally conductive material 1026 of this composition.

The respective materials of crystalline epoxy monomer 501, amorphous epoxy monomer 502, curing agent 504, inorganic filler 1009, a thermoplastic resin, a flame retardant epoxy monomer, and a flame retardant aid filler were the same as described above.

These materials and the above-mentioned imidazole were mixed with each other, and the mixture was stirred. The mixture was heated up to a temperature at which the epoxy monomers and curing agent 504 were melt, and then a biaxial kneader was used to mix the individual components. After the mixing, the mixture was shaped into shapes adapted to various tests, and then the resultants were heated and cured at 180° C. for 5 hours to produce samples of thermally conductive composition 1006.

First, a description is made about results obtained by evaluating the impact resistance thereof with reference to Table 6. A drop test therefor was made under the same conditions as described with reference to Table 1. In samples described in Table 6, 3 parts by volume of the flame retardant epoxy were added and further 0.6 part by volume of the flame retardant aid filler was added.

TABLE 6

| Crystalline epoxy (% by volume in main agent) | 40 | 40 | 50 | 50 | 40 | 40 | 50 | 50 |
|---|---|---|---|---|---|---|---|---|
| Inorganic filler (% by volume) | 70 | 70 | 70 | 70 | 88 | 88 | 88 | 88 |
| Thermoplastic resin (part by volume) | 0.1 | 0.3 | 0.1 | 0.3 | 0.1 | 0.3 | 0.1 | 0.3 |
| Evaluation | OK | OK | OK | OK | NG | OK | NG | OK |

As is understood from Table 6, as the proportion of the crystalline epoxy resin or the inorganic filler is larger, thermally conductive composition 1006 tends to be more easily cracked. It is also understood that the impact resistance (of the composition) is improved by the addition of the thermoplastic resin. However, the thermal conductivity lowers.

From Table 6, it is understood that the impact resistance is improved by the addition of 0.3 part or more by volume of the thermoplastic resin for 100 parts by volume of curable resin component 505.

The following will describe results obtained by evaluating the flame retardancy (of the composition) with reference to Table 7. A flame retardancy test therefor was made under the same conditions as described with reference to Table 3. In samples described in Table 7 (out of the samples), 0.3 part by volume of the thermoplastic resin was added.

The test was made by use of some of thermally conductive composition 1006 samples wherein the proportion of the flame retardant epoxy and that of the flame retardant aid filler were varied under a condition that the amount of the crystalline epoxy resin, which is easily burned, was large and that of inorganic filler 1009 was small.

TABLE 7

| Crystalline epoxy (% by volume in main agent) | 50 | 50 | 50 | 50 | 50 | 50 | 50 | 50 | 50 |
|---|---|---|---|---|---|---|---|---|---|
| Inorganic filler (% by volume) | 70 | 70 | 70 | 70 | 70 | 70 | 70 | 70 | 70 |
| Flame retardant epoxy (part(s) by volume) | 1 | 1 | 1 | 2 | 2 | 2 | 3 | 3 | 3 |
| Flame retardant aid filler (parts by volume) | 0.2 | 0.4 | 0.6 | 0.2 | 0.4 | 0.6 | 0.2 | 0.4 | 0.6 |
| Result 1 (t1 + t2) | >10 | >10 | >10 | >10 | >10 | 9 | 8 | 8 | 2 |
| Result 2 (t1 + t2) | >10 | >10 | >10 | >10 | >10 | >10 | >10 | >10 | 4 |

As shown in Table 7, it is understood that the flame retardancy is improved by the addition of the flame retardant epoxy and the flame retardant aid filler.

It is understood that the composition can gain flame retardancy by the addition of 3 parts by volume of the flame retardant epoxy and 0.6 part by volume of the flame retardant aid filler. Accordingly, in order that the composition can gain flame retardancy, it is necessary to add thereto 3 parts or more by volume of the flame retardant epoxy and 0.6 part or more by volume of the flame retardant aid filler.

The following will describe an example of results obtained by evaluating the thermal conductivity (of the composition) in the state that the impact resistance and the flame retardancy were improved with reference to Tables 8 and 9. Thermal conductivity-measuring conditions were the same as described with reference to Table 2. The test was made by use of some of thermally conductive composition 1006 samples wherein the proportions of the thermoplastic resin, the flame retardant epoxy, and the flame retardant aid filler were varied under a condition that the amounts of the crystalline epoxy resin and inorganic filler 1009, which enhance the thermal conductivity, were large. First, results obtained by varying the proportion of the thermoplastic resin are shown in Table 8.

TABLE 8

| Crystalline epoxy (% by volume in main agent) | 50 | 50 | 50 | 50 | 50 | 50 | 50 |
|---|---|---|---|---|---|---|---|
| Inorganic filler (% by volume) | 88 | 88 | 88 | 88 | 88 | 88 | 88 |
| Thermoplastic resin (part by volume) | 0.3 | 0.5 | 1.0 | 1.5 | 2.0 | 2.5 | 3.0 |
| Flame retardant epoxy (part(s) by volume) | 3 | 3 | 3 | 3 | 3 | 3 | 3 |
| Flame retardant aid filler (parts by volume) | 0.6 | 0.6 | 0.6 | 0.6 | 0.6 | 0.6 | 0.6 |
| Thermal conductivity (W/mK) | 10.5 | 10.1 | 10.0 | 9.3 | 9.0 | 9.0 | 5.2 |

The addition of the thermoplastic resin lowers the thermal conductivity. When 3 parts or more by volume thereof are added, thermosetting resin 1010 becomes unable to keep crystallinity so that the thermal conductivity lowers extremely.

The following will describe results obtained by varying the proportion of the flame retardant epoxy resin with reference to Table 9.

TABLE 9

| Crystalline epoxy (% by volume in main agent) | 50 | 50 | 50 | 50 | 50 |
|---|---|---|---|---|---|
| Inorganic filler (% by volume) | 88 | 88 | 88 | 88 | 88 |
| Thermoplastic resin (part by volume) | 2.5 | 2.5 | 2.5 | 2.5 | 2.5 |
| Flame retardant epoxy (part(s) by volume) | 3 | 6 | 9 | 12 | 15 |
| Flame retardant aid filler (parts by volume) | 0.6 | 0.6 | 0.6 | 0.6 | 0.6 |
| Thermal conductivity (W/mK) | 9.0 | 8.7 | 8.5 | 8.3 | 5.3 |

In order that the composition can gain flame retardancy, it is necessary to add thereto 3 parts or more by volume of the flame retardant epoxy monomer; however, the addition of the flame retardant epoxy monomer lowers the thermal conductivity. When 15 parts or more by volume thereof are added, thermosetting resin 1010 becomes unable to keep crystallinity so that the thermal conductivity lowers extremely.

The following will describe results obtained by varying the addition amount of the flame retardant aid filler with reference to Table 10.

TABLE 10

| ☐Crystalline epoxy resin (% by volume in main agent) | 50 | 50 | 50 | 50 | 50 | 50 |
|---|---|---|---|---|---|---|
| Inorganic filler (% by volume) | 88 | 88 | 88 | 88 | 88 | 88 |
| Thermoplastic resin (part by volume) | 2.5 | 2.5 | 2.5 | 2.5 | 2.5 | 2.5 |
| Flame retardant epoxy (part(s) by volume) | 12 | 12 | 12 | 12 | 12 | 12 |
| Flame retardant aid filler (parts by volume) | 0.6 | 1.0 | 1.5 | 2.0 | 2.5 | 3.0 |
| Thermal conductivity (W/mK) | 8.3 | 8.5 | 8.1 | 8.0 | 8.1 | 5.9 |

In order that the composition can gain flame retardancy, it is necessary to add thereto 0.6 part or more by volume of the flame retardant aid filler; however, the addition of the flame retardant aid filler lowers the thermal conductivity. However, the thermal conductivity does not lower extremely because of the increase in the filler amount. However, when the addition amount is set to 3.0 parts or more by volume, thermosetting resin 1010 becomes unable to keep crystallinity so that the thermal conductivity lowers extremely. From these matters, it is advisable to set the addition amount of the flame retardant aid filler to 2.5 parts or less by volume.

The following will describe results obtained by measuring the glossiness and the surface roughness of thermally conductive composition 1006 having the above-mentioned composition. Table 11 shows the measurement results of the surface roughnesses of free surface 1007 of samples A of thermally conductive composition 1006. The distance for the measurement was 10000 μm, and the results are measurement results according to a surface roughness meter of a stylus type. In Table 11, Rz denotes the ten-point average roughness (JIS B0601:1994) (of samples (A).

Thermally conductive material 1026, which is thermally conductive composition 1006 that is not yet cured, contains 66% by volume of inorganic filler 1009, main agent 503, curing agent 504, a thermoplastic resin, a flame retardant epoxy monomer, and a flame retardant aid filler. Main agent 503 contains 40% by volume of a crystalline epoxy monomer, and an amorphous epoxy monomer as the rest. 1 part by volume of the thermoplastic resin, 5 parts by volume of the flame retardant epoxy monomer, and 1 part by volume of the flame retardant aid filler are added for 100 parts by volume of curable resin component 505. These materials are the same as described above. When thermally conductive material 1026 is cured, the material is heated at not lower than the crystallization temperatures of the crystalline epoxy monomer and thermosetting resin 1010.

TABLE 11

| | Ra (μm) | Rmax (μm) | Rz (μm) |
|---|---|---|---|
| Samples A | 0.15 | 3.34 | 2.71 |

(average values of the samples (n = 5))

Table 12 shows measurement results of the surface roughnesses of samples B which are each a thermally conductive composition in the prior art. Measuring conditions are the same as in Table 11. The thermally conductive material of this thermally conductive composition has the same composition as described except that its main agent contains only the amorphous epoxy monomer.

TABLE 12

| | Ra (μm) | Rmax (μm) | Rz (μm) |
|---|---|---|---|
| Samples B | 0.86 | 21.58 | 21.04 |

(average values of the samples (n = 5))

Tables 11 and 12 each show average values that are each obtained from five measured values. As shown in Tables 11 and 12, free surface 1007 of thermally conductive composition 1006 of the present embodiment has a very small surface roughness which is about 1/10 of that of the free surface of the thermally conductive composition in the prior art. This is because in thermally conductive composition 1006, inorganic filler 1009 is evenly wetted with thermosetting resin 1010 and is further covered with surface layer portion 1011.

The same evaluation was made by varying the content by percentage of inorganic filler 1009 into various values of 66% or more by volume. As the content by percentage of inorganic filler 1009 was increased, a difference as described above became larger. In thermally conductive composition 1006 of the embodiment, also at points where the content by percentage of inorganic filler 1009 was close to 90% by volume, the Ra was 3000 Å or less and further the Rmax was 15000 Å or less.

With reference to Table 13, the following will describe measurement results of a difference in gloss between free surface 1007 of thermally conductive composition 1006 of the embodiment, and a free surface of a thermally conductive composition in the prior art. Samples used in the measurement are the same as evaluated in Tables 11 and 12.

For the glossiness measurement, a gloss checker IG-330 manufactured by Horiba, Ltd. was used. The glossiness (of any surface) is a quantity representing the degree of reflection obtained when light is radiated onto the surface, and is decided by the ratio between the intensity of light reflected on its area measured and that of light reflected on a gloss standard plate. In the JIS, the glossiness of a surface of a glass plate having a refractive index of 1.567 is used as the standard of gloss, and specified as 100. However, any glass is scientifically instable; thus, when photometer 1000 used by the inventors is used as a 60-degree photometer or a 20-degree photometer, a glass piece (black glass piece) having a glossiness of 90 or 84, respectively, is used as a standard plate for correction. The 60-degree photometer is used to measure the glossiness of a plastic, a tile, a painted film, or the like, and the 20-degree photometer is used to measure a highly glossy matter, such as a painted film of a car.

TABLE 13

| | 20-Degree glossiness | 60-Degree glossiness |
|---|---|---|
| Samples A | 106 | 99 |
| Samples B | 0 | 15 |

(average values of the samples (n = 5))

As shown in Table 13, samples A that are each thermally conductive composition 1006 of the embodiment have a far larger glossiness than samples B that are each the thermally conductive composition in the prior art. This is because in thermally conductive composition 1006 the proportion of uncovered particle surfaces of inorganic filler 1009 is small or surface layer portion 1011 is positively formed.

Figure 20A:
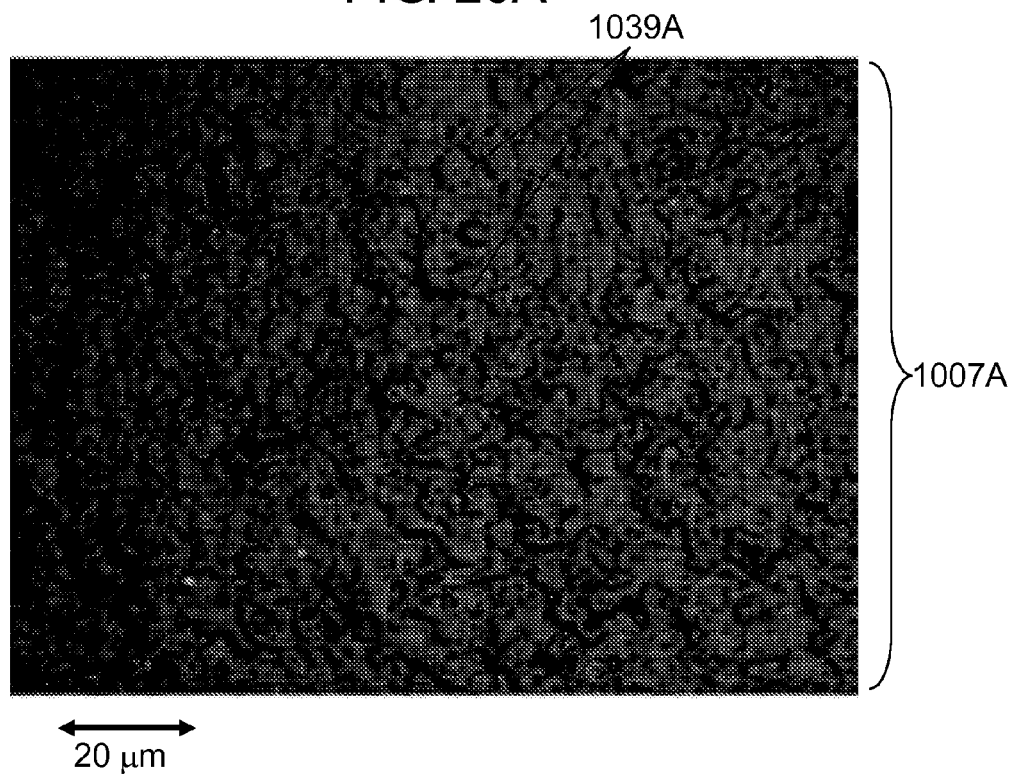
FIG. 20A is a view showing a microscopic image of a free surface of an example of a thermally conductive composition according to an embodiment of the invention.
Figure 20B:
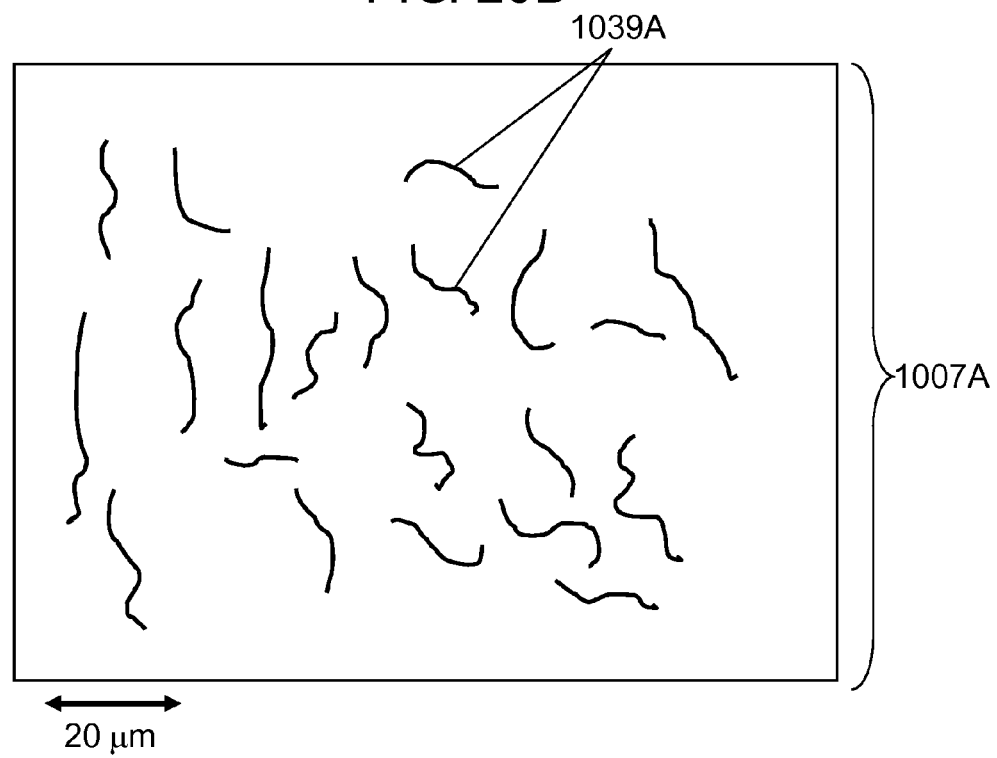
FIG. 20B is a schematic view of FIG. 20A.
Figure 21:
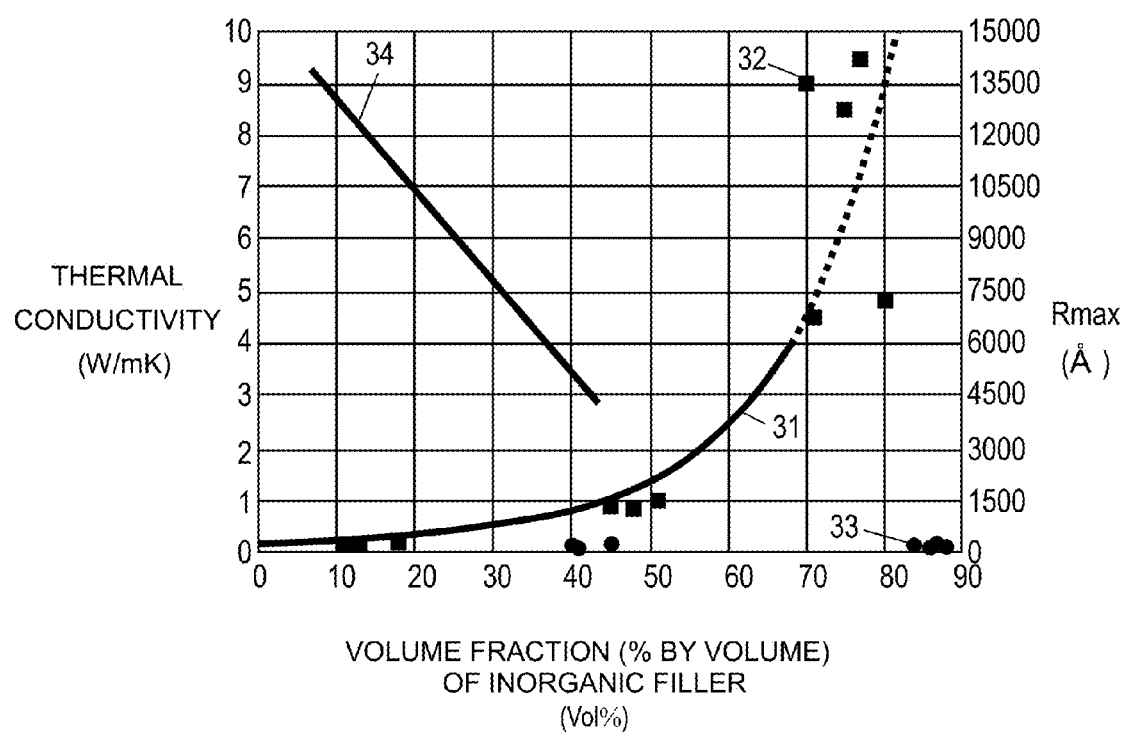
FIG. 21 is a graph showing the surface roughness Rmax of a free surface of an example of a thermally conductive composition according to an embodiment of the invention.

The following will describe a surface of thermally conductive composition 1006, in particular, a free surface thereof with reference to FIGS. 20A to 21. FIGS. 20A and 20B are a microscopic image of free surface 1007A of an example of a thermally conductive composition of an embodiment of the invention, and a schematic view thereof, respectively.

This thermally conductive composition has the same composition as described above except that the inorganic filler is contained in a proportion of 70% by volume. The materials thereof are the same as described above.

As illustrated in FIG. 20, the incorporation of the crystalline epoxy makes it possible to render free surface 1007A a smooth surface having gloss and fine irregularities.

Free surface 1007A is a smooth surface having gloss and fine irregularities. As described herein, free surface 1007A is a surface in, for example, piano black, that is, a glossy and smooth surface. For example, the 20-degree glossiness is from 95 to 100, and the surface roughness Ra is 500 Å. Free surface 1007A is made of an aggregate composed of small convexes having heights corresponding to diameters of several tens of micrometers to several hundreds of micrometers. This would be because Bernal cells are generated as has been described with reference to FIG. 4C. Wrinkle regions 1039A show a surface pattern corresponding to boundary regions of the Bernal cells.

As described above, the inorganic filler is hardly exposed to free surface 1007A. In other words, free surface 1007A is covered with a surface layer portion made mainly of a thermosetting resin. By rendering substantially entire part of free surface 1007A a beautiful and smooth surface having a fine piano-black gloss, the thermally conductive composition can endure reliability tests such as a pressure cooker test as described above.

FIG. 21 is a graph showing an example of the surface roughness Rmax of a free surface of a thermally conductive composition according to an embodiment of the invention. The Ry may be substituted for the Rmax. The X axis represents the volume fraction (% by volume) of an inorganic filler in the thermally conductive composition. The Y axes represent the thermal conductivity, and the surface roughness or the glossiness. The unit of the thermal conductivity which the Y axis on the left side represents is W/mK. The unit of the surface roughness Rmax which the Y axis on the right side is Å. No scale for the glossiness is represented on the Y axes, because the graph of the glossiness is qualitative. Line 31 shows the thermal conductivity; each of plotted dots 32 and 33 the surface roughness Rmax; and line 34 the glossiness.

Line 31 shows a change in the thermal conductivity responsive to the content by percentage of the inorganic filler (Bruggeman's equation). Line 31 is a dot line in the range that the volume fraction of the inorganic filler is 66% or more by volume. This means that the shaping or some other operation of the thermally conductive composition is very difficult in the range that the fraction is over 66% by volume.

A matter that the surface roughness increases (and further the glossiness decreases) means that the formability of the thermally conductive composition declines or innumerable voids (what is called air gaps) are generated in the inside or the surface of the thermally conductive composition.

Plotted dots 32 and 33 are actually measured values plotted. Plotted dots 32 demonstrate the case according to the prior art, wherein the main agent containing no crystalline epoxy monomer was used, and plotted 33 demonstrate the case wherein the materials described with reference to FIG. 20 were used.

According to plotted dots 32, when the content by percentage of the inorganic filler is from 10 to 20% by volume, the Rmax and the Ry are each smaller than 500 Å. The Ry, which is not illustrated, is substantially equal to the Rmax. However, when the content by percentage of the inorganic filler is in the range of 45 to 50% by volume, the Rmax is about 1500 Å. When the content by percentage of the inorganic filler is 66% or more by volume and further exceeds 70% by volume, the Rmax exceeds 7500 Å.

Line 34 schematically shows a change in the glossiness, and demonstrates a situation that as the volume fraction of the inorganic filler increases so that the surface roughness Rmax becomes larger, the glossiness abruptly lowers.

As described above, it is understood from line 31 that as the volume fraction of the inorganic filler increases, the thermal conductivity itself increases; from plotted dots 32 that the surface roughness of the surfaces of the actual shaped grains increases abruptly; and from lines 34 that the glossiness lowers abruptly.

According to plotted dots 33, the Rmax is 15000 Å (1.5 μm) or less, and further is 12000 Å (1.2 μm) or less whether the volume fraction of the inorganic filler is from 40 to 45% by volume, or from 82 to 90% by volume.

Figure 22A:
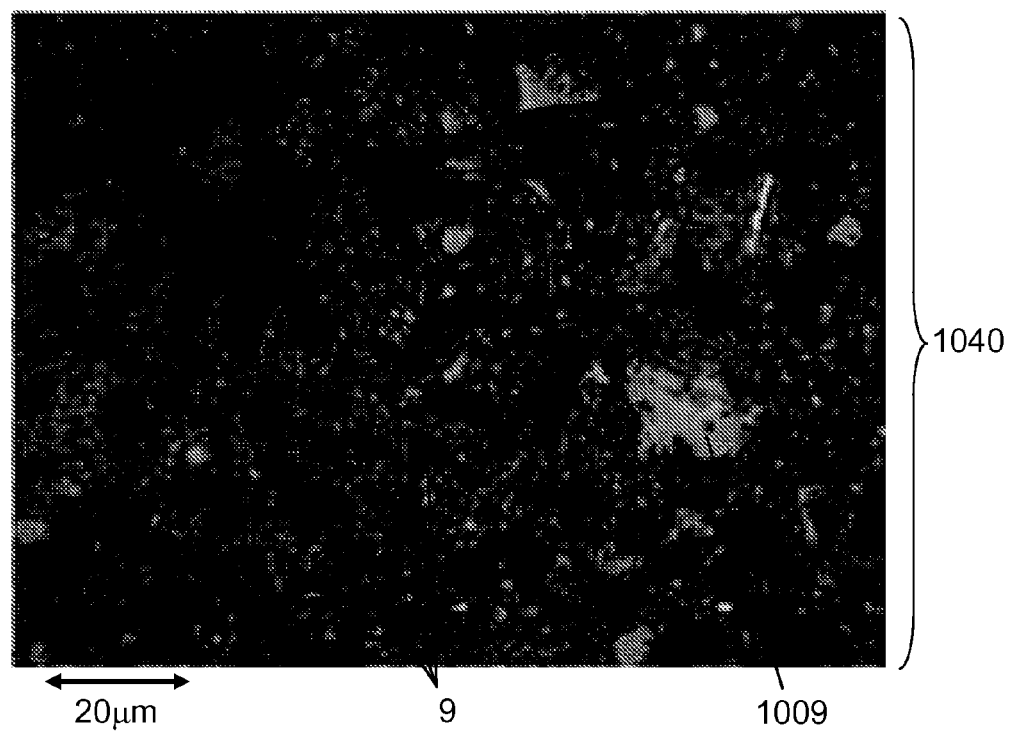
FIG. 22A is a view illustrating a microscopic image of a free surface of a conventional thermally conductive composition formed by dispersing a commercially available alumina filler in an amorphous epoxy resin to have a proportion of 66% by volume.
Figure 22B:
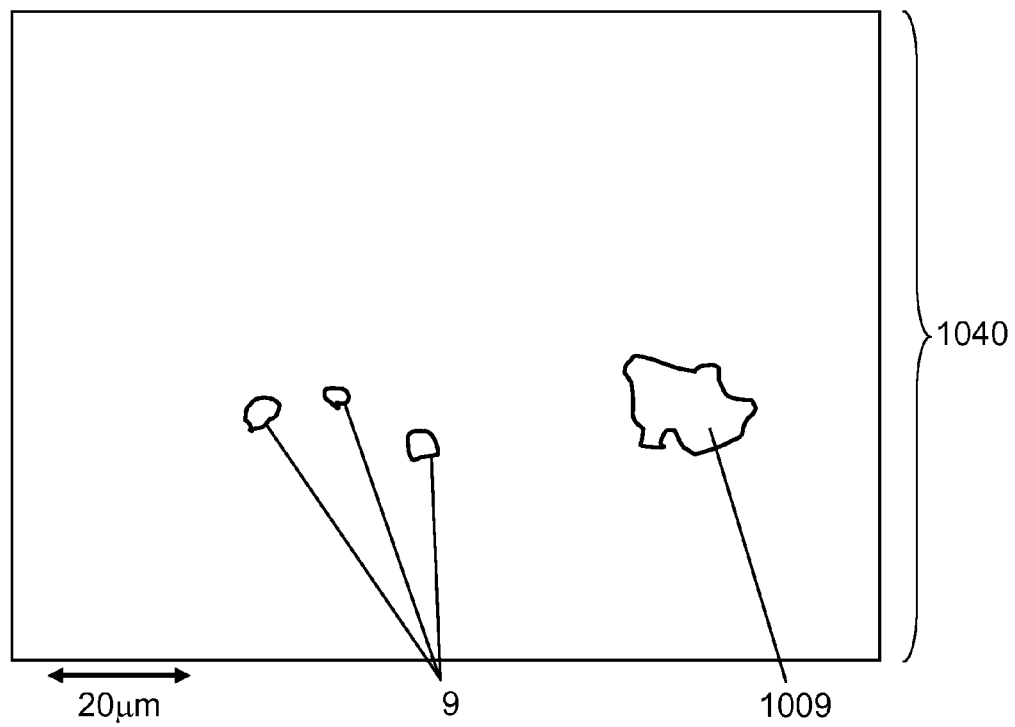
FIG. 22B is a schematic view of FIG. 22A.

With reference to FIGS. 22A and 22B, the following will describe a surface of a thermally conductive composition in the prior art wherein a main agent containing no crystalline epoxy monomer is used. FIGS. 22A and 22B are a microscopic image of a free surface of the thermally conductive composition in the prior art, which is formed by using an amorphous epoxy monomer as the main agent, dispersing an inorganic filler in a proportion of 66% by volume, and adding a flame retardant epoxy monomer, a flame retardant aid filler and a thermoplastic resin, and a schematic view thereof, respectively. In other words, these figures each demonstrate a surface state of the sample of which the surface roughnesses are shown in Table 12. In free surface 1040 of the thermally conductive composition in the prior art, innumerable voids 9 are generated. Voids 9 may be not only air bubbles but also gaps based on the drop of inorganic filler 1009. Innumerable pieces of inorganic filler 1009 are exposed to free surface 1040. The exposed inorganic filler 1009 pieces may drop out when the composition is handled or as the filler changes with the passage of time. This is because free surface 1040 of the thermally conductive composition in the prior art is not protected by surface layer portion 1011 as shown in FIG. 1.

A matter that innumerable voids 9 are generated in free surface as described above means that innumerable voids 9 remain inside the thermally conductive composition. It is expected that in a case where the thermally conductive material is caused to adhere onto a metallic plate before cured, and then cured, similar voids 9 remain also at the interface between the material and the metallic plate.

As described above, a glossy surface is not formed in any surface of the thermally conductive composition in the prior art, which is made mainly of the amorphous epoxy resin component but contains no crystalline epoxy resin component. The wording "contains no crystalline epoxy resin component" means that the proportion of any crystalline epoxy resin component that occupies less than 1% by volume of the total of the epoxy monomers which are not yet cured and the binder.

The amorphous epoxy resin component is polyfunctional and is a shape-indeterminable resinous material having a molecular weight distribution. Specifically, the amorphous epoxy resin is indefinite in the difference between the liquid state thereof and the solid state thereof, and softens gradually with a rise in the temperature thereof. Following this, the resin becomes a liquid with high viscosity and shortly exhibits high fluidity, and it is changed into a liquid with low viscosity. For this reason, the amorphous epoxy resin has less viscosity change respondent to temperature than any crystalline epoxy resin. As a result, even when the amorphous epoxy resin is heated, the resin does not easily lower the viscosity and makes the following difficult: thermally circulating in gaps between the pieces of the inorganic filler; causing voids therein to be driven out; and heightening the adhesiveness between the resin and the metallic plate, which is an underlying member. To the surface of the resin, voids or the inorganic filler is easily exposed.

As described above, voids 9 are present in the surface of the thermally conductive composition in the prior art, in the composition, or at the interface between the composition and the metallic plate; thus, the composition has problems for thermal conductivity and strength.

The following will describe a free surface of a thermally conductive composition sample made experimentally by the inventors, and a free surface of a thermally conductive composition in the prior art with reference to FIGS. 23A to 27B. In connection with FIGS. 21A and 21B, a case where the content by percentage of the inorganic filler is 66% has been described; however, in the following, a description will be made about an example wherein the content by percentage of an inorganic filler is 70% by volume.

In the following description, for the thermally conductive composition of the present embodiment, the proportion of the inorganic filler is 70% by volume and that of a resin component, which is a thermosetting resin, is 30% by volume. The resin component is made mainly of an epoxy resin and containing a small amount of a dispersing agent and others. An uncured material of the resin component is prepared by adding, to a main agent and a curing agent, a flame retardant epoxy monomer, a flame retardant aid filler, and a thermoplastic resin. The main agent contains 12% by volume of a crystalline epoxy monomer and 18% by volume of an amorphous epoxy monomer. The addition amounts of the flame retardant epoxy monomer, the flame retardant aid filler, and the thermoplastic resin are the same as in the sample in FIGS. 20A and 20B. The above-mentioned materials are each the same as in the sample in FIGS. 20A and 20B.

For the thermally conductive composition in the prior art, the proportion of an inorganic filler is 70% by volume and that of a resin component which is a thermosetting resin is 30% by volume. An uncured material of the resin component is equivalent to that of thermally conductive composition 1006 described above except that its main agent is made only of the amorphous epoxy monomer.

Figure 23A:
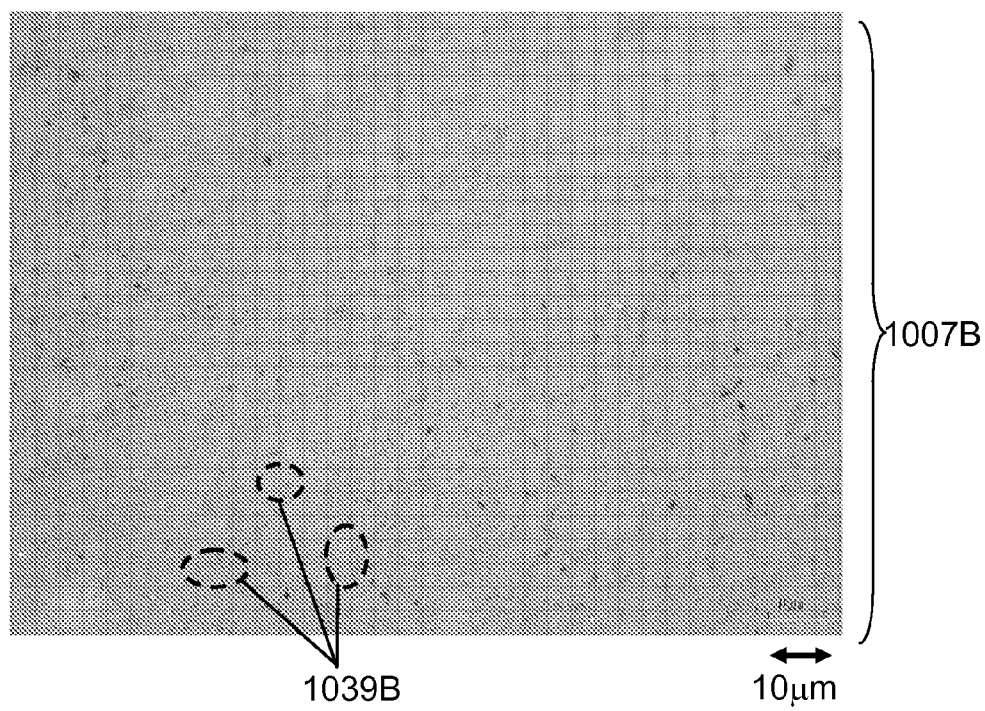
FIG. 23A is a view showing a microscopic image of a free surface of another example of the thermally conductive composition of the embodiment of the invention.
Figure 23B:
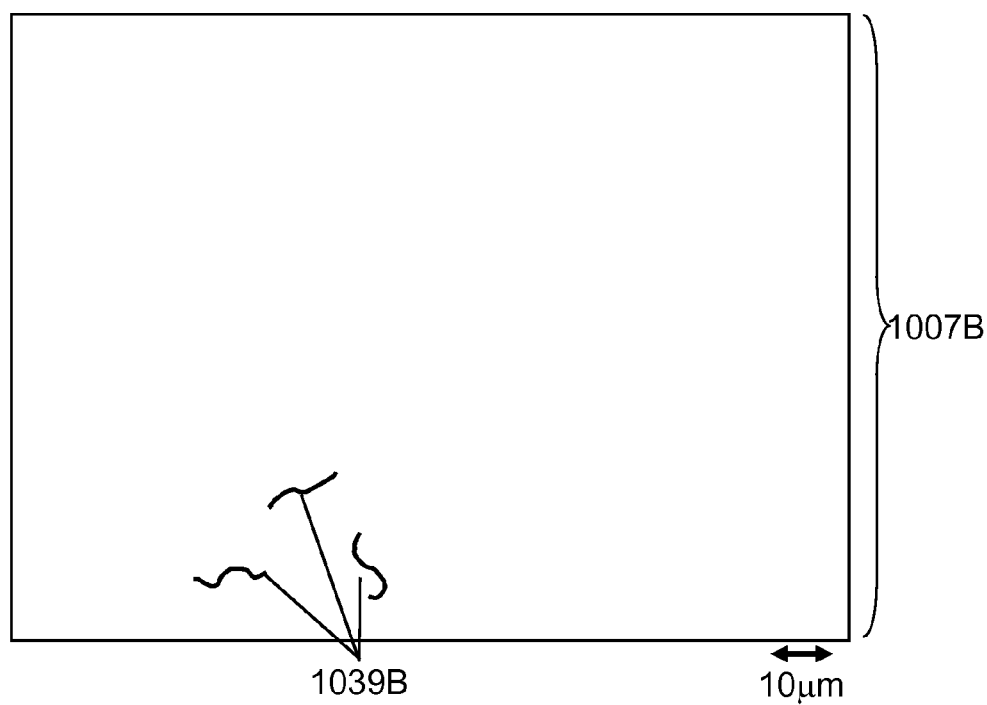
FIG. 23B is a schematic view of FIG. 23A.

FIG. 23A is a microscopic image of free surface 1007B of the thermally conductive composition of the present embodiment, and FIG. 23B is a schematic view thereof. Since the front of free surface 1007B is neither subjected to washing nor any other, stains and others resulting from the thermally conductive composition remain. In free surface 1007B, traces 1039B are observed which are generated by a matter that the thermosetting resin contained in the thermally conductive material is caused to flow by convection when the resin is heated. Traces 1039B are irregularities generated by fine convectional whirls having a diameter of several micrometers, and appear to be irregularities generated by Benard cells or convectional whirls similar thereto. The thickness of the thermally conductive composition is from 0.4 to 0.6 mm, and the content by percentage of the inorganic filler is 66% or more by volume. Thus, the irregularities represented schematically by traces 1039 are not in regular forms, for example, Benard cells in silicone oil.

The surface of the thermally conductive composition of the embodiment is covered with a very thin surface layer portion having a thickness of several micrometers, and the inorganic filler is hardly uncovered.

Figure 24A:
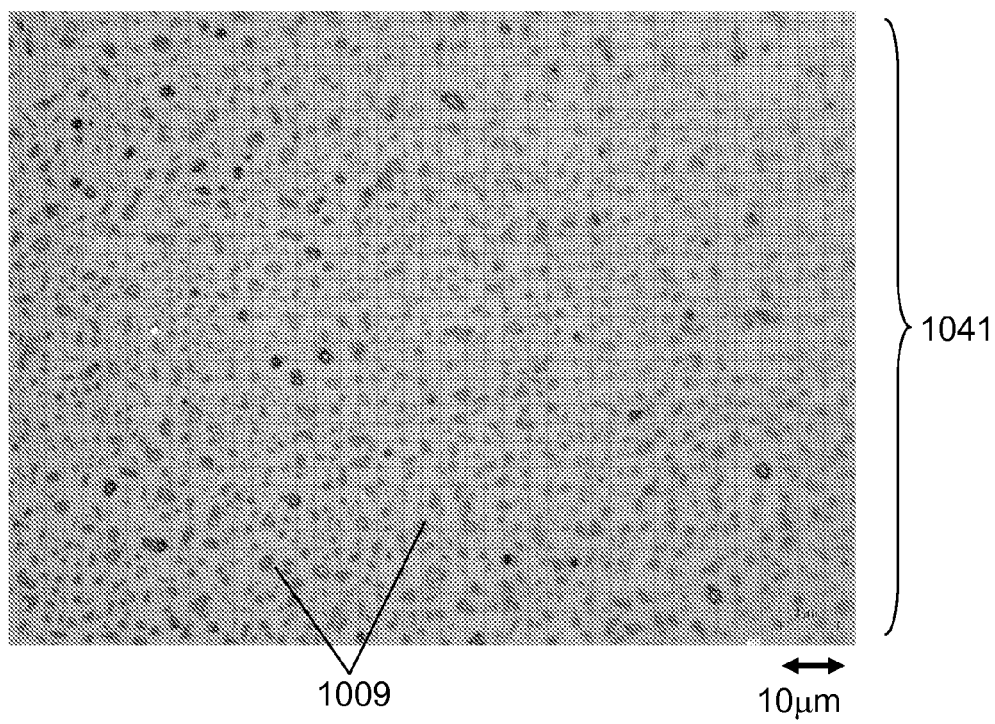
FIG. 24A is a view showing a surface of the thermally conductive composition illustrated in FIG. 23A after the surface is subjected to slice polishing.
Figure 24B:
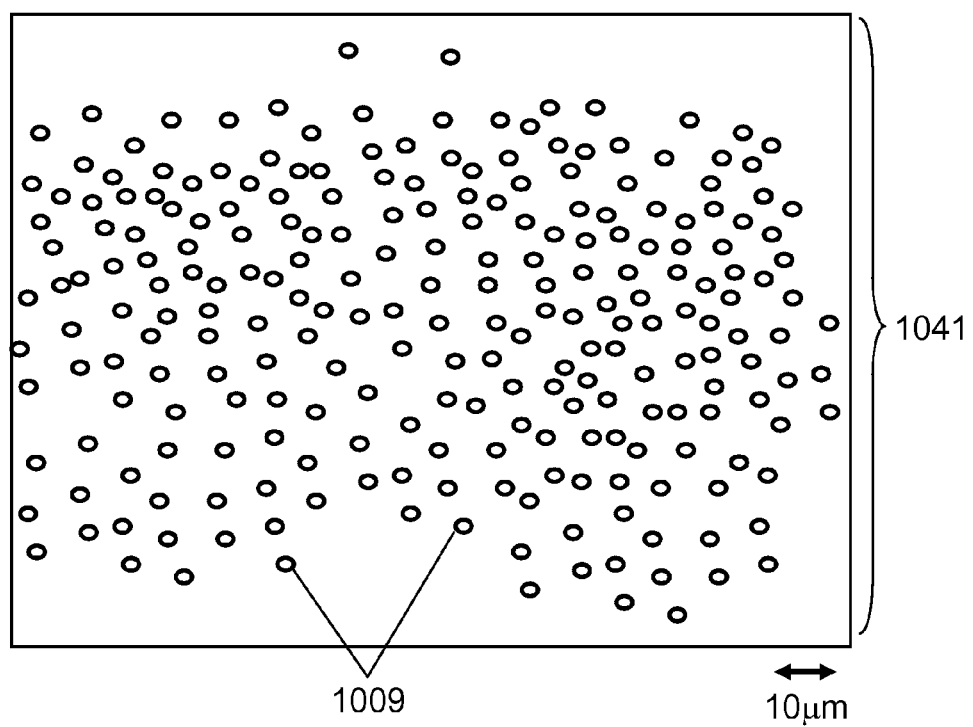
FIG. 24B is a schematic view of FIG. 24A.

With reference to FIGS. 24A and 24B, the following will describe the surface of a front-side surface layer portion of the thermally conductive composition in FIG. 23A after the surface layer portion is subjected to slice polishing. Slice polishing means that only a surface layer is very slightly polished. FIG. 24A shows a microscopic image of the surface of the thermally conductive composition illustrated in FIG. 23A after the surface is subjected to slice polishing, and FIG. 24B is a schematic view thereof. Inorganic filler 1009 is exposed to surface 1041 subjected to the slice polishing. When the polishing of surface 1041 is further advanced, the proportion of uncovered particle surfaces of inorganic filler 1009 is increased. In this way, a great number of pieces of inorganic filler 1009 are exposed to surface layer portion surface 1041 subjected to the slice polishing; however, voids are hardly observed in the surface. This would be because the void-extinguishing mechanism described with reference to FIG. 4C is generated.

Figure 25A:
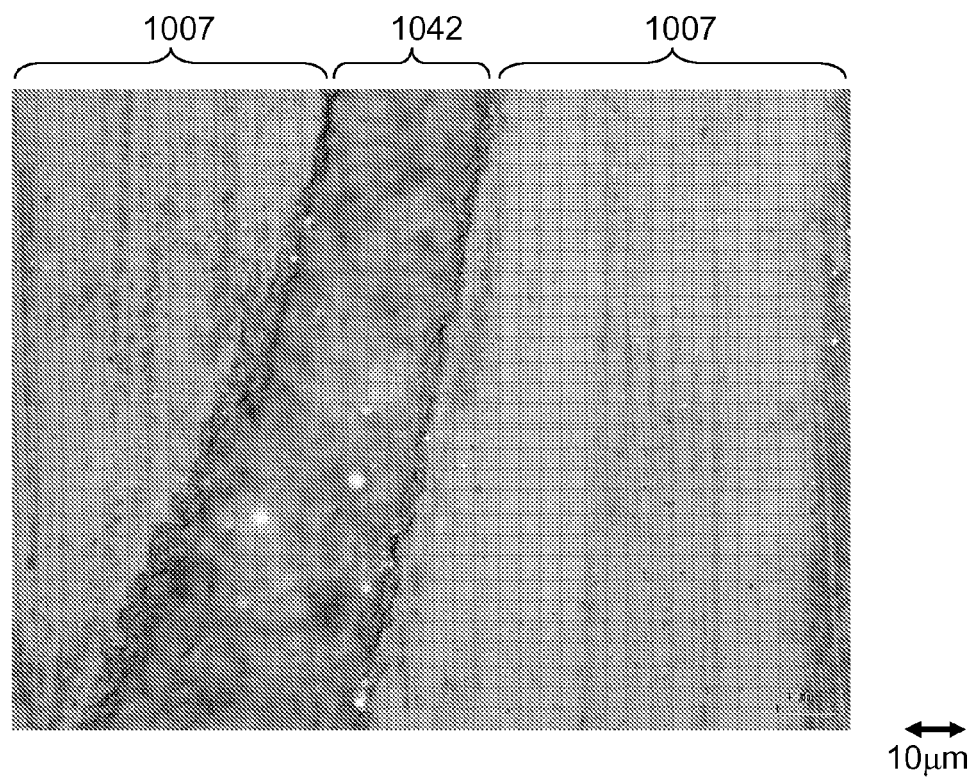
Figure 25B:
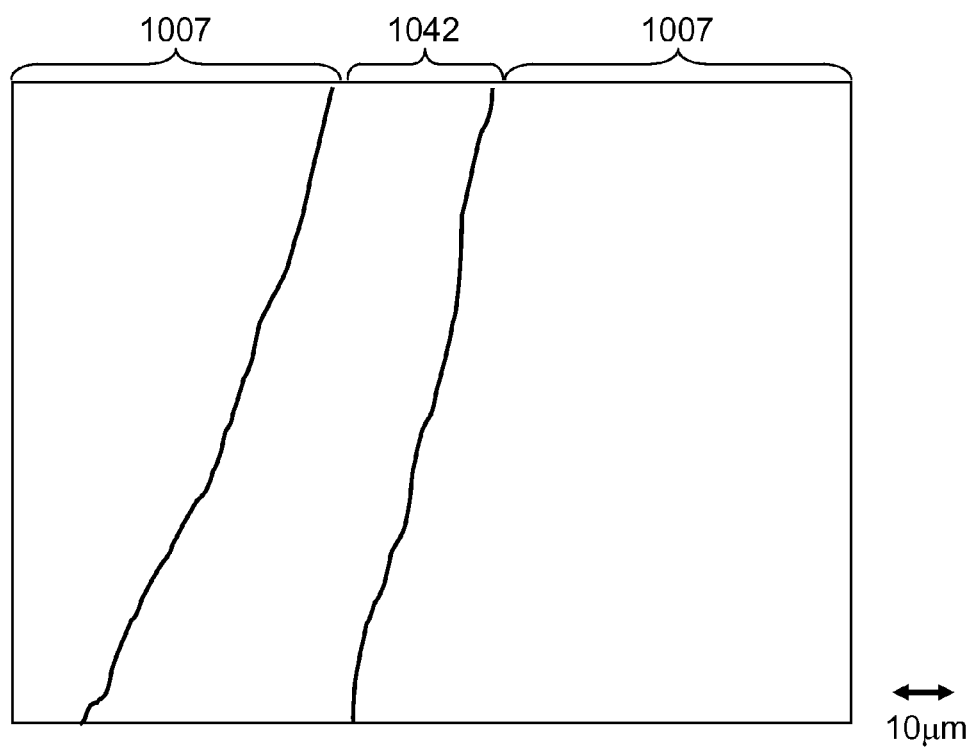
FIG. 25B is a schematic view of FIG. 25A.
Figure 26A:
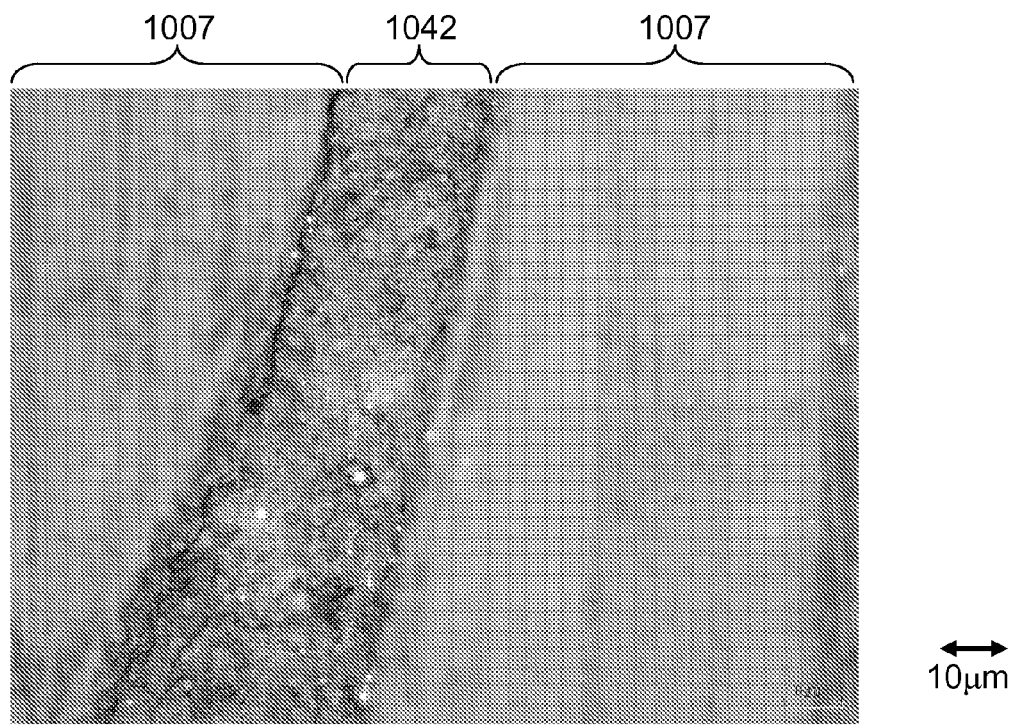
FIG. 26A is a view showing a microscopic image obtained by focusing on a region scratched off with the paddle or the like in FIG. 25A.
Figure 26B:
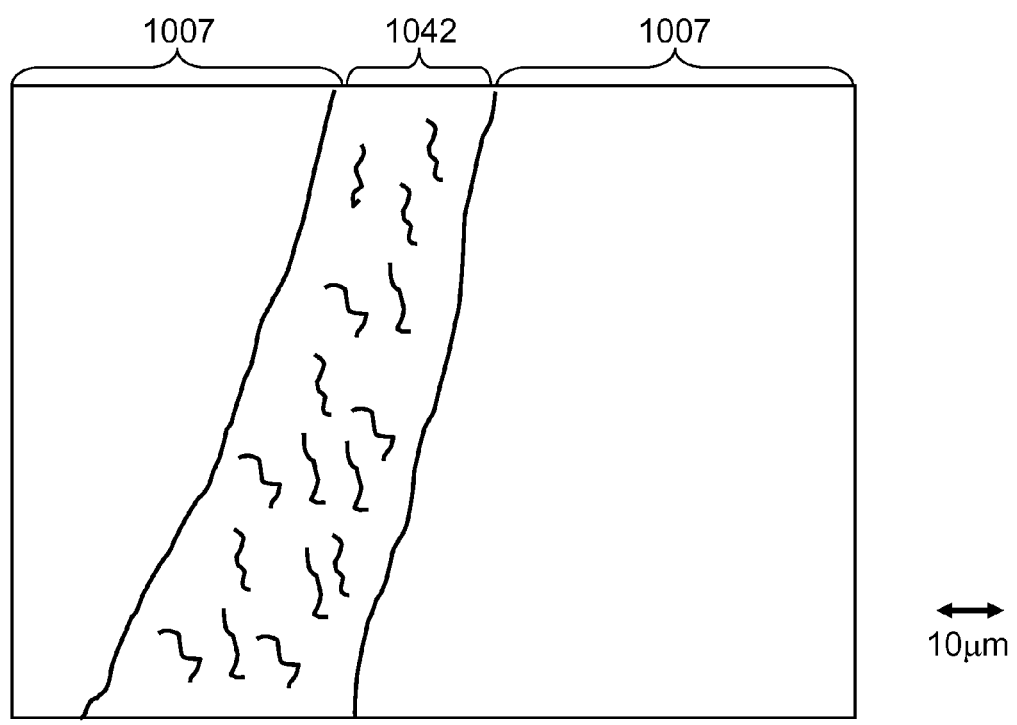
FIG. 26B is a schematic view of FIG. 26A.

With reference to FIGS. 25A to 26B, the following will describe an observation example of the surface layer portion formed in the surface (region) of the thermally conductive composition in FIG. 23A. The situation of the surface layer portion can be observed by removing the surface of the thermally conductive composition locally with a paddle made of a metallic or ceramic material, or some other member. FIGS. 25A and 26A each show a microscopic image for describing a state of the thermally conductive composition in FIG. 23A, the state being a state generated after a surface (that is, free surface 1007) of this composition is partially scratched off with a paddle or the like. FIG. 25A is an image obtained by focusing on the front of free surface 1007, and FIG. 26A is an image obtained by focusing on surface-layer-portion-removed region 1042. FIGS. 25B and 26B are schematic views thereof, respectively. Portions of free surface 1007 are removed, the portions each corresponding to a width of 20 to 30 µm, so that surface-layer-portion-removed region 1042 is formed.

As illustrated in FIGS. 25A and 25B, the inorganic filler is hardly contained in the surface layer portion of free surface 1007. By contrast, as illustrated in FIGS. 26A and 26B, in the surface of surface-layer-portion-removed region 1042, innumerable irregularities are observed which result from a great number of the inorganic filler particles (having a particle diameter of, for example, about 20 µm) buried in the surface. Voids are hardly observed in surface-layer-portion-removed region 1042. This would be based on the void-extinguishing mechanism described with reference to FIG. 4C.

In the case of measuring the difference between the focus position in FIG. 25A and that in FIG. 26B with a Z-direction (thickness direction) measuring instrument attached to a microscope, the interval therebetween was 1.1 µm. Thus, it appears that the thickness of surface layer portion 101 illustrated in FIG. 1 is about 1.1 µm.

The thickness of surface layer portion 1011 is 20 µm or less, desirably 10 µm or less, even more preferably 5 µm or less. As the thickness is smaller, a more desired result is obtained. If the thickness is more than 20 µm, surface layer portion 1011 may affect the heat conduction efficiency (of the composition).

The inventors expect that it is preferred that the thickness of surface layer portion 1011 is at least 0.1 µm. However, it is difficult to measure the thickness of surface layer portion 1011 with a high precision. It appears that when the thickness is set to 0.1 µm or more, the dropping of inorganic filler 1009 can be prevented. It is unnecessary that the thickness of surface layer portion 1011 of thermally conductive composition 1006 is even. When the thickness of surface layer portion 1011 is locally increased or decreased positively, the generation of irregularities caused by inorganic filler 1009 can be restrained. It is advisable to vary the thickness within the range of 0.1 to 20.0 µm.

Figure 27A:
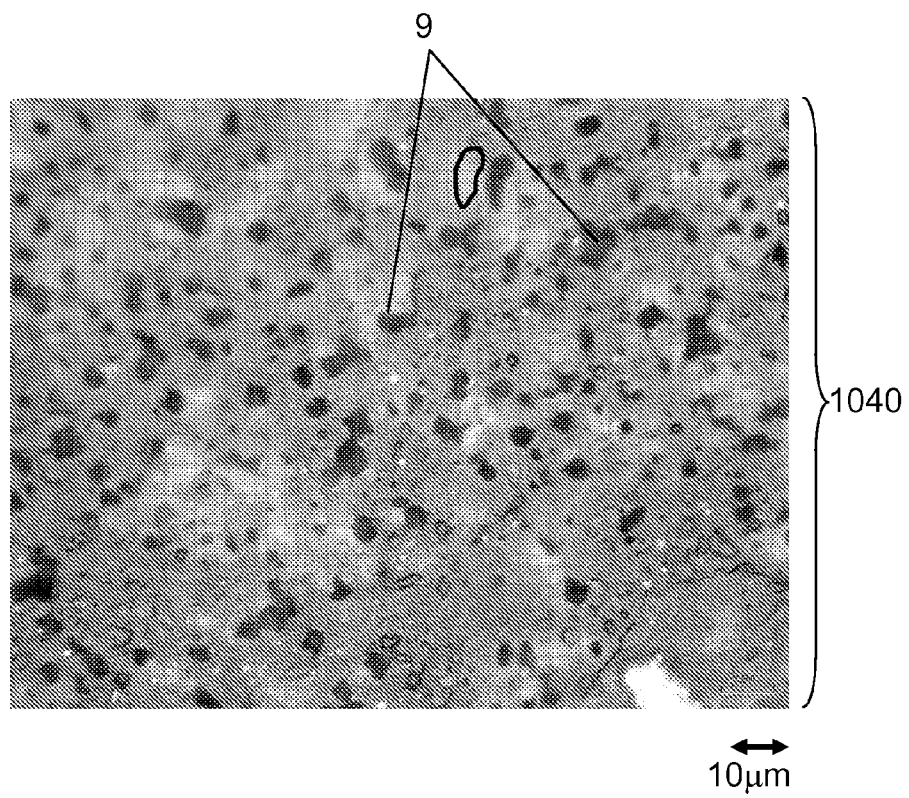
FIG. 27A is a view showing a microscopic image of another free surface of the prior art product when the content by percentage of the inorganic filler therein is set to 66% by volume.
Figure 27B:
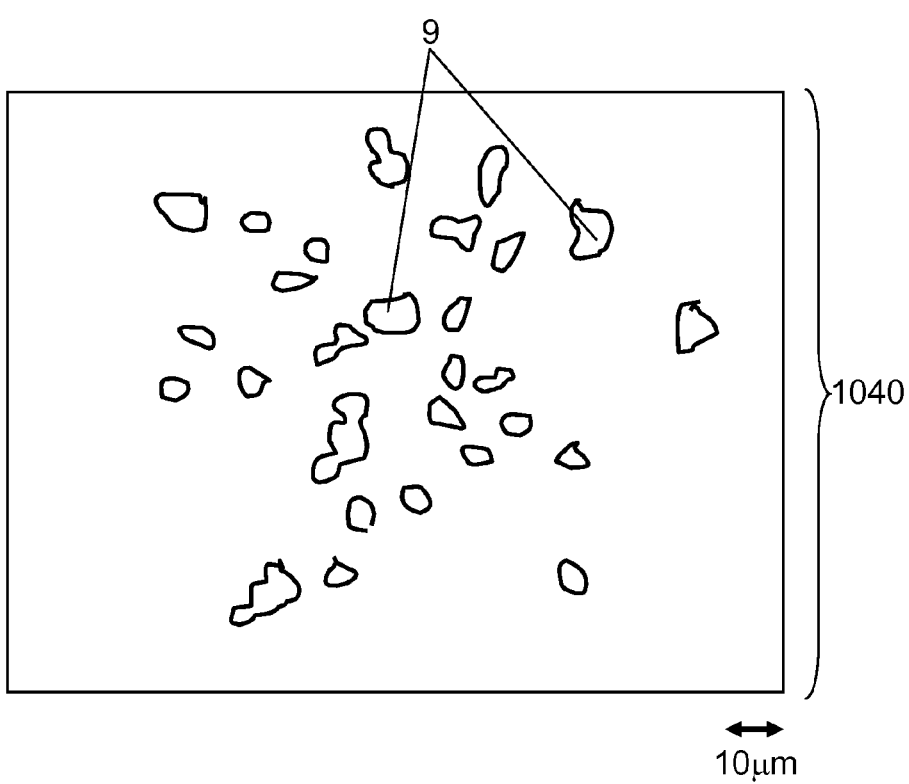
FIG. 27B is a schematic view of FIG. 27A.

FIG. 27A shows another microscopic image of the product in the prior art when the content by percentage of the inorganic filler is set to 66% by volume, and FIG. 27B is a schematic view thereof. In the same as shown in FIGS. 22A and 22B, a great number of voids 9 are generated in free surface 1040 of this thermally conductive composition.

The following will describe results obtained by investigating the surface state of a thermally conductive composition and electrical properties thereof.

Figure 28A:
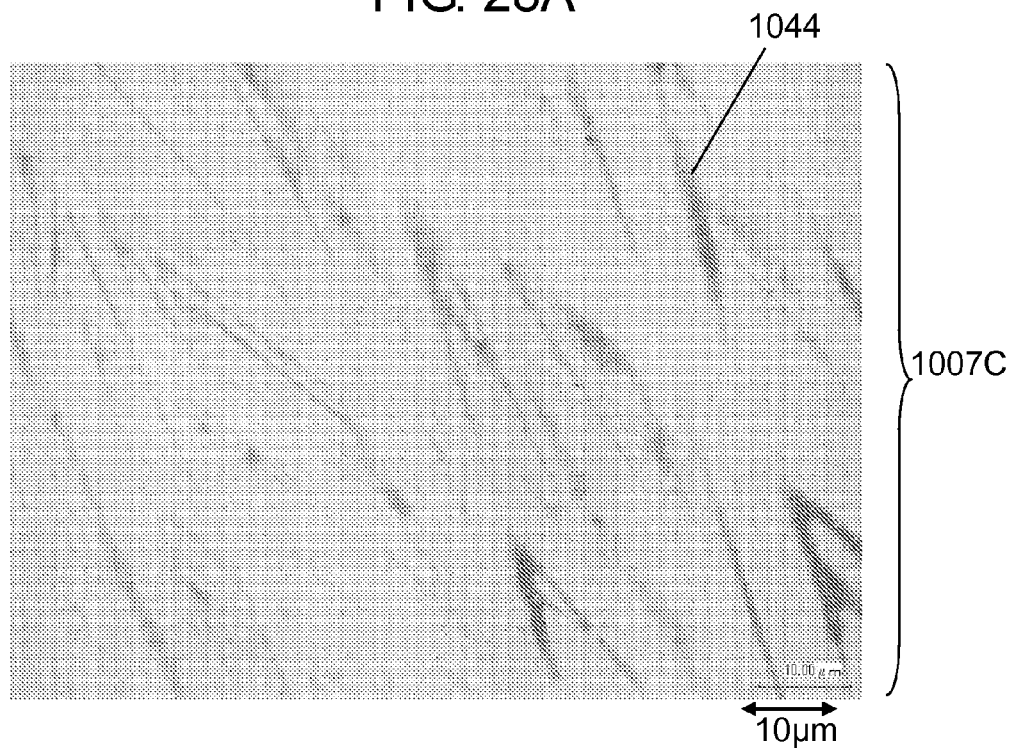
FIG. 28A is a view showing a microscopic image of a free surface of still another example of the thermally conductive composition of the embodiment of the invention.

In this example, with reference to FIGS. 28A to 32, a description is made about the thermally conductive composition, which the inventors produced by using the invention to make experiments and improvements repeatedly, while the composition is compared with an example in the prior art. FIG. 28A shows a microscopic image of the surface of the thermally conductive composition of the present embodiment, and FIG. 28B is a schematic view thereof. FIG. 29A is a view showing results obtained by evaluating the surface of the thermally conductive composition three-dimensionally, and FIG. 29B is a schematic view thereof.

In order to make the composition of this improved example equal to that of the thermally conductive composition described with reference to FIG. 20, and the other figures, the content by percentage of an inorganic filler was set to 70% by volume, and the rest, the proportion of which was 30% by volume, was made mainly of a thermosetting resin. Thereto were optionally added small amounts of a dispersing agent, a flame retardant, a colorant and others. A crystalline epoxy monomer, an amorphous epoxy monomer, a curing agent, the inorganic filler, and other materials (each used in this example) were the same as described above.

In the thermally conductive composition not cured yet, which is shown in FIGS. 28A to 29B, in the main agent therein, the proportion of the crystalline epoxy monomer was set to 50% by volume, and the rest, the proportion of which was 50% by volume, was rendered the amorphous epoxy monomer. Such an increase in the proportion of the crystalline epoxy resin component makes the surface of the thermally conductive composition smoother. An investigation was made about improvements made by the smoothing in the following: electrical properties (of the composition), such as a decrease in leakage current; the adhesiveness thereof onto an electronic component against which heat-generation is a problem.

Figure 28B:
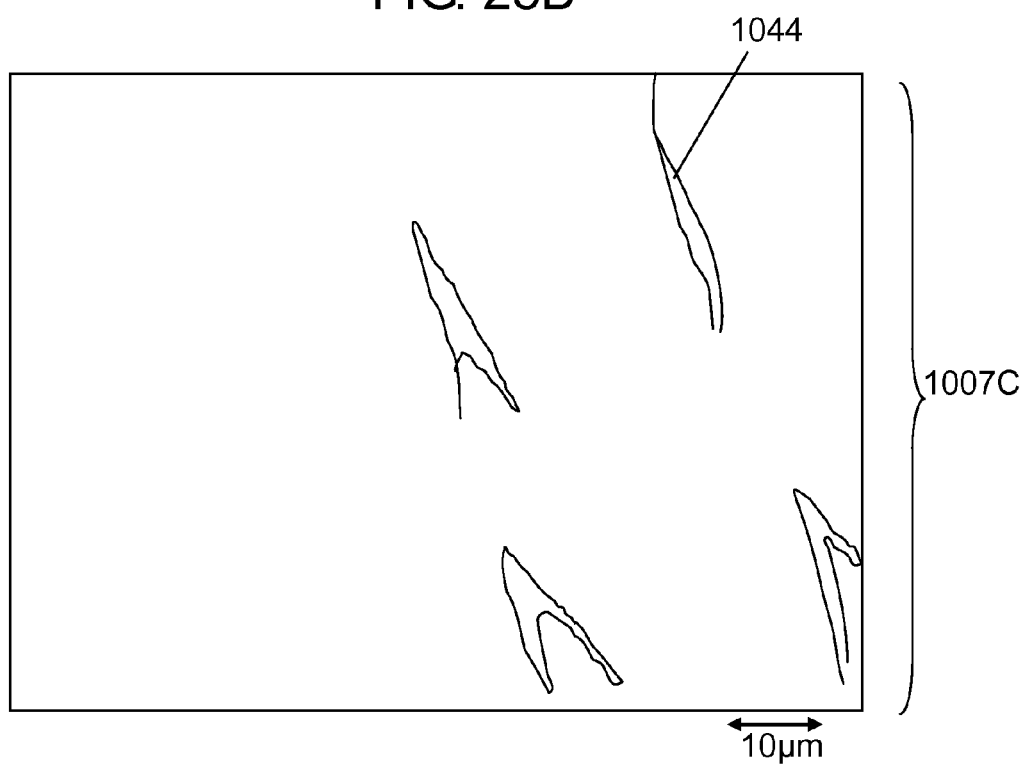
FIG. 28B is a schematic view of FIG. 28A.

As shown in FIGS. 28A and 28B, free surface 1007C is smooth according to an observation at a magnification power of 150. Stains 1044 given for the focusing of the microscope slightly remain in the form of black blots.

Figure 29A:
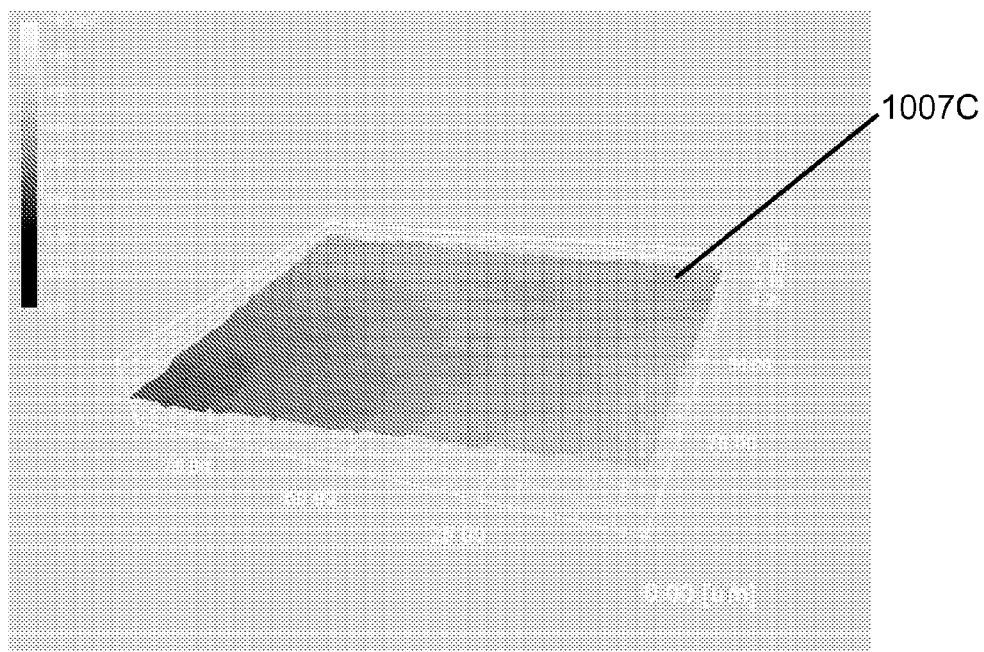
FIG. 29A is a view showing results obtained by evaluating the surface of the thermally conductive composition illustrated in FIG. 28A three-dimensionally.
Figure 29B:
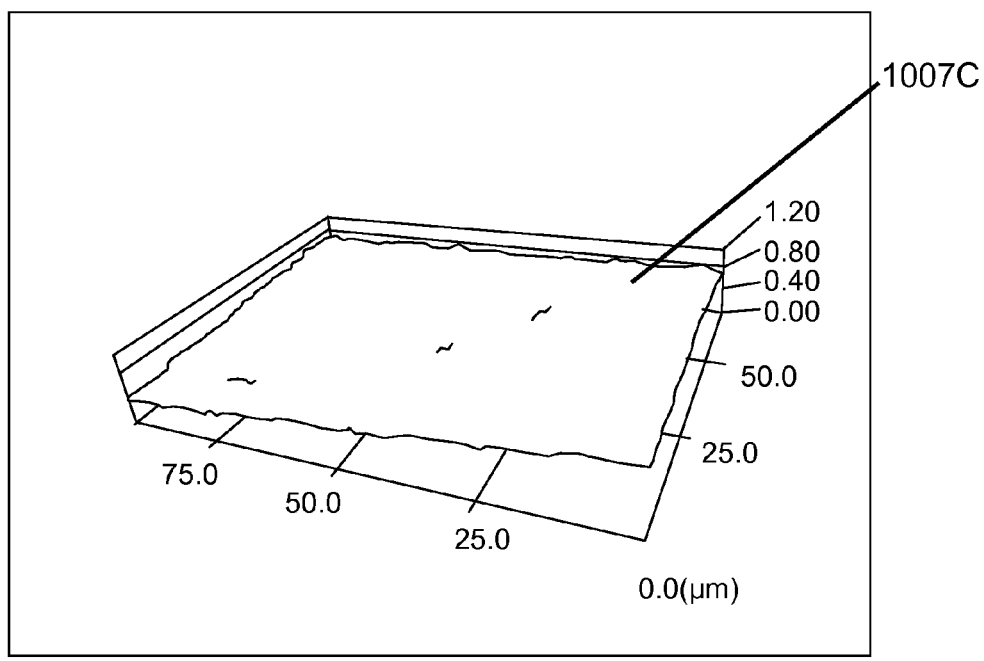
FIG. 29B is a schematic view of FIG. 29A.

FIGS. 29A and 29B each show a result obtained by evaluating a region, about 100 µm×about 75 µm in two-dimensional size and 1.20 µm in thickness, by use of a commercially available laser microscope (VK-9510, manufactured by Keyence Corp.). It is understood that even in a region having the largest height (or thickness) in free surface 1007C of this sample, the height was about 0.8 µm. In this manner, the surface of this sample was very smooth. The arithmetic average roughness Ra of free surface 1007C of this sample was 500 Å (0.05 µm), and the largest height Ry was 9000 Å (0.9 µm). The 20-degree glossiness was from 99 to 105, and the 60-degree glossiness was 100. The value of each of the glossinesses was a value from ten samples.

Next, in the same manner as in the sample shown in FIGS. 28A to 29B, the content by percentage of the inorganic filler in the prior art example was set to 70% by volume. The rest was mainly rendered a curable resin. Thereto were optionally added a dispersing agent, a flame retardant, a colorant, and others.

Figure 30A:
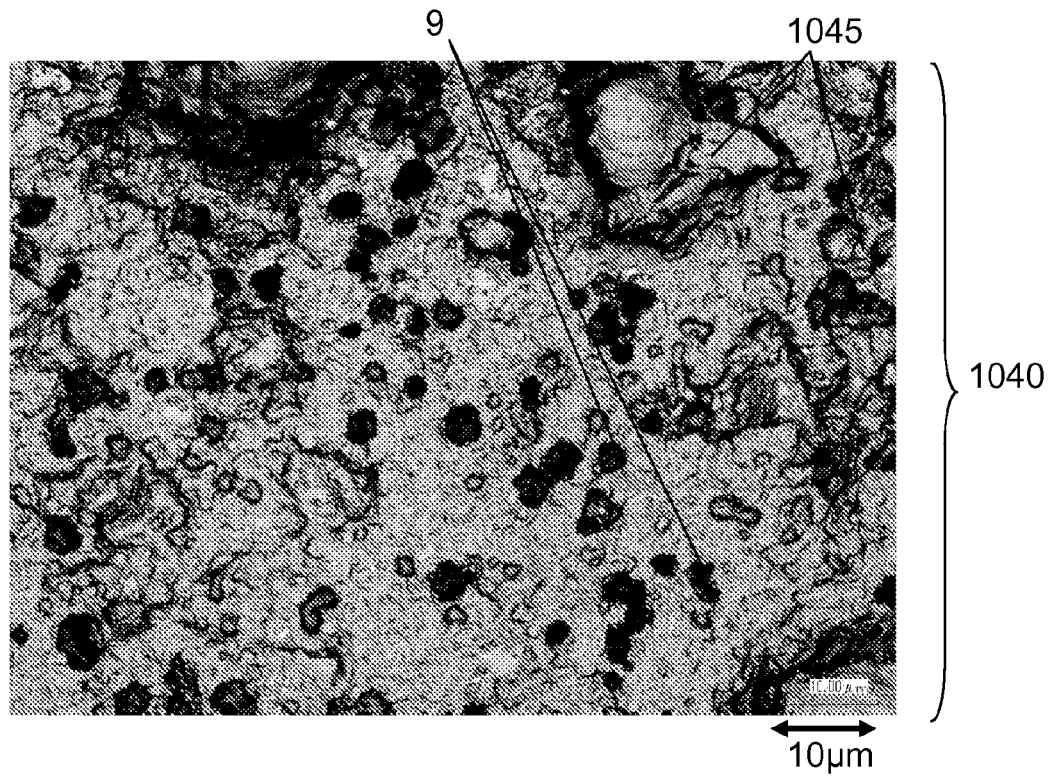
FIG. 30A is a view showing a microscopic image of the free surface of a prior art product when the content by percentage of the inorganic filler therein is set to 70% by volume.
Figure 30B:
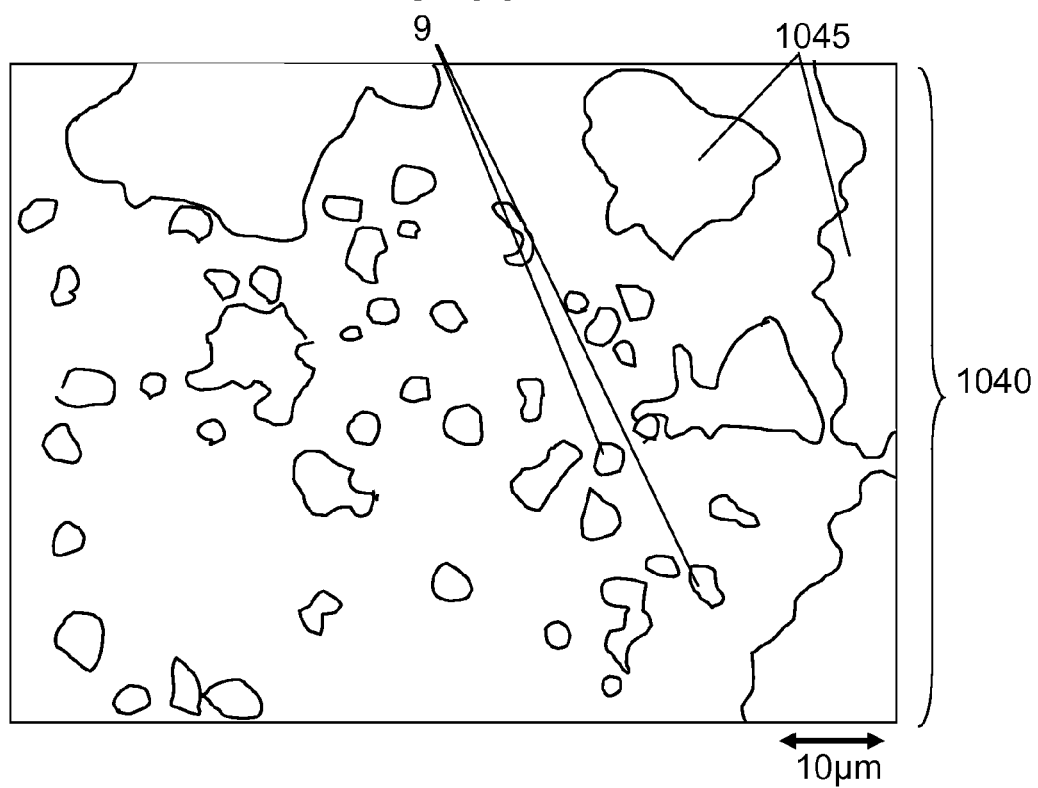
FIG. 30B is a schematic view of FIG. 30A.
Figure 31A:
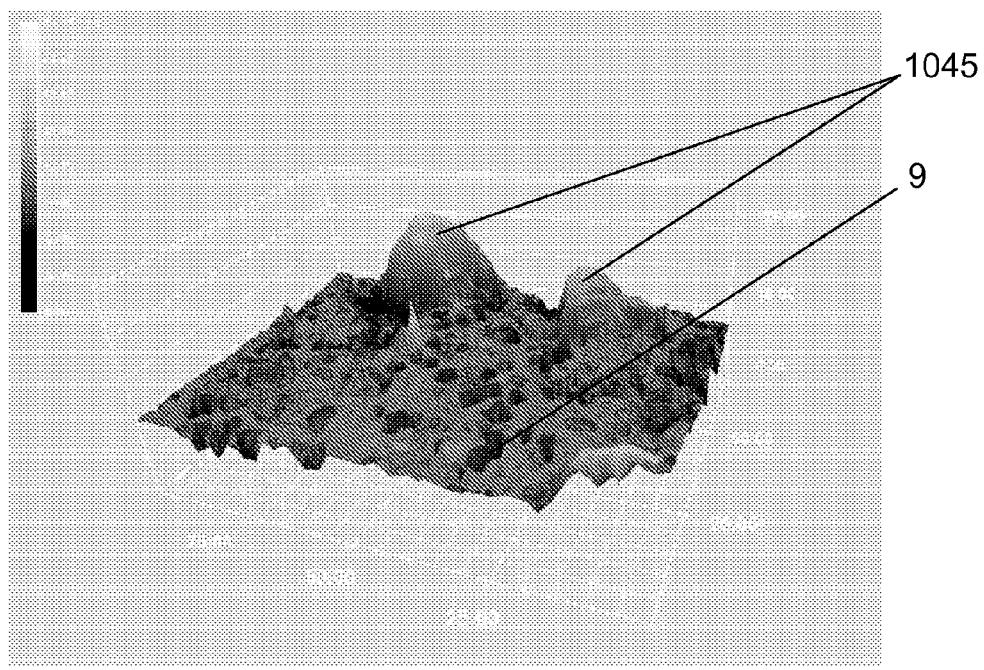
FIG. 31A is a view showing a result obtained by evaluating the surface of the thermally conductive composition illustrated in FIG. 30A three-dimensionally.
Figure 31B:
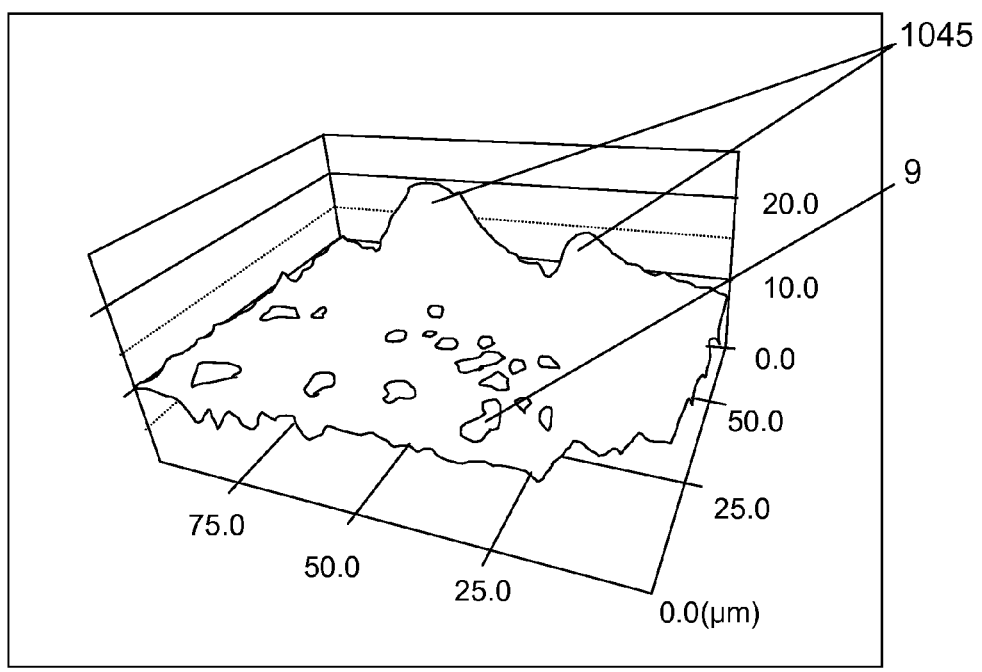
FIG. 31B is a schematic view of FIG. 31A.

The curable resin used in the prior art product was made of an amorphous epoxy monomer, which was to be a main agent, and a curing agent. Specifically, the same sample as shown in FIGS. 27A and 28B was again experimentally produced. The following was used (as the main agent): a main agent containing the amorphous epoxy monomer in a proportion of 95% or more by volume and 100% by volume in order to render an amorphous epoxy resin a main component in the thermosetting (or curable) resin. The amorphous epoxy monomer, the curing agent, the inorganic filler, and the others were the same as described above. FIGS. 30A to 31B show results obtained by evaluating this sample in the same way as described with reference to FIGS. 28A to 29B. FIG. 30A shows a microscopic image of the surface of the thermally conductive composition of the prior art example, and FIG. 30B is a schematic view thereof. FIG. 31A is a view showing results obtained by evaluating the surface of the thermally conductive composition three-dimensionally, and FIG. 31B is a schematic view thereof.

In free surface 1040 of the thermally conductive composition of the prior art example, innumerable projections 1045 and voids 9, which are concave portions, are present. From FIGS. 31A and 31B, it is understood that in the experimentally re-made prior art example, the height of projections 1045 is about 20 µm, and the depth of voids 9 is about 10 µm. The reason why projections 1045 and voids 9 are generated in this way is the same as described with reference to FIGS. 22A and 22B.

Figure 32:
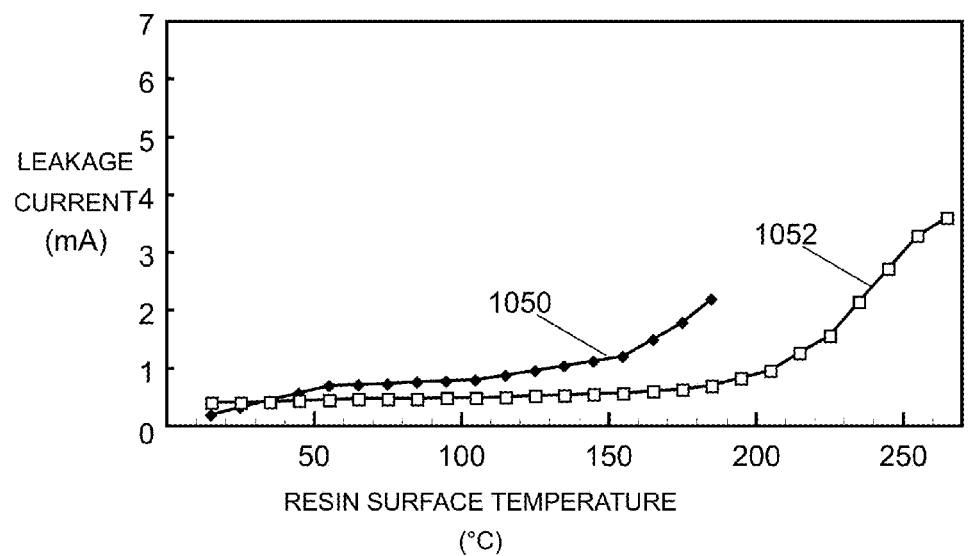
FIG. 32 is a graph showing the temperature characteristic of a leakage current in a thermally conductive composition according to the present embodiment, and that of a leakage current in a thermally conductive composition of a prior art example.

With reference to FIG. 32, the following will describe results obtained by comparing the thermally conductive composition according to the embodiment with the thermally conductive composition of the prior art example about their electrical properties. FIG. 32 is a graph showing, as an example of the electrical properties, the temperature characteristic of a leakage current in the thermally conductive composition according to the embodiment, and that of a leakage current in the thermally conductive composition of the prior art example. In short, herein, the heat resistance (of each of the compositions) is evaluated from the viewpoint of the leakage current respondent to the temperature (of the composition).

A method for the measurement is described herein. First, a commercially available hot plate for heating is prepared. A heat resistant ceramic substrate for keeping electric non-conductance is put on the hot plate, and then a metallic plate which is to be an electrode is put on this ceramic substrate. The used ceramic substrate is, for example, an aluminum substrate having a thickness of 1 to 2 mm. On this metallic plate is put an approximately-5-cm square sample, 0.4 mm in thickness, of each of the thermally conductive compositions. Thereon is fitted a measuring terminal extending from a leakage current measuring device. A voltage of 4.3 kV is applied to the metallic plate and the measuring terminal across these members, and then the leakage current is measured at the time. The temperature of the sample is controlled by effect of the hot plate. The surface temperature is measured in the state that a thermocouple is fitted to a surface of the sample.

In FIG. 32, plotted dots 1050 represent measurement results of the prior art example, and plotted dots 1052 represent measurement results of the sample of the embodiment. As is evident from FIG. 32, the leakage current of the prior art product is small at 60° C. or lower; however, when the surface temperature is over 60° C., the leakage current is larger as the temperature is higher. When the temperature is over 110° C., the leakage current is larger. When the temperature is over 160° C., the leakage current abruptly increases. At 190° C., dielectric breakdown is caused. As described herein, in the prior art example, the leakage current increases when the temperature rises.

As is also understood from FIGS. 30A to 31B, the prior art example has on the surface thereof innumerable irregularities. Thus, innumerable voids remain inside the example. In other words, the inorganic filler constituting the thermally conductive composition is not sufficiently covered with the thermosetting resin. As a result, in the prior art example, the pieces of the inorganic filler undergo mere physical contact (or point contact) with each other in the thickness direction thereof. It is anticipated that bubbles remain at the interface between the inorganic filler and the thermosetting resin, between the pieces of the inorganic filler, or inside the thermosetting resin. As a result, it appears that as the temperature rises, the leakage current increases abruptly, and finally dielectric breakdown is unfavorably caused.

By contrast, the leakage current of the sample according to the embodiment is very small up to the vicinity of 190° C. From the vicinity of 200° C., the leakage current increases gradually as the temperature rises. From the vicinity of 220° C., the increase in the leakage current becomes large. However, even at 240° C., no dielectric breakdown is caused. As described herein, in the sample according to the embodiment, the leakage current does not increase easily even when the temperature rises. In short, the sample according to the embodiment has excellent electrical properties.

Figure 33:
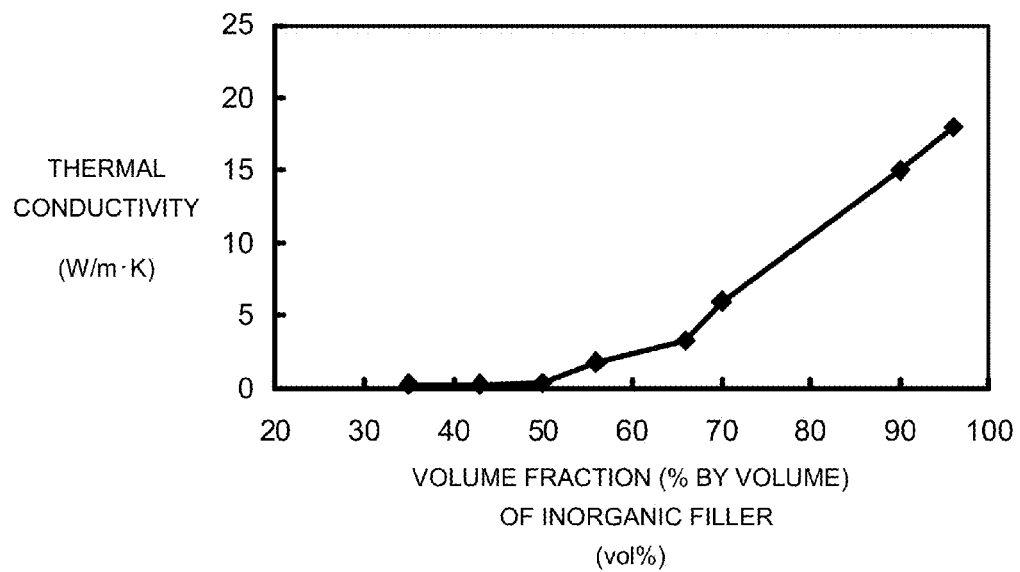
FIG. 33 is a graph for describing an example of experimental results about a relationship between the volume fraction of an inorganic filler, and the thermal conductivity (of a sample containing the filler).
Figure 34:
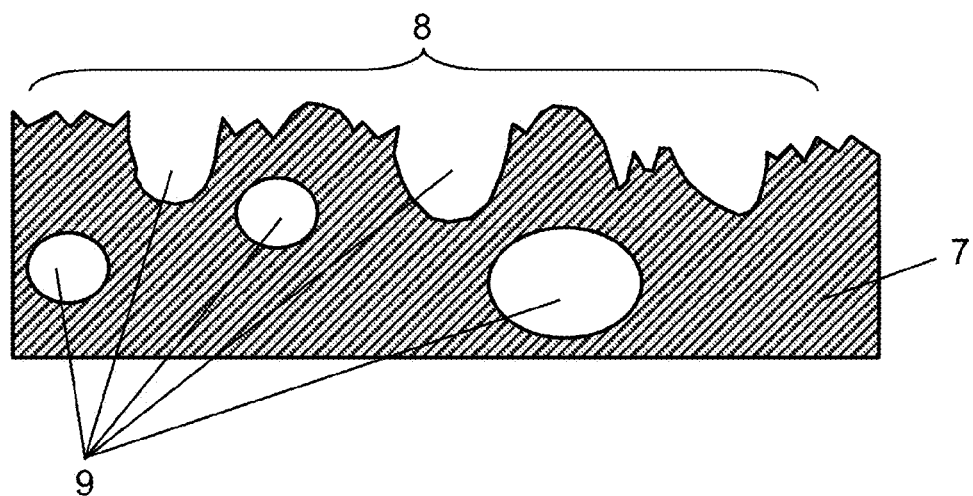
FIG. 34 is a schematic sectional view of a thermally conductive composition in the prior art when the content by percentage of an inorganic filler therein is high.
Figure 35:
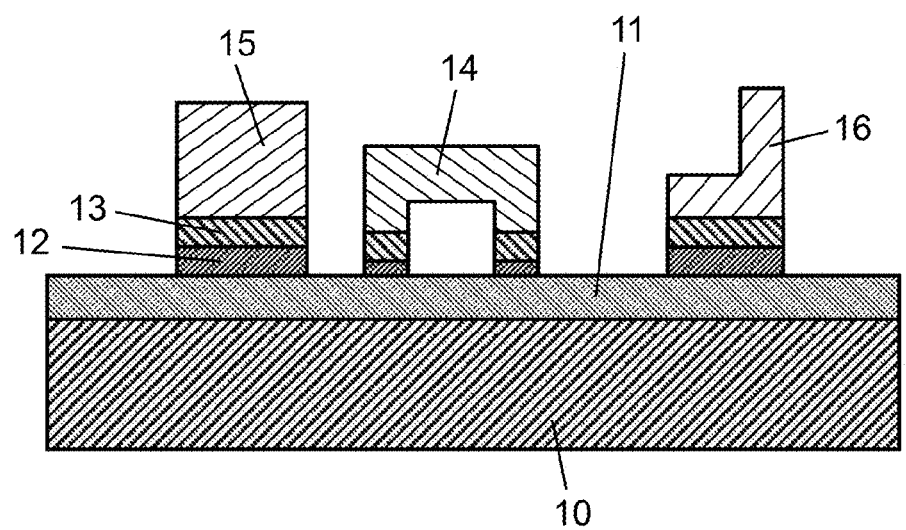
FIG. 35 is a sectional view of a heat dissipating substrate in the prior art.
Figure 36A:
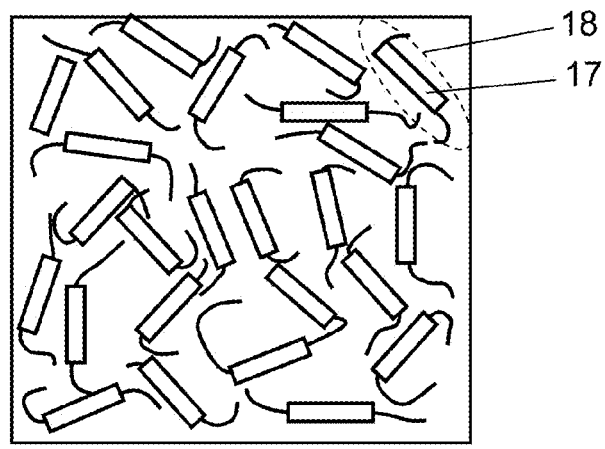
FIG. 36A is an explanatory view of a crystalline resin used in the heat dissipating substrate in the prior art.
Figure 36B:
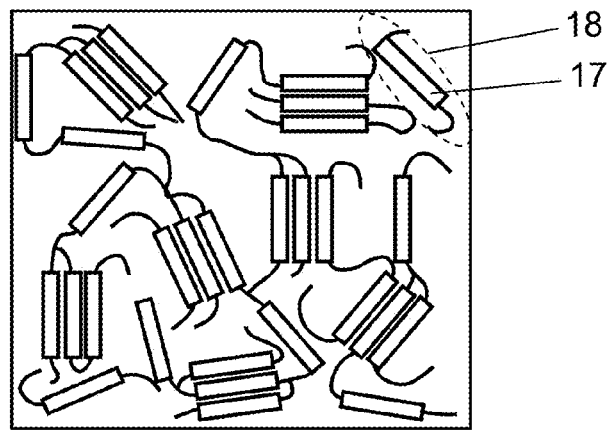
FIG. 36B is an explanatory view of the crystalline resin used in the heat dissipating substrate in the prior art.
Figure 36C:
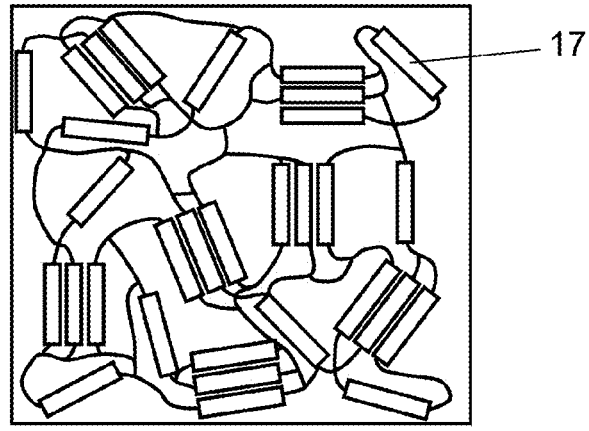
FIG. 36C is an explanatory view of the crystalline resin used in the heat dissipating substrate in the prior art.

With reference to FIG. 33, the following will describe results obtained by optimizing the content by percentage of inorganic filler 1009 in the present invention product (sample (A) described with reference to FIGS. 28 to 29. FIG. 33 is a graph for describing an example of experimental results about a relationship between the volume fraction of the inorganic filler, and the thermal conductivity (of the sample). The transverse axis represents the volume fraction of inorganic filler 1009, and the vertical axis represents the thermal conductivity of thermally conductive composition 1006. As is evident from FIG. 33, as the volume fraction of inorganic filler 1009 increases, the thermal conductivity increases. When the fraction is, in particular, more than 50% by volume, the thermal conductivity is abruptly improved.

The following will describe results (Table 14) obtained by evaluating the thermal conductivity and the voltage endurance characteristic while the volume fraction of inorganic filler 1009 contained in thermally conductive composition 1006 shown in FIG. 33 is changed. In the voltage endurance characteristic test, the dielectric breakdown of each of the samples was measured with reference to JIS C2110 (Test according to the Application of Business Purpose Frequency AC Voltage) and JIS C2110-2 (Test according to the Application of DC Voltage). In any sample wherein the voltage endurance characteristic was judged to be NG in Table 14 (out of the samples), the insulation performance of the test piece lowered remarkably in the middle of the application of a voltage of 4.2 kV, so that a circuit breaker was operated by electric current in the test circuit. In any sample wherein the characteristic was judged to be OK, the insulation performance did not lower in the middle of the application of a voltage of 4.2 kV, or the circuit breaker was not operated. The evaluation was made under a condition of n=10.

TABLE 14

| Inorganic filler volume fraction (by volume) | 35 | 43 | 50 | 56 | 66 | 70 | 90 | 96 | 100 |
|---|---|---|---|---|---|---|---|---|---|
| Thermal conductivity (W/mK) | 0.3 | 0.3 | 0.4 | 1.8 | 3.3 | 6.0 | 15.0 | 18.0 | — |
| Voltage endurance characteristic | OK | OK | OK | OK | OK | OK | OK | NG | NG |
| Total evaluation | Bad | Bad | Bad | Bad | OK | OK | OK | NG | NG |

From Table 14, the following are understood: when the volume fraction of inorganic filler 1009 contained in thermally conductive composition 1006 is 90% or less by volume, a high voltage endurance characteristic required for a product is obtained; by contrast, if the fraction is 96% or more by volume, a high voltage endurance characteristic required for a product is not obtained. The following are also understood: when the volume fraction of inorganic filler 1009 is 66% or more by volume, a high thermal conductivity required for a thermally conductive composition product is obtained; however, if the fraction is less than 66% by volume, a high thermal conductivity required for a product is not obtained. Accordingly, if the volume fraction of inorganic filler 1009 is less than 66% by volume, the thermally conductive composition is low in commercial value.

As shown in total evaluation results in Table 14, the above demonstrates that the volume fraction of inorganic filler 1009 contained in thermally conductive composition 1006 is preferably 66% or more by volume and 90% or less by volume.

It is desired that the volume fraction of inorganic filler 1009 is evaluated in the unit of % by volume. This is a purpose for restraining an effect of the specific gravity of inorganic filler 1009. In order to increase the volume fraction of inorganic filler 1009, it is practical to use the following ordinary high-level filling method: inorganic fillers different from each other in average particle diameter are mixed with each other, for example, an inorganic filler having an average particle diameter of 10 μm is mixed with an inorganic filler having an average particle diameter of 1 μm; or the shape of inorganic filler 1009 is contrived.

INDUSTRIAL APPLICABILITY

As described above, when use is made of the thermally conductive composition according to the invention, or a heat dissipating plate, heat dissipating substrate, or circuit module using this composition, a device for which heat dissipating performance is required can be made small in size, low in costs, and high in reliability. Thus, the invention is applicable to a power supply circuit for a plasma display panel (PDP) television; a backlight for a liquid crystal television, wherein light emitting diodes are used; and others.

| REFERENCE MARKS IN THE DRAWINGS | |
|---|---|
| 9 | void |
| 31, 34 | line |
| 32, 33 | plotted dot |
| 1000 | glossiness meter |
| 1001 | light source |
| 1002 | lens |
| 1003 | light receiving section |
| 1004 | main portion |
| 1005 | convex portion |
| 1006 | thermally conductive composition |
| 1007, 1007A, 1007B, 1007C | free surface |
| 1008 | surface roughness meter |
| 1009 | inorganic filler |
| 1010 | thermosetting resin |
| 1011 | surface layer portion |
| 1012 | metallic plate |
| 1013 | heat dissipating plate |
| 1014 | heat generating component |
| 1015 | processed surface |
| 1016 | pattern |
| 1017 | mounting region |
| 1018 | passage region |
| 1019 | protrusion region |
| 1020 | lead line |
| 1021 | circuit substrate |
| 1022 | hole |
| 1023 | chassis |
| 1024 | solder |
| 1025 | circuit module |
| 1026 | thermally conductive material |
| 1027 | film |
| 1028 | mold |
| 1029 | molding-region-forming portion |
| 1030 | unfilled portion |
| 1031 | passage-region-forming portion |
| 1032 | projection-region-forming portion |
| 1033 | wiring pattern |
| 1034 | fillet |
| 1035 | heat dissipating substrate |
| 1036 | press |
| 1037 | pressing roll |
| 1039 | convex portion |
| 1039A | wrinkle region |
| 1039B | trace |
| 1040 | free surface |
| 1041 | surface |
| 1042 | surface-layer-portion-removed region |
| 1044 | stain |
| 1045 | projection |
| 1050, 1052 | plotted dot |

The invention claimed is:

1. A thermally conductive composition including a cured thermosetting resin containing a crystalline epoxy resin component, and an inorganic filler, a content by percentage of the inorganic filler in the thermally conductive composition being 66% or more by volume, and 90% or less by volume, the thermally conductive composition comprising:

a main portion in which the inorganic filler is mainly contained; and a surface layer portion which is made mainly of the crystalline epoxy resin component and is formed on the main portion to be continuous to the main portion, wherein a front surface of the surface layer portion is specified by at least one of:
an arithmetical average roughness Ra of 3000 Å or less;
a maximum height Ry of 15000 Å or less; and
a 20-degree glossiness of 70 or more.

2. The thermally conductive composition according to claim 1, wherein the inorganic filler is formed of at least one selected from alumina, aluminum nitride, boron nitride, silicon carbide, silicon nitride, magnesium oxide, and zinc oxide.

3. The thermally conductive composition according to claim 1, wherein the thermosetting resin is formed by preparing a mixture of a main agent containing the crystalline epoxy component which is not yet cured, a curing agent, a thermoplastic resin, and the inorganic filler, and heating the mixture to not lower than the crystallization temperature of the crystalline epoxy resin component, for curing, a content by percentage of the crystalline epoxy resin component in the main agent is 5% or more by volume, and 100% or less by volume, and the thermoplastic resin is added in an amount of 0.3 part or more by volume, and 5.0 parts or less by volume for 100 parts by volume of the total of the main agent and the curing agent.

4. The thermally conductive composition according to claim 3, wherein the thermoplastic resin is an acrylic resin.

5. The thermally conductive composition according to claim 4, wherein the acrylic resin is a core shell type acrylic resin.

6. The thermally conductive composition according to claim 3, wherein the curing agent has at least one of a set of two OH groups and a set of two NH$_2$ groups in a single molecule thereof.

7. The thermally conductive composition according to claim 1, wherein the thermosetting resin is formed by preparing a mixture of a main agent containing the crystalline epoxy component which is not yet cured, a curing agent, a flame-retardant epoxy resin component which is not yet cured, a flame-retardant aid filler, and the inorganic filler, and heating the mixture to not lower than the crystallization temperature of the crystalline epoxy resin component, for curing, the content by percentage of the crystalline epoxy resin component in the main agent is 5% or more by volume, and 100% or less by volume, and the flame-retardant epoxy resin component is added in an amount of 3 parts or more by volume and 15 parts or less by volume for 100 parts by volume of the total of the main agent and the curing agent, and the flame-retardant aid filler is added in an amount of 0.6 part or more by volume and 3.5 parts or less by volume therefor.

8. The thermally conductive composition according to claim 7, wherein the flame-retardant epoxy resin component is a brominated epoxy.

9. The thermally conductive composition according to claim 7, wherein the curing agent has at least one of a set of two OH groups and a set of two NH$_2$ groups in a single molecule thereof.

10. The thermally conductive composition according to claim 1, wherein the thermosetting resin is formed by preparing a mixture of a main agent containing the crystalline epoxy component which is not yet cured, a curing agent, a flame-retardant epoxy resin component which is not yet cured, a thermoplastic resin, a flame-retardant aid filler, and the inorganic filler, and heating the mixture to not lower than the crystallization temperature of the crystalline epoxy resin component, for curing, a content by percentage of the crystalline epoxy resin component in the main agent is 5% or more by volume, and 100% or less by volume, the flame-retardant epoxy resin component is added in an amount of 3 parts or more by volume and 15 parts or less by volume for 100 parts by volume of the total of the main agent and the curing agent, the thermoplastic resin is added in an amount of 0.3 part or more by volume and 2.5 parts or less by volume therefor, and the flame-retardant aid filler is added in an amount of 0.6 part or more by volume and 3.5 parts or less by volume therefor.

11. The thermally conductive composition according to claim 10, wherein the thermoplastic resin is an acrylic resin.

12. The thermally conductive composition according to claim 11, wherein the acrylic resin is a core shell type acrylic resin.

13. The thermally conductive composition according to claim 10, wherein the flame-retardant epoxy resin component is a brominated epoxy.

14. The thermally conductive composition according to claim 10, wherein the curing agent has at least one of a set of two OH groups and a set of two $NH_2$ groups in a single molecule thereof.

15. The thermally conductive composition according to claim 1, wherein the crystalline epoxy resin component has the following structure before the crystalline epoxy resin component is cured:

[chemical formula 1]

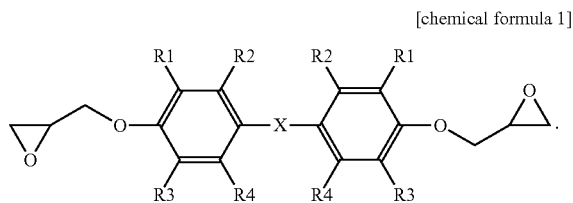

where X: S, O, $CH_2$ or a single bond; and each of R1, R2, R3 and R4: H, $CH_3$ or t-Bu (tertiary butyl group), and any two or more of R1 to R4 may be the same.

16. The thermally conductive composition according to claim 1, wherein the thermosetting resin has crystallinity.

17. A heat dissipating plate comprising:
a metallic plate; and
a thermally conductive composition as recited in claim 1 that is fixed on the metallic plate.

18. A circuit module comprising:
a metallic plate;
a thermally conductive composition as recited in claim 1 that is fixed on the metallic plate;
a heat generating component fixed to the thermally conductive composition; and
a circuit substrate fixed to the metallic plate and connected to the heat generating component.

19. A heat dissipating substrate comprising:
a metallic plate;
a thermally conductive composition as recited in claim 1 that is fixed on the metallic plate; and
a wiring fixed to the thermally conductive composition.

20. The heat dissipating substrate according to claim 19, further comprising:
the surface layer portion between the thermally conductive composition and the wiring.

21. The heat dissipating substrate according to claim 19, wherein when the wiring is partially removed so that a surface of the thermally conductive composition to which a surface pattern of the wiring is transferred is naked, the naked surface of the thermally conductive composition also has the surface layer portion.

22. A circuit module comprising:
a metallic plate;
a thermally conductive composition as recited in claim 1 that is fixed on the metallic plate;
a wiring fixed to the thermally conductive composition;
a heat generating component connected to the wiring and fixed to the thermally conductive composition; and
a circuit substrate fixed to the wiring.

23. A process for producing a thermally conductive composition, comprising:
(A) preparing a mixture of a main agent containing a crystalline epoxy resin component which is not yet cured, a curing agent, and an inorganic filler; and
(B) heating the mixture to not lower than the crystallization temperature of the crystalline epoxy resin component, and curing the main agent to form a cured thermosetting resin,
wherein the content by percentage of the inorganic filler is 66% or more by volume and 90% or less by volume, and
in the step (B), a main portion in which the inorganic filler is mainly contained is formed, and a surface layer portion made mainly of the crystalline epoxy resin component to be continuous to the main portion is formed on the main portion
in such a manner that the surface layer portion has a front surface having at least either a surface roughness specified at least either by an arithmetical average roughness Ra of 3000 Å or less, or by a maximum height Ry of 15000 Å or less, or a 20-degree glossiness of 70 or more.

24. The process for producing a thermally conductive composition according to claim 23, wherein the mixture exuding from a gap between the inorganic fillers is cured, so that the surface layer portion is formed.

25. The thermally conductive composition according to claim 1, wherein when the thermosetting resin is thermally cured, the resin decreases its viscosity and leads to convection, and the convectional thermosetting resin partially forms the surface layer portion.

26. The process for producing a thermally conductive composition according to claim 23, wherein when the thermosetting resin is thermally cured, the resin decreases its viscosity and leads to convection, and the convectional thermosetting resin partially forms the surface layer portion in the step (B).

* * * * *